United States Patent
Kousa

[11] Patent Number: 5,851,309
[45] Date of Patent: Dec. 22, 1998

[54] DIRECTING AND CONCENTRATING SOLAR ENERGY COLLECTORS

[76] Inventor: Paavo Kousa, 2298 Honey Run Rd., Chico, Calif. 95928

[21] Appl. No.: 638,481

[22] Filed: Apr. 26, 1996

[51] Int. Cl.$^6$ ............................................. H01L 31/052
[52] U.S. Cl. ..................... 136/248; 136/246; 126/578; 126/593; 126/600; 126/621; 126/623; 126/686; 250/203.5
[58] Field of Search ................. 126/570–578, 126/593, 600–603, 605, 621, 623–626, 684–686, 692–695, 698; 136/246, 248; 250/203.4; 353/3

[56] References Cited

U.S. PATENT DOCUMENTS

| | | | |
|---|---|---|---|
| 3,986,021 | 10/1976 | Hitchcock | 250/203.4 |
| 4,132,223 | 1/1979 | Reddell | 126/601 |
| 4,220,136 | 9/1980 | Penney | 126/600 |
| 4,237,864 | 12/1980 | Kravitz | 126/573 |
| 4,546,757 | 10/1985 | Jakahi | 126/604 |
| 4,587,951 | 5/1986 | Townsend | 126/605 |
| 4,719,903 | 1/1988 | Powell | 126/688 |
| 4,967,729 | 11/1990 | Okumura | 126/632 |
| 5,253,637 | 10/1993 | Maiden | 126/696 |
| 5,259,363 | 11/1993 | Peacock | 126/621 |

Primary Examiner—Nam Nguyen
Attorney, Agent, or Firm—Trial & Technology Law Group

[57] ABSTRACT

A directing and concentrating solar energy collector with a concentrating reflector and one or more cooperating directing reflectors concentrates solar radiation to a substantially narrow and straight line of concentration. The directing reflectors, being perpendicular to the concentrating reflector, confine the zones of concentration at the line of concentration. A stationary optimizing energy converter having multiple energy conversion sections receives the concentrated radiation, converts part of it to electricity, with another part to thermal energy. A building includes multiple collectors in an energy collection system, with one variation of the collectors used under a transparent roof and another inside a transparent wall. The concentrating reflector is provided either with single axis tracking, or with no tracking at all, enabling different installations and having different advantages. For the tracking versions, a radiation scanner digitally measures and computes the most optimal angular tracking position for accurate adjustment of the concentrating reflectors, yielding the highest available energy level. Software in a micro processor controls the collection system and the conversion sections, independently from each other, optimizing the energy collection process. The software also reads radiation energy levels from the radiation sensors of the scanner, at regular angular intervals of the rotation of the rod, and computes the most optimal angular tracking adjustment for positioning of the concentrating reflectors of all collectors.

26 Claims, 66 Drawing Sheets

$$y = \frac{a}{2}\left(e^{\frac{x}{a}} + e^{-\frac{x}{a}}\right)$$
$$= \cosh(x/a)\, a$$

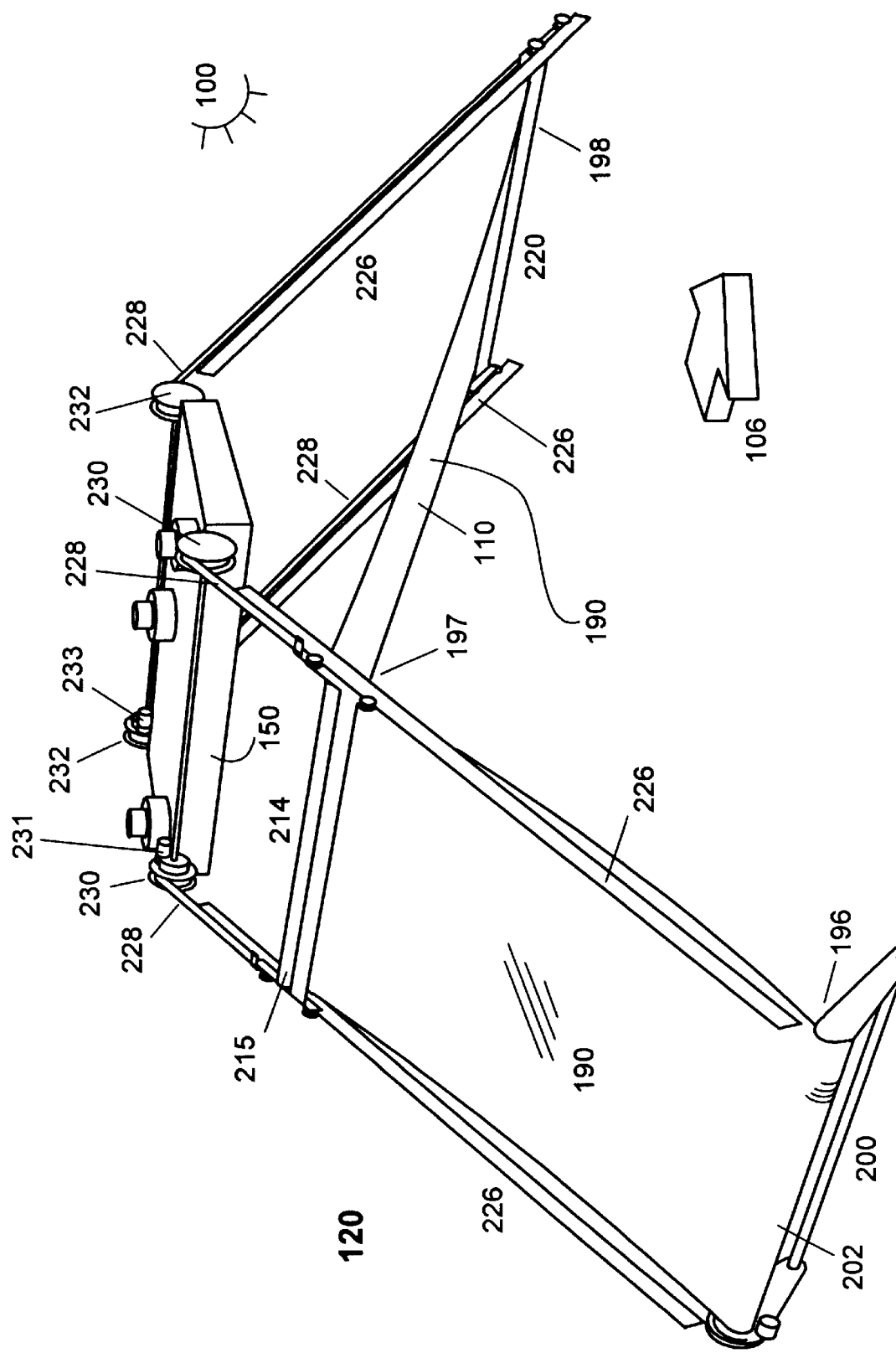

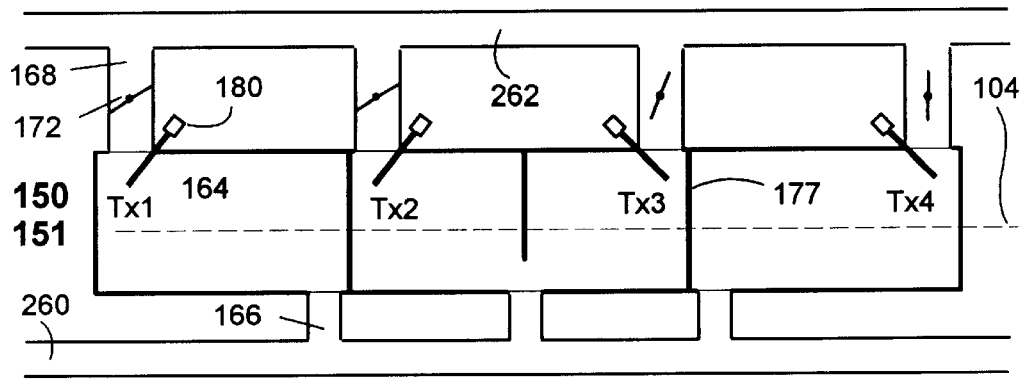
Figure 32A
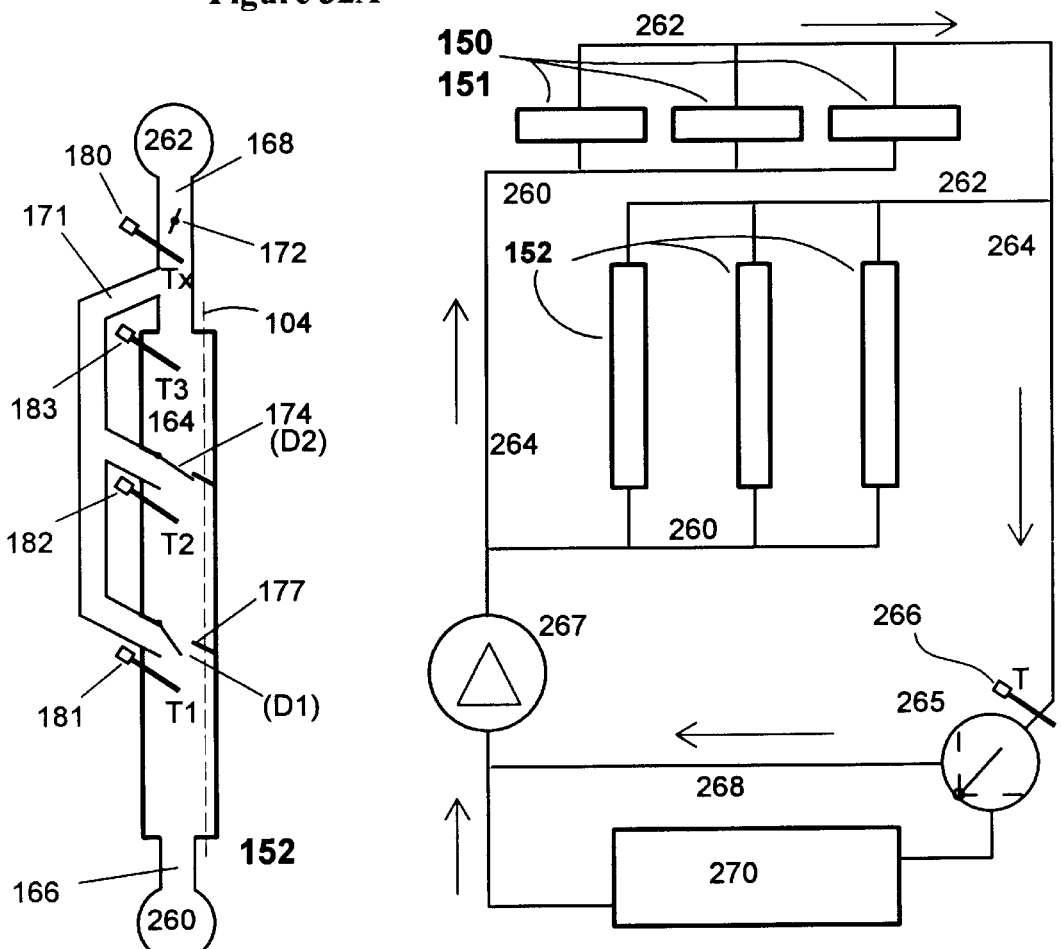
Figure 32B
Figure 32C

DIRECTING AND CONCENTRATING SOLAR ENERGY COLLECTORS

FIELD OF THE INVENTION

The present invention generally relates to concentrating solar energy collectors and collector devices protected with a transparent cover. More particularly, the present invention relates to collectors having a concentrating reflector and one or more directing reflectors arranged to reflect short wave radiation from the sun into a substantially narrow and straight line of concentration. This is absorbed in a stationary optimizing energy converter and a portion of the concentrated radiation is converted to electricity, with another portion converted to thermal energy. The optimization is accomplished by the energy converter having multiple conversion sections, each section controlled individually. The invention further relates to solar collectors installed inside a structure providing a transparent protective cover, with one variation of the collector used under a protective transparent cover above the collector and the other variation used along inside a vertical transparent cover.

BACKGROUND OF THE INVENTION

Several different approaches to collect solar energy for the purposes of heating, cooling, and powering electrical appliances exist. Most of these approaches, except for the use of small thermal panels for domestic hot water production, have failed to gain wide acceptance. In particular, heating and cooling of a building have been difficult problems to solve. There seems to be many reasons for this apparent failure of the industry. Some of these have been, high capital investment requirements, low efficiencies, high maintenance requirements, or the discrete non compatible equipment being difficult to install. Of these reasons, the capital cost of solar equipment may be the most preventive. From statistics calculated by a major U.S. utility company (Pacific Gas and Electric Company), a medium to large single family home consumes from 870 kWh to 3,000 kWh a month for heating. If one assumes a solar energy system capable of 30% efficiency and typical available midwinter solar radiation energy of 3.5 kWh/m$^2$/day, a minimum required collector area would be between 27 m$^2$ and 92 m$^2$. These numbers are highly optimistic. First, an average daily efficiency of 30% for a solar energy system under the above conditions is very difficult to obtain. Second, any extensive cloudy periods will require that excess energy be collected during sunny periods and stored for later use. In many locations, these factors will necessitate a much larger collector area than stated above. A larger collector area would dramatically affect the collector cost.

Two types of active thermal solar collectors are known in the art, flat panel and concentrating. The flat panel thermal energy collectors fail to deliver the required efficiency and have high cost per unit of power. Large collector areas are typically used to compensate for the low efficiency. Concentrating thermal collectors have typically been too expensive, require a great deal of maintenance and have not been suitable for general purpose use The efficiency of a solar energy collector may not be a major concern as long as the collector provides acceptable cost per unit of power. However, it still plays a role in determining the required collector area and the usable range of operating conditions. When solar insolation is high and the outside temperature is also high, such as close to the equator, flat panel collectors can produce moderately high temperatures efficiently. These temperature are high enough for water and space heating purposes, and usually enough for absorption cooling as well. However, the December insolation values above 45° latitude, creates an entirely different situation. Here, the energy need for heating is at a maximum, while the solar insolation levels for a large part of the already short day are drastically reduced. At the same time, thermal losses are significantly increased due to large temperature differentials. Because of the optical losses, the concentration ratio of the flat panel collector typically ranges from 0.7 to 0.85 causing the efficiency of a flat panel collector to quickly reduce into a useless range.

A concentrating collector, on the other hand, can easily overcome this efficiency problem. Concentration ratios as low as 1.5 to 3.0 will provide significant improvements in efficiency. However, as stated before, this has typically resulted in a large increase in capital investment. Other common problems with known solar concentrators have been unreliable solar positional tracking, and weakening concentration due to rapid aging of the concentrating optics.

Today's PV (photovoltaic) systems have not lived up to the expectations placed on them. Although reasonably good energy conversion efficiency measurements have been recorded in laboratory conditions, flat panel PV systems only produce a 10% efficiency in practice. This low efficiency, coupled with continued high costs of the PV cells, has kept their price too high for commercial deployment. With concentrating optics employed, higher practical efficiencies are possible. By concentrating radiation to these cells, the total required cell area also decreases and efficiency increases. While the cells suitable for concentrated operation are more expensive, the total cell cost for a unit of power is decreased. However, as with the thermal concentrating systems, the required optics add to the cost. Moreover, to maintain this better efficiency, some form of tracking mechanism is needed, further increasing the cost. A usual concentrating arrangement has had a concentrating lens, such as a fresnel lens, in the path of radiation, concentrating radiation on the cell. Multiples of these combinations have then been assembled to form somewhat thick panels. The panels in turn have been mounted on a large tracking apparatus, similar to the heliostats used in central receiver installations. Because of the similarity to the heliostats, these arrangements have similar mechanical requirements and problems, and are not at all suitable for installation in commercial or residential buildings.

Various methods for tracking the movement of the sun have been devised. Analog systems have different devices with photo sensors placed in various arrangements to detect differences in radiation readings as the position of the sun changes, using the differential signal to command a servo system. Mechanical arrangements based on temperature differences have also been employed, and are in many ways similar to the analog electronic systems. Digital systems using a computer program and an accurate clock have been most successful in large solar power plant environments. All of these methods however have problems. Analog tracking systems tend to produce inaccurate results, especially after prolonged use. Digital methods based on the clock require the clock to be extremely precise. In power plant settings this can be easily accomplished. However, in residential, and in smaller commercial operations it is much more difficult to ensure accurate timing. Even if the time can be accurately kept, a tracking system based on a clock will keep the concentrating optics pointing precisely in the direction of the sun, even when it would be more advantageous to deviate from that direction.

More specific examples in the prior art, cited hereinafter, should further illustrate the problems inherent in previous solar energy collectors and systems.

U.S. Pat. No. 5,259,363 issued to Peacock et al., discloses a solar roofing panel system for the use in residential and commercial buildings. The disclosed system comprises a plurality of standard metal roofing panels darkened to absorb radiation, covered with transparent glass sheets, leaving an air space in between, to form a heating zone. Heat transport from this heating zone is accomplished either by air flow through the heating zone or by liquid flow through the series of tubes mounted in the heating zone. Essentially, this is an improved method of making flat panel collectors known in the earlier art. The entire roof becomes a thermal flat panel solar collector and some incremental cost is eliminated.

As in all flat panels, because the glass or other thermal cover sheet is not perfectly transparent, the resulting concentration ratio is, by definition, less than one. In marginal conditions, such as in the morning, late in the afternoon, and at high latitudes, the resulting radiation flux can be severely compromised. When the temperature differential, between the surrounding air and the heat transport fluid is sufficiently large, the obtained efficiency is low, or zero, because a large portion of the low incoming flux of energy is wasted in thermal losses over a large collector area. Lowering the temperature of the heat transport fluid increases the efficiency of the collector itself, but reduces the efficiency of the rest of the total energy system, or increases the capital cost. In a heating system, lowering the temperature requires more heat storage medium, resulting in higher cost. In a thermal cooling system, the lower temperature results in lower efficiency. Using air as heat transport fluid with typical heat exchangers necessitates a higher temperature than with a liquid based system. When liquid is used as heat transport fluid, a series of heat exchanger tubes are utilized, adding a significant capital cost. Even if such modifications are made, the improvement in efficiency would be marginal, since the thermal losses through the large area of glass will still be significant. No efficient means for controlling the collector temperature appears in the description and no means for preventing cool transport fluid from entering the storage tank is included in the described system. In general, the efficiency of the described system seems to be lower than that of the best discrete thermal flat panel collectors. Because of the low, uncontrolled efficiency, the solar roofing panel system disclosed in U.S. Pat. No. 5,259,363 appears to be limited to areas with a hot climate, and perhaps to some special applications as indicated in its description.

A hyperfocal tracking solar thermal collector is described in the Maiden U.S. Pat. No. 5,253,637. According to the Maiden Patent, a hyperbolic or parabolic extended cylindrical reflector, concentrating the solar radiation to a focal line in a narrow absorber box generally above the reflector is provided. The absorber box contains a radiation absorbing plate bonded to a pipe in which the heat transport fluid carries the collected thermal energy away. The absorber housing is thermally insulated to reduce the conduction heat loss. The radiation accepting aperture is located at the bottom of the absorber box, thus reducing the convection heat losses. The absorber box is connected to the reflector assembly with a mechanical linkage. Both the reflector and the absorber box are moved to accomplish two axis tracking (azimuth and elevation) of the moving radiation source. While the reflector is moved to different positions to track the movement of the sun, the absorber box is tilted in relation to the reflector to keep the aperture in horizontal alignment. The heat transport fluid flows to and from the absorber through flexible tubing. To accomplish two axis tracking, two actuators are utilized, one for each direction.

The Maiden solar collector has a relatively large reflector and absorber assembly that moves in two directions. It tilts in the vertical plane and rotates in the horizontal plane. Enough clearance must be provided around and above the described apparatus to allow for this movement. Because of this, a large area and volume of covered space would be required for a glass covered installation. If multiple units were installed, the wasted space between the units would be extensive, resulting in inefficient use of covered area. It would also be very difficult to design a building or a covered structure where its structural members would not cast substantially large shadows on some of the collectors. When installed outside, the apparatus becomes exposed to elements such as rain, wind, hail, snow, dust, and pollution. Having the collector exposed to the outside elements will necessitate mechanically stronger construction, the use of more durable reflector material, stronger and more expensive actuators, and perhaps more frequent maintenance. These factors will result in a higher cost of energy production. The area required would seem to be slightly less than for an inside installation because of the reduced reflector area required. However, a significant amount of surface area will still be wasted. Another problem with multiple unit installations over relatively large surface areas is the extensive network of heat transport pipes and ducts required. This network will incur significant conduction heat loss. Also, because of the large thermal mass in this network, the regeneration time, will be large. The flexible transport fluid hoses that are needed in order to allow for the movement of the absorber assembly are difficult to insulate properly. Because of the limited selection of available flexible materials, these hoses could also be a limiting factor on the high end temperature obtained. Further more, they are more failure prone than rigid pipes or ducts. The described apparatus has an appearance similar to a large satellite dish. Sometimes the architectural structures with the appearance like that are not desirable. While this does not affect the technical merits of the described invention, it could prove to be a hindrance on acceptance of the apparatus by the general public.

U.S. Pat. No. 4,967,729 issued to Okumura discloses a solar heating system for a house which utilizes outside air heated by a solar thermal collector formed by roofing panels exposed to radiation from the sun. In this system, the outside air enters the cavity under the roofing panels, moves by suction via a controllable fan, and is heated by the panels. The heated air is forced through a duct under the floor of the house, where it is used to heat a concrete slab or other heat storage media. Thermal insulation material is provided under the cavity in the roof. Glass plates are provided on top of the roofing panels in an area closest to the air exit from the cavity, thus providing some above paneling thermal insulation in the area of highest temperature.

The efficiency of this type of collector is similar to the one described in U.S. Pat. No. 5,259,363 referred to above. However, in this system, cold air from outside is continuously introduced, resulting in even lower thermal output.

A circular arc solar concentrator is disclosed in U.S. Pat. No. 4,587,951 issued to Townsend et al. In this patent, a building roof incorporating a solar energy concentrating surface is disclosed. The contour of the concentrator surface is concave in the direction parallel to the north-south axis. The concave surface is characterized by a series of circular arcs of increasing radius from the center of the panel to its lateral edge or edges. The concentrating surface is convex in the direction parallel to the east-west axis. The zone of concentration of a concentrator surface is a narrow planar zone which moves in a single plane as the angle of incidence changes during the day and seasonally. A straight absorber or a collector is provided above the concentrating surface and moved linearly to track the changing position of the zone of concentration. A computer program to calculate this position is provided, where the position of the sun is approximated based on current time of day and day of year. A multiple phase molding process to manufacture the described concentrator panels is also disclosed. In that process, strips of aluminum foil are stretched to conform to a mold so that the polished side faces the mold. Epoxy material is then applied to the brushed side to produce a bond. After the epoxy has cured, a fiber reinforced polymer (plastic) is then applied on top of the epoxy to form a rigid panel.

In the disclosure of the invention of Townsend et al., no description of the heat transport loop or other aspects of a complete solar energy system is given. It is assumed that some form of flexible hoses must be used to circulate the heat transport fluid to and from the moving absorber. Neither is it apparent if the aluminum foil forming the reflective surface is to be treated in some way to protect it from the environment. The described method of manufacturing the panels seems labor intensive and difficult to automate, thus setting the limit on what kind of cost per unit of power can be obtained. To keep the system operating at its peak efficiency, the concentrator panels would have to be regularly re-polished. The non-insulated absorber and the flexible transport fluid hoses incur significant thermal losses, especially in cold climate. Although the special contour of the concentrator panels is intended to reduce the optical losses due to radiation arriving at sideways angles, a significant amount of radiation is still lost from the sides. If the disclosed computer program is used as sole means for tracking the movement of the sun, the concentration ratio must be kept low. This is because the disclosed program does not fully account for the properties of earth's movement around the sun, and provides only approximate altitude and azimuth values. Also, since all clocks drift, this method requires some means for keeping the computer's clock in time. Because of the special contour of the reflective roofing panels and the absorber with its moving mechanism above the panels, a building having this collector looks somewhat unconventional.

Consequently, a need exists for improvements in collection of solar energy that will result in lower cost of produced energy and more acceptable operating efficiencies, especially in locations where the quality of solar radiation is questionable.

SUMMARY OF THE INVENTION

With the above in mind, the present invention provides new, efficient, hybrid thermal and electric solar energy collectors which can be installed inside a transparent protective cover, such as in buildings and other structures, at a reduced cost per unit of power and with improved reliability.

An object of the invention is to provide efficient means for concentrating and collecting large amounts of solar energy such that the use of supplementary sources of energy is either reduced to a minimum or eliminated completely. The majority of this energy is collected as thermal energy and is used for heating and cooling of building air space and heating of water. Another portion of the collected energy is converted directly to electricity, to be used for the solar equipment itself, and for lighting and for low to medium power electrical appliances. The excess energy is sold to a utility. The produced thermal energy can also be used for any process which would benefit from thermal energy, such as chemical batch processes, heat drying, desalination, distilling, and the like. As presented in the form of preferred embodiments, air is used as a heat transfer fluid. However, the invention can be readily adapted for use with other heat transfer fluids.

Another object is to reduce the cost of the collector equipment so that the price of produced energy becomes competitive with the price of energy from conventional sources. The present invention seeks ways to provide relatively large collector areas by using inexpensive reflectors, and then investing part of the obtained savings to improve the efficiency of the energy conversion process.

A further object is to have the collector equipment as an integrated component of the building or structure using the energy. In that way, no long distance transportation of energy is necessary, allowing direct use of the thermal energy. In addition, the building can be constructed to support and protect the needed equipment. Advantages can be gained from sharing the cost of a structure or a building between two or more purposes. Recent developments in production of pre-manufactured metal framed buildings have made this object possible and desirable.

A related object is to provide adaptable collector configurations to allow for different geographical locations, climates, and types of buildings. Similarly, it is an object to allow for architectural variations, so as not to severely limit the possibilities in building design and deployment of the solar equipment. It is also an object of this invention to provide solar energy collectors which can be deployed in an aesthetically acceptable manner.

It is still a further object of the invention to provide long lasting and reliable solar collectors such that the maintenance requirements, and costs, will be reduced over a long period of time.

Yet another object is to provide a reliable method of tracking the movement of the source of radiation, using digital technology to sense the direction of highest available flux of incoming radiation accurately.

The foregoing has outlined some of the more pertinent objects of the invention. These objects should be taken to be merely illustrative of some of the most prominent features and applications of the intended invention. Many other beneficial results can be obtained by applying the disclosed embodiments and methods in a different manner or modifying the invention within the scope of the disclosure.

In order to accomplish the stated objects, the present invention provides hybrid solar energy collectors in various configurations, either with a single axis tracking concentrating reflector, or with a stationary concentrating reflector. The concentrating reflector concentrates radiation from the sun to a substantially narrow and straight line of concentration. One or more directing reflectors, parallel to the line of concentration, assist the concentrating reflector. This optical arrangement is suitable for employment in a building or other structure protected by a transparent protective cover. An optimizing energy converter absorbs the concentrated radiation and converts it to other forms of energy, with the optimization being done by providing multiple conversion elements within the converter and controlling these elements individually.

In a tracking version, the concentrating reflector is constructed to concentrate radiation from the sun along a stationary line of concentration, with the axis of the concentrating reflector being parallel to the stationary line of concentration. In a stationary version, the concentrating reflector stays at a permanently fixed alignment and the line of concentration moves along with the movement of the sun. The directing reflectors cooperate with the concentrating reflector by directing radiation to and from the concentrating reflector, thereby maximizing the total effective reflector area. While the position of the sun changes in the direction parallel to the axis of the concentrating reflector, all concentrated radiation remains focused and optimized between the directing reflectors. By concentrating the radiation, the efficiency improves, resulting in successful energy collection during periods of lower solar insolation or at higher latitudes.

The concentrating reflector can be one of several types, described in the detailed description of the invention. As a preferred implementation for a horizontal solar energy collector, one or more sloping, highly reflective, flexible sheets produce a concentrating reflector utilized under a transparent cover, such as a glass roof, above the collector.

These sheets produce one or more sections of a curve called a catenary, which highly resembles a curve of a parabola, and when properly positioned under a horizontal energy converter, will produce the needed concentration of received solar radiation. The appearance of the complete curve formed by the sheets is highly similar to a large parabolic cylindrical reflector. The reflecting sheets are manufactured from readily available, and cost effective, flexible polymer with a metal layer, such as flexible acrylic with highly reflective metallic layer, known as "Mylar," and used in manufacture of capacitors. Other similar reflective flexible sheet material, and suitable for the purpose, is silvered polymer which has been experimented with in heliostats for central receiver solar power plants. In the tracking version, each sheet hangs from a supporting device with one end of the sheet attached to a rotating roll allowing the sheet to be tightened and loosened, with the other end of the sheet attached directly to a supporting device. One or both ends of the sheet, with its associated supporting device, move in a generally vertical direction. Both turning the roll and moving the supporting devices are accomplished by stepper or other digitally controllable motors, controlled by a micro processor. The vertically moving supporting devices accomplish the setting of the overall elevation angle of the concentrating reflector. Thus by vertically adjusting the elevation angle of the sheets, and by tightening or loosening them, the directional and focal properties of the reflected radiation are controlled to achieve the desired concentration effect. This organization arranges and maintains the common line of concentration at the selected position, at the aperture of the energy converter, above the sloping sheet(s). In the stationary version, each sheet simply hangs from a stationary supporting device, at both ends.

To direct radiation, in the direction parallel to the axis of the sloping sheet concentrating reflector, two stationary directing reflectors are mounted along each side of the concentrating reflector, perpendicular to it. To maximize the effective reflector area, these directing reflectors extend all the way from the concentrating reflector, at its lowest position, past the line of concentration, to the transparent protective cover above the collector. Radiation either arriving at or leaving from near the ends of the concentrating reflector at a sideways angle is directed either to the line of concentration, or to the concentrating reflector and from there to the line of concentration. Additional directing reflectors cover the sides of the rafters (or other structural members) supporting the transparent sheeting above the collector. Thus, radiation arriving at the sides of the rafters is directed towards the concentrating reflector. As with the sloping sheet(s), similar inexpensive reflective sheet is hung from one end with a weight attached to the other end, thus forming a section of straight vertical reflector. Alternatively, the reflective sheet material is bonded with a rigid sheet of suitable building material (such as gypsum board), and cut to the required size and shape.

In a preferred implementation for vertical installation, highly reflective vertical strips resembling those used in vertical blinds are also provided by the invention, producing a tracking concentrating reflector in a form suitable for installation inside a vertical transparent cover, such as a glass wall. These strips are installed around a vertical energy converter, in a formation of a section of a circle. The strips are slightly curved along their vertical axis such that they form a small section of a cylindrical reflector and are provided with means for rotating them around their vertical axis, with the ability to digitally control the rotation by a micro processor. The alignment of the strips is pre-calibrated such that on a given direction of incoming radiation the radiation reflected from each strip is directed to the common vertical line of concentration, located at the focal point of the formed section of a circle. Thus, when the angle of the incoming radiation changes with the change in sun's azimuth angle, all strips are rotated to keep the common line of concentration in the center of the circle.

In this vertical implementation, to achieve maximum concentration when the sun is at a low elevation angle, and to prevent loss of radiation when the sun is at higher elevation angle, two specially aligned directing reflectors are provided. A lower, horizontal directing reflector is placed just below the concentrating reflector and is extended from under its strips, past the energy converter at the line of concentration, to the outside edges of the collector, where the transparent protective wall sheets are installed. An upper directing reflector, tilted upwards from the front facing the sun, extends from near the upper end of the strips of the concentrating reflector, past the energy converter, and to the transparent protective sheets.

As stated above, the invention further provides hybrid stationary energy converters for the collection of thermal and electrical energy, suitable for the optical geometry of the described reflector arrangements. For the tracking versions, the converters have the capability of accepting the line of concentration at the aperture as opposed to at the absorber plate of the heat chamber. All include means for controlling the flow rate of the heat transport fluid, optimizing the efficiency of the heat collection process. Internal reflectors in an aperture cavity of the converter redirect radiation striking the sides of the cavity, allowing the line of concentration to be placed at the aperture opening. In a cavity, a transparent thermal sheet reduces thermal losses. Elsewhere around the converter two layers of thermal insulation, with a radiation shield in between the layers, further reduce the thermal losses. Insulated inlets and outlets provide means for transporting the heat transport fluid in and out of the converter. Multiple heat chambers are provided inside the converter, fitted with high temperature PV cells, and having flow control devices controlling the flow of heat transport fluid, independently through each heat chamber. This arrangement allows a control program in a micro processor to reduce the flow rate through the heat chambers receiving less radiation, or shutting off the flow completely. It also allows for varying control strategies, such as maximizing the thermal efficiency, maximizing the temperature, or limiting the temperature to an efficient range for the PV cells. In a stationary concentrating reflector version, the energy converter is large enough to cover the entire area of movement by the concentrated radiation, with many heat chambers allowing substantial separation of different zones of concentration.

A radiation scanner producing digital angle measurement measures the angle of incoming radiation. A substantially long and thin rod having a cross sectional shape of an equilateral triangle, with each side of the triangular rod being highly reflective, rotates around its axis. Each side, or segment, in its turn becomes exposed to the radiation from the sun and reflects this radiation to a wide and thin planar beam. The beam of reflected radiation is also rotating, and sweeping in an angular motion. Two radiation sensors are placed away from the rod, approximately at the ends of the rod and substantially at the same side with the sun, facing the rod. As the radiation source (the sun) moves, at least one of the radiation sensors is being repeatedly and momentarily exposed to the beam of radiation, which reflects from each segment of the rod, as the beam sweeps by.

The radiation energy level reading present at each radiation sensor is recorded repeatedly, along with the angular position of the rod, at the time of such reading. These repeated readings are taken at very fine angular intervals of rotation of the rod, as to accurately detect the changes in radiation energy levels when the reflected beam passes and becomes briefly aligned with at least one of the radiation sensors. At the end of each sweep, an angular direction of highest obtainable radiation energy level for a given size of angular window is computed. The size of this angular window is selected to match the size of angular radiation acceptance window of the solar collector, or group of collectors. This angle of incoming radiation, in the direction perpendicular to the rod, is called a relative elevation angle (in this description). When the described scanner is placed with its axis parallel to the axis of the directing and concentrating solar collector, both at equal orientation towards the sun, the obtained angle (relative elevation angle) is used directly for adjustment of the concentrating reflector for optimum concentration.

In order to accomplish the above tracking of the radiation source, positioning of the concentrating reflectors, and to maximize the efficiency of the energy conversion process, a micro processor with the most essential programs is described. The positioning motors for the concentrating reflector, necessary supporting hardware, electronics, and a backup battery are also included. A single micro processor can be used to control multiple collectors. A separate photovoltaic panel provides initial electrical power to the micro processor, related electronics and the motors. This panel supplies the start up time operating power and charges the battery during the daylight hours. During the nights and cloudy periods, the battery provides the minimal electricity needed to keep the micro processor "alive."

This equipment is installed in a building or a structure having a section of its outside cover (such as roof or wall) made from strong, high transmissivity glass or other sheet material with equivalent properties. Exceptions to this are the separate photovoltaic panel and the radiation scanners, which are installed outside. The key structural building components, namely trusses, rafters, and support frames are pre-manufactured with the support and mounting positions for the installation of the described equipment.

In summary, good efficiency is achieved by the use of both directing and concentrating reflectors, such that solar radiation is concentrated to a narrow line of concentration at a stationary energy converter. The geometry of the reflectors provides for efficient energy collection under a variety of conditions and the stationary energy converter can be extremely well insulated against both the conduction and convection heat losses. In all horizontal permutations, the aperture of the energy converter faces generally downwards, further reducing thermal losses. The use of the energy converters with multiple heat chambers leverages the reflector geometry, allowing control strategies to be opted either for very good efficiency, or for very high temperatures. In the tracking versions, the use of the internal side reflectors allows a narrower converter, thus further reducing the thermal losses.

The reduced cost, as compared to previous collectors with similar performance, is realized by the above organization of directing and concentrating reflectors in such a form and geometry that they can be readily incorporated in a building, under a glass or other protective transparent cover. This allows the use of low cost materials and components, enhances life time of the equipment and reduces maintenance. By pre-manufacturing the building components to support the solar equipment, many additional costs of solar equipment support structures are eliminated The reflector geometry allows for single axis tracking and positioning, thus eliminating the second axis positioning hardware. It also allows for no tracking at all, when using a large multiple element energy converter. Further, the use of a sloping reflecting sheet as a horizontal concentrating reflector, and the use of the reflective strip array as a vertical concentrating reflector, lowers the material and manufacturing costs of the reflectors. The resulting costs are a fraction of the costs of the reflectors made from rigid materials, conforming to some specific contour.

The use of a micro processor and digital control technology simplifies the design of the electronic and mechanical assemblies, resulting in a highly reliable system at a reduced cost, yet allowing tighter control over tracking accuracy and conversion temperature. Digitally measured relative elevation angle provides very accurate, self reliant, tracking of the sun's movement and is virtually unaffected by errors such as aging and temperature drifting of analog components. It also provides the ability to aim the collector towards the best radiation source, even if it is not at the center of the sun.

The foregoing has given a broad overview of the most important aspects and features of the present invention. Many additional features, details, and underlying theories will be described hereinafter.

BRIEF DESCRIPTION OF THE DRAWINGS

FIG. 8 is a perspective view of an orientation independent installation of the sloping sheet concentrating reflector and its relative elevation adjustment mechanism.

FIG. 32A is a diagrammatic representation of a horizontal energy converter with multiple parallel heat chambers.

FIG. 32B is a diagrammatic representation of a vertical energy converter with multiple heat chambers in a bypass arrangement.

FIG. 32C is a diagrammatic representation of the heat transport loop and its components.

DETAILED DESCRIPTION OF THE PREFERRED EMBODIMENTS

Figure 1:
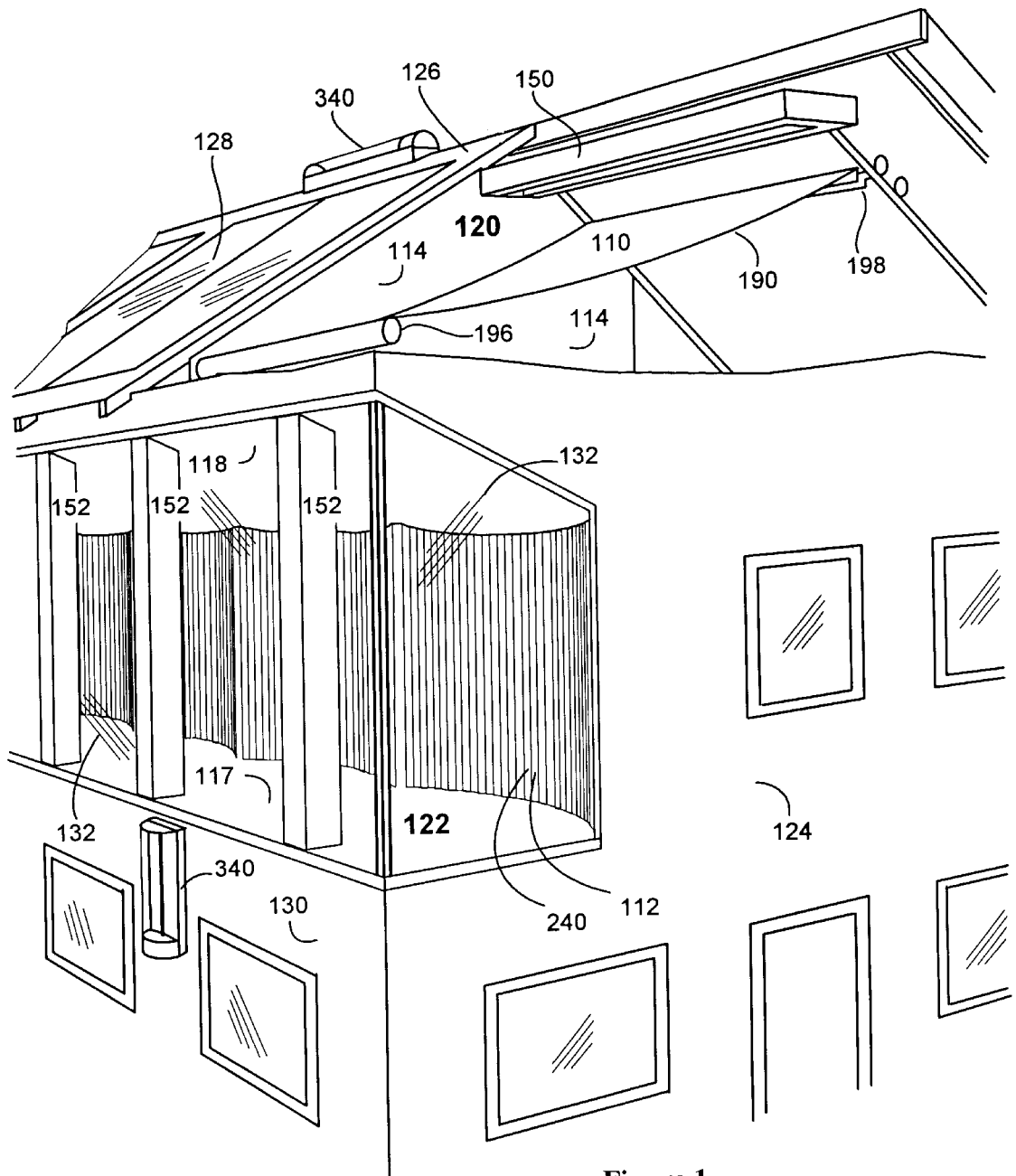
FIG. 1 is a perspective view of the main preferred embodiments showing an arrangement of horizontally oriented collectors under a transparent roof of a building and vertically oriented collectors inside a transparent wall of the building.

Referring now to the drawings and particularly to FIG. 1, hybrid solar energy collectors for a horizontal installation 120 under a transparent roof 128 and for a vertical interior installation 122 along a transparent section 132 of a wall 130 of a building 124 are illustrated. The horizontal form of the directing and concentrating solar energy collector 120 includes vertical directing reflectors 114 as means for directing solar radiation. It also includes highly reflective substantially horizontally sloping sheet 190 and concentrating reflector 110 as a means for concentrating short wave radiation from the sun to a stationary horizontal line of concentration. The horizontal apparatus 120 further includes a horizontal energy converter 150 as a means for converting the concentrated radiation to other forms of energy. Similarly, the vertical form of the directing and concentrating solar energy collector 122 includes a lower horizontal directing reflector 117, an upper upwardly tilted directing reflector 118 as a means for directing solar radiation. It also includes a vertical reflective strip 240 concentrating reflector 112 as a means for concentrating solar radiation from the sun to a vertical stationary line of concentration. The vertical apparatus 122 further includes an array of vertical energy converter 152 as a means for converting the concentrated radiation to other forms of energy. These two forms of the directing and concentrating energy collectors 120,122 are presented as the two main preferred embodiments. It is pointed out that their performance, while excellent, is not necessarily the highest possible of the different feasible implementations of the present invention. This will become more apparent in the description hereinafter, which will illustrate the various features, aspects, and advantages of the invention in detail, both from theoretical and implementation perspectives.

Figure 2A:
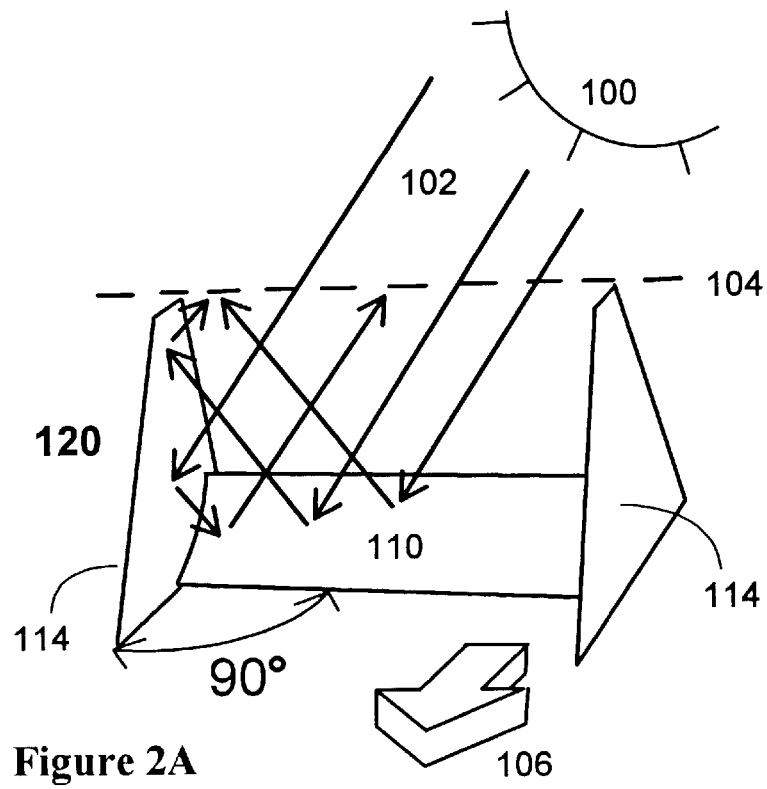
FIGS. 2A & 2B are diagrammatic representations of the directing and concentrating reflectors illustrating the optical principles of the invention.

The horizontal form of the directing and concentrating solar energy collector 120 is illustrated in FIG. 2A, short wave radiation 102 from the sun 100 is concentrated to a narrow line of concentration 104 utilizing a curved cylindrical concentrating reflector 110 and straight directing reflectors 114 perpendicular to the concentrating reflector 110. The directing reflectors 114 extend from the concentrating reflector 110 all the way to the outer edges of any structural objects above, to the line of concentration 104, or past it. The arrangement of the reflectors 110,114 for this discussion is assumed to be such that the reflective surface of the concentrating reflector 110 is oriented towards the sun 100 at the time of solar noon. In this way, the axis of the concentrating reflector 110 is perpendicular to the incoming radiation 102. It should be noted that with the specific methods provided by the present invention, this orientation is not a mandatory requirement. However, it provides more cost effective implementations and helps the ongoing discussion. The side of the apparatus facing the sun 100 is considered to be the front side, and is also illustrated by the arrow 106 pointing to the general direction of the sun 100. The concentrating reflector 110 may be made adjustable, for tracking the movement of the sun 100, so that the line of concentration 104 is formed generally above the reflectors 110,114, and is kept at the same position while the elevation and azimuth angles of the sun 100 change. This adjustment arrangement depends on a specific type of the concentrating reflector 110 and is defined later in this description. The concentrating reflector 110 may also be made fixed, with no tracking adjustment performed. In this form, the line of concentration 104 is moving, as dictated by the movement of the sun 100.

As the earth rotates in the east to west direction, the sun 100 is seen passing this apparatus from its front, traveling from its left side to its right side (in the northern hemisphere). As it does so, the radiation 102 enters the reflectors 110,114 at a sideways angle, from the left before the solar noon, and from the right after the solar noon. When the radiation 102 enters the concentrating reflector 110 at such a sideways angle, striking the reflector 110 at or near the opposite end, it is reflected outwards, and upwards, with an equal angle to the opposite direction, left or right, thus arriving at one of the directing reflectors 114. From the directing reflector 114 the radiation 102 is reflected again, now inwards, towards the line of concentration 104, to which it will arrive. When the radiation 102 enters the directing reflector 114, it is first reflected inwards and downwards, towards the concentrating reflector 110. From the concentrating reflector 110 it is reflected back up with the sideways angle exactly opposite (turned by 180°) to the sideways angle of original entry, and with an elevation angle such that it will arrive at the line of concentration 104. Thus, the function of the directing reflectors 114 is to direct incoming radiation 102 toward the line of concentration 104, such that the amount of radiation 102 striking the concentrating reflector 110 is maximized. Another way of expressing this is that a function of the reflectors 114 is to direct radiation 102 to and from the concentrating reflector 110, such that the concentrated radiation 102 remains between the two directing reflectors 114, at the line of concentration 104.

Figure 2B:
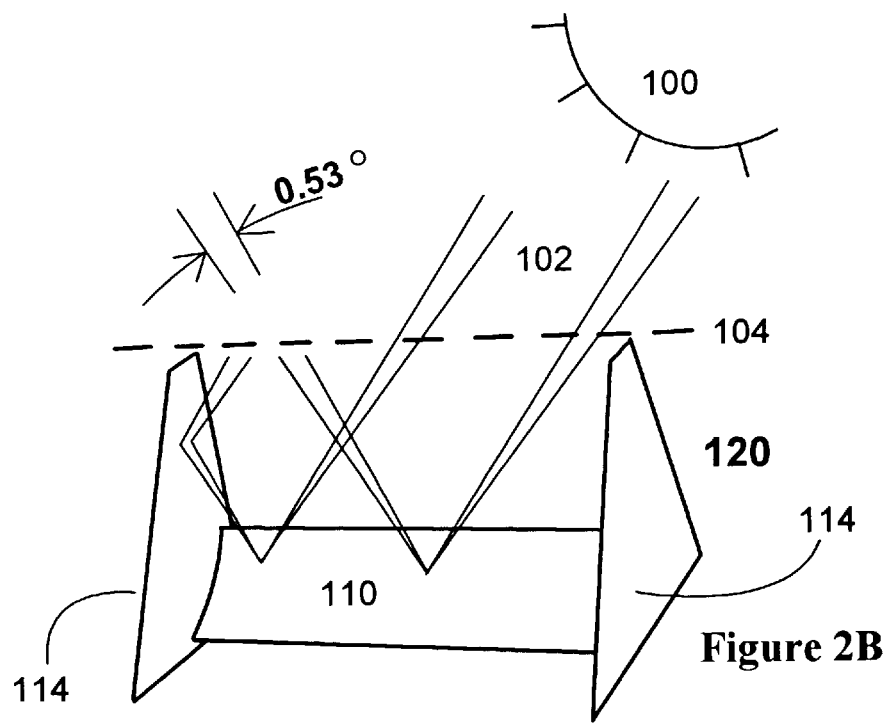

FIG. 2B illustrates properties of the solar image at the line of concentration 104. When the radiation 102 travels from the concentrating reflector 110 to the directing reflector 114 and from there to the line of concentration 104 it covers the same distance as if it had traveled directly from the concentrating reflector 110 to the line of concentration 104. Thus the approximate size of the solar image at the line of concentration 104 is always determined by the distance from the concentrating reflector 110 to the line of concentration 104 and the sideways angle, as in the following equation:

$$w = \frac{r}{108 \cos a}$$

where w is the width of the solar image at the line of concentration 104, r is the distance between the concentrating reflector 110 and the line of concentration 104, a is the sideways angle, and 108 is the sun's distance from the earth divided by the sun's diameter. For example, at a sideways angle of 60°, the width of the image is twice the width of the image at solar noon (0°). Another way of looking at this is to note that a solar reflection from a tiny point reflector has an angular window of 0.53°.

When the radiation 102 reflects from the directing reflector(s) 114, two (or more) total reflections will take place. This represents a small loss not encountered with single reflector arrangements. For example, if both reflectors 110,114 have a reflectance of 0.9, the total reflectance for the two reflections is 0.81, representing about a 10% additional loss for the portion of the radiation 102 reflected from the directing reflectors 114. Since the sideways angle has to be very large for the majority of the radiation 102 to reflect from the directing reflectors 114, this poses no significant daily loss. Furthermore, this small optical inefficiency is more than offset by the additional total reflecting area and the resulting geometry of the collectors Yet another characteristic of the arrangement of concentrating reflectors 110 and directing reflectors 114 is the flux variations along the line of concentration 104. As the radiation 102 enters at a moderately sideways angle, part of the line of concentration 104 between the directing reflectors 114 receives normal radiation 102 flux, another part receives nearly double the normal flux, and a third part receives no radiation 102 at all. This, is turned into an advantage by utilizing energy converters having multiple sections, as will be described later in detail.

Figure 3A:
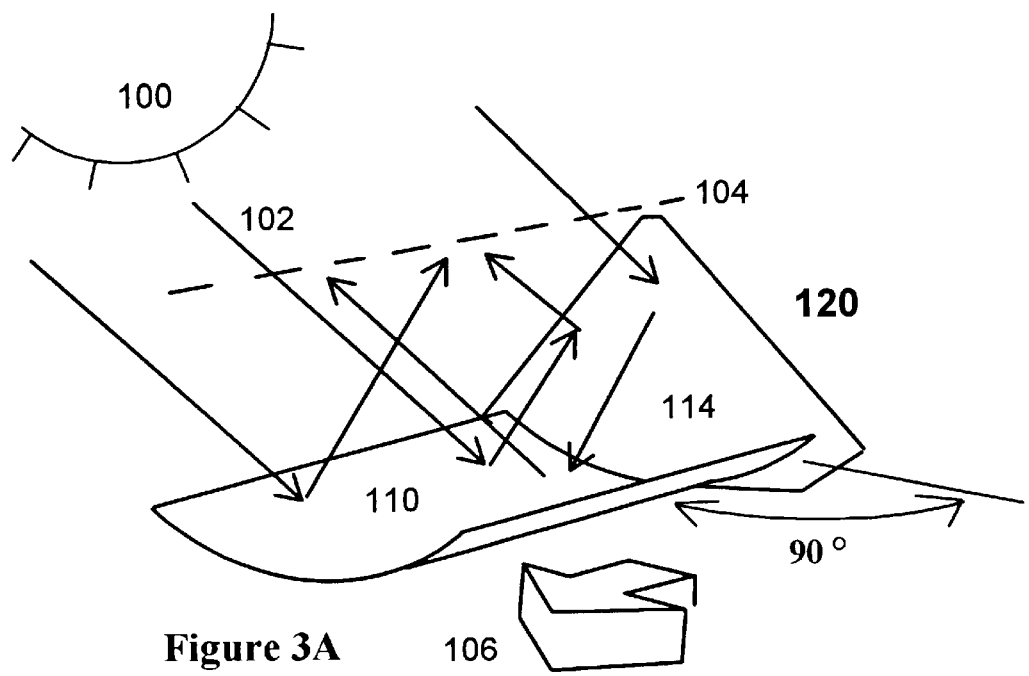
FIGS. 3A & 3B are diagrammatic views of important variations of the use of the optical principles.
Figure 3B:
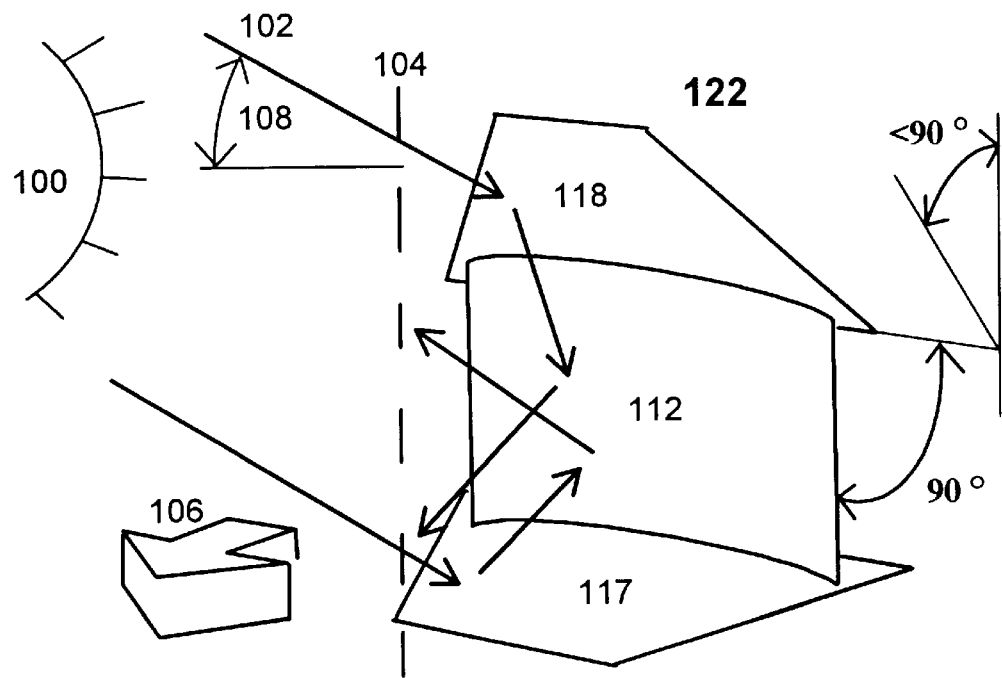

FIGS. 3A and 3B illustrate useful variations in the reflector geometry. A horizontal concentrating solar collector 120 configuration with a concentrating reflector 110 and only one directing reflector 114 is shown in FIG. 3A. The orientation of the collector is such that the axis of the concentrating reflector 110 is parallel with the direction of the solar noon, and the side towards the direction of solar noon does not have a directing reflector 114. The general direction of the sun 100 is shown with the arrow 106. This arrangement achieves high radiation 102 concentration levels, for the given area of the concentrating reflector 110, with the sun 100 positioned close to the direction of solar noon. At mid elevational angles, the total area of the reflector 110,114 surface in the path of incoming radiation 102 is much larger than the area of the concentrating reflector 110 alone. At those elevational angles, a large portion of the line of concentration 104, at the end of the only directing reflector 114, sees nearly double the radiation 102 flux (as compared to the flux with the concentrating reflector 110 only). Because of this, the described arrangement is useful in generating very high temperatures for a few hours during the middle of the day, using a relatively small horizontal reflector 110 area. However, early in the morning, and late in the evening, a significant amount of the incoming radiation 102 may be lost, either from the ends of the concentrating reflector 110, or from the side of it that does not have the directing reflector 114. The early morning and late evening losses can be somewhat reduced by utilizing an orientation independent sloping sheet concentrating reflector, which will be described shortly.

Another geometry variation is depicted in FIG. 3B. A vertical concentrating solar collector 122 with the concentrating reflector 112 in a vertical position, and two directing reflectors, bottom 117, and top 118, with the top directing reflector 118 permanently tilted upwards. The bottom directing reflector 117 is placed horizontally under the vertical concentrating reflector 112. The orientation of the collector 122 is made such that the concentrating reflector 112 faces towards the direction of solar noon, as indicated by the arrow 106. Tilting the top directing reflector 118 maintains the focus on the line of concentration 104, according to the laws of optical reflection. This is true as long as the tilting axis is kept perpendicular to the concentrating reflector 112, and the radiation 102 is reflected from both concentrating 112 and directing 117,118 reflectors. When the sun 100 is at a low elevational angle, shown as 108, the radiation 102 concentrates at the lower and middle parts of the line of concentration 104, and the top most part of it (generally at the level above the concentrating reflector 112) receives no radiation 102 at all. The sun 100 at a very high elevation angle will produce a concentration pattern at the top part of the line of concentration 104, and no radiation 102 at the lowest part of it. Because of this, the provided vertical solar collector 122 performs the best at high latitudes of the earth, and during a few winter months at moderate latitudes, when the sun 100 is at low elevational angles. This arrangement is further described in the implementation description of the main preferred embodiments.

Figure 4A:
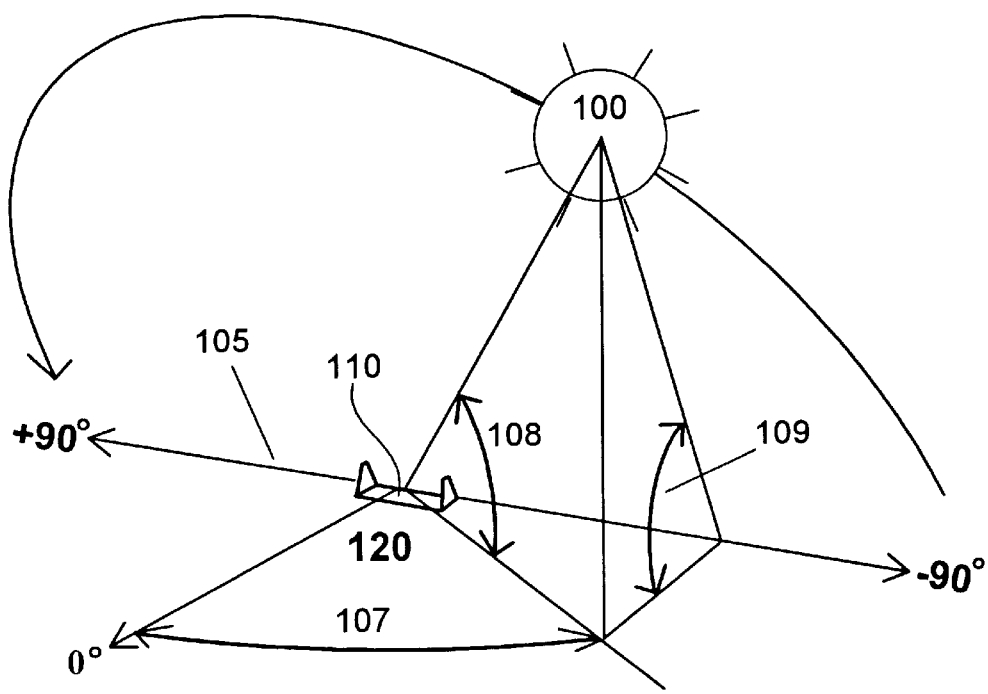
FIGS. 4A & 4B are diagrammatic representations of the concept of relative elevation (or incident) angle and its use.
Figure 4B:
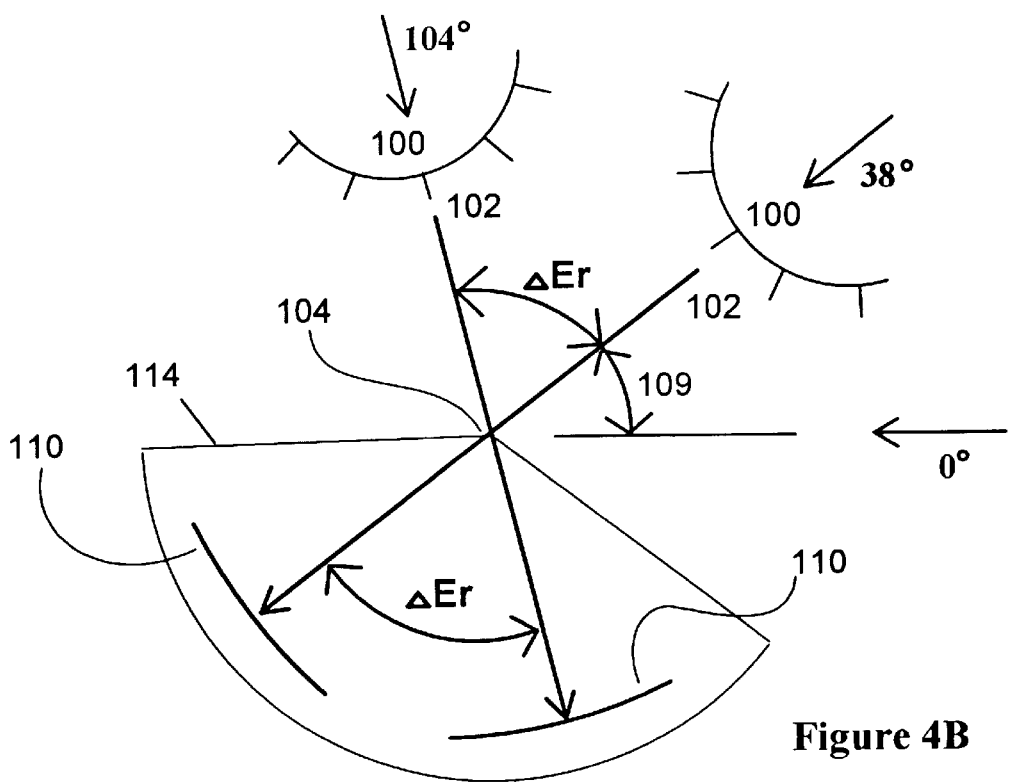

With attention now to FIGS. 4A and 4B, in order to adjust the position and or the angle of the horizontal concentrating reflector 110 correctly, either a relative elevation tracking device (not shown) must be used, or the relative elevation angle 109, must be computed from an accurate clock. The relative elevation angle 109 is defined here as an elevation in relation to the axis 105 of the concentrating reflector 110. In the present invention, the relative elevation angle 109 is calculated by a micro processor (described later) with the aid of a radiation scanner, (described later). However, for the complete understanding of the difference between solar elevation 108 in relation to the horizon and the relative elevation 109, the calculation of the relative elevation 109 is presented. The relative elevation 109 is calculated from current azimuth 107 of the sun 100, current elevation 108, and orientation of the solar collector 120 in relation to solar noon. For the purpose of this calculation, the azimuth angle 107 and the collector's 120 deviation from the direction of solar noon (deviation not shown in FIG. 4A) are both expressed as negative numbers to the left and positive numbers to the right. For example, the azimuth angle 107 of 10° before (after in the southern hemisphere) the solar noon is expressed as −10, and the collector 120 facing 5° left (5° east in the northern hemisphere) has an azimuth deviation of −5. The corrected azimuth is first computed as follows: a=abs(A−Ad), where a is the corrected azimuth, A is the true azimuth 107, and Ad is the collector's 120 deviation from the direction of solar noon. The relative elevation 109 in degrees can then be computed as follows:

If $a$ equals 0, $Er = E$ else if $a$ equals 90, $Er = 90$ else if $a$ is greater than 90, $$Er = 180 - \arctan\left(\frac{\tan E}{\sin a \tan(a - 90)}\right)$$

else, $$Er = \arctan\left(\frac{\tan E}{\sin a \tan(90 - a)}\right)$$

In the above, Er is the relative elevation 109 and E is the elevation 108 in relation to the horizon.

FIG. 4B illustrates how the relative elevation angle 109 is used. It is a view showing the arrangement of the two types of reflectors 110,114 in relation to changing relative elevation 109. For this example, the concentrating reflector 110 is assumed to be a cylindrical parabolic reflector, whose elevational adjustment is accomplished by rotating it around the line of concentration 104. To obtain the desired line of concentration 104, the parabolic concentrating reflector 110 is aligned such that its vertex line is parallel with the incoming solar radiation 102. As the relative elevation 109 changes, the concentrating reflector 110 is rotated precisely by the same angle as is the change in relative elevation 109. The maximum desired range in the relative elevation 109 and the arc length of the parabolic concentrating reflector 110 will determine the size of the directing reflectors 114. This size must be large enough so that the concentrating reflector 110 stays completely between the two directing reflectors 114 at all desired relative elevation angles 109. Accordingly, the surface of the directing reflectors 114 extends from all extreme positions of the concentrating reflector 110 to the line of concentration 104, or past it.

By employing the principles just described, it is possible to create several useful types or permutations of solar collectors with the concentrating, main reflector 110 one or more directing reflectors 114, using a single axis tracking mechanism, tracking the change in the relative elevation angle 109. It is also possible to create permutations using no tracking mechanism at all. All of these permutations have their specific characteristics and are useful in different situations. The orientation and variations of these collectors is by no means limited to the examples used in this description. As long as the proper relative elevation 109 alignment is maintained between the collector's reflectors 110,114 and the sun 100, and a useful amount of energy is collected, the intended purpose is served. The axis 105 of the collector can be horizontal, vertical, or anything that results in efficient collection of energy.

Figure 5A:
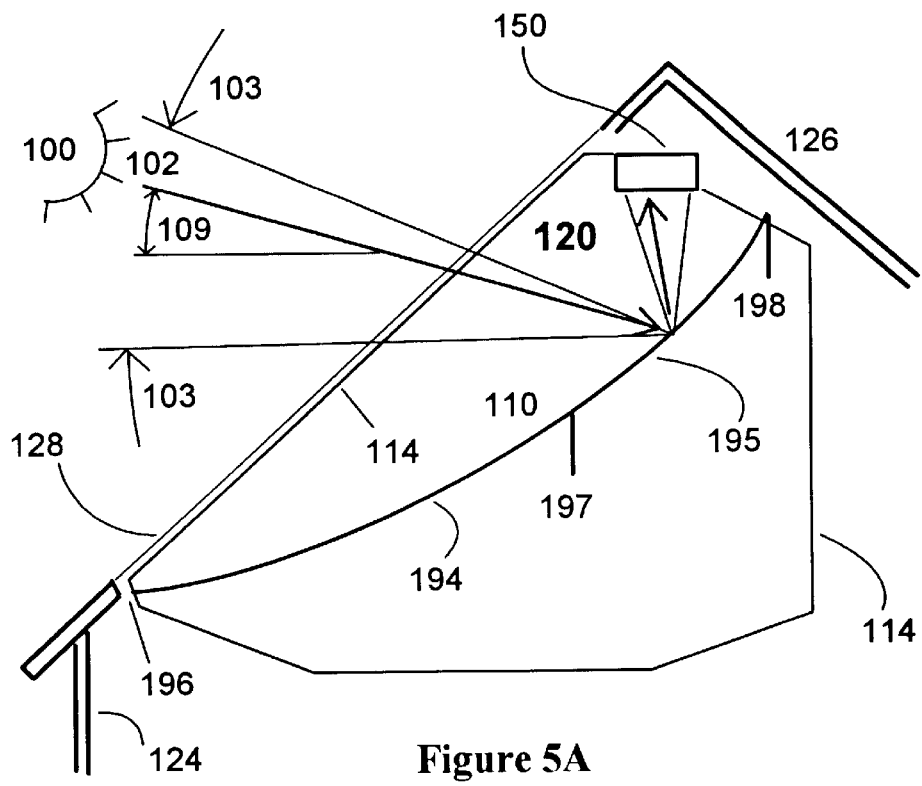
FIG. 5A is a diagrammatic side view of a collector utilizing flexible sloping reflective sheets as a concentrating reflector.

FIG. 5A depicts the concept of a horizontal directing and concentrating solar collector 120 using two flexible, highly reflective hanging sloping sheets 194,195 as the concentrating reflector 110, installed under a transparent section 128 of a roof 126 in a building 124, or other similar structure. The first reflective sheet 194 extends from the bottom of the transparent section 128 of the roof 126 (from a front sheet support 196) to the middle sheet support 197, hanging freely in between the two supporting points 196,197, pulled downwards by the gravitational force. The second reflective sheet 195 hangs in between the middle sheet support 197 and the rear sheet support 198, also freely pulled down by gravity.

The length of the sheets 194,195 and the position of the supports 196,197,198 are made such that the solar radiation 102 from the sun 100 entering through the transparent section 128 of the roof 126 is concentrated at an energy converter 150 above the hanging sheets 194,195. The length of each sheet 194,195 and the vertical position of the middle 197 and rear 198 sheet supports are made adjustable. As the relative elevation 109 of the sun 100 changes, the concentrating reflector 110 is adjusted to keep the line of concentration stationary at the energy converter 150. A directing reflector 114, provided on each side of the concentrating reflector 110, directs the radiation 102 entering at sideways angles, as described before. These directing reflectors 114 are extended to cover the entire area of the sides so that any radiation 102 entering between the directing reflectors 114 and above the concentrating reflector 110 but below the transparent cover 128 will not be lost by exiting from the sides.

Also shown in FIG. 5A is the concept of the radiation acceptance window 103. Basically, it is an angular window defined by the width of the energy converter's 150 receiving surface and by the distance from the energy converter 150 to the concentrating reflector 110. Obviously, it is not easily defined since the distance between the two varies, depending on where it is measured, and on how the position of the concentrating reflector 110 changes during tracking. However, a reasonable average size for this window 103 can be defined for each collector. The size of the radiation acceptance window 103 has its importance in determining how much diffused radiation a given solar collector 120 will be able to absorb and convert. The wider the window 103, the more diffused radiation 102 will be converted. Also, the wider the window 103, the smaller the concentration ratio will be. This aspect also has an implication on how to best position a tracking concentrating reflector 110. Often, when there is significant amount of water vapor in the air, powerful reflections will form around the sun 100. Many times these reflections are not evenly distributed. In these circumstances, it is advantageous to deviate the tracking slightly towards such reflection, especially if the concentrating reflector 110 has a large radiation acceptance window 103. Therefore, both direct and reflected radiation 102 are absorbed. How this is done, should become clear from the subsequent description of a radiation scanner.

Figure 5B:
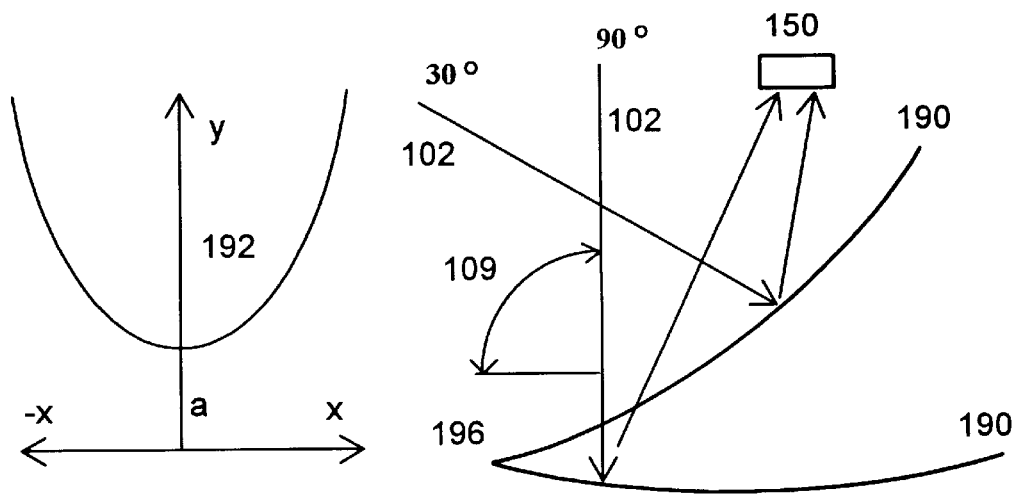
FIG. 5B is a plot of a catenary curve and a diagrammatic representation of its use as a sloping sheet concentrating reflector.

FIG. 5B depicts the optical behavior of the hanging sheets 194,195. A flexible sloping sheet reflector 190 is also shown in two different elevational positions. When a flexible rope or chain, uniform in weight, hangs in the air between two supporting points, under gravitational force, it forms a catenary curve 192. The same applies to a flexible sheet 190, uniform in weight. The relevant property of this curve 192 is that its bottom is almost identical to the bottom of a parabola. Therefore, a nearly parabolic reflector can be constructed from a hanging reflective sheet 190 of proper length, supported from both ends. When the radiation 102 enters directly from the top (relative elevation 109=90°), the support points are placed at the same height. At this position, if an energy converter 150 is at the proper distance above, the concentration on it can be nearly perfect. When the radiation 102 enters at a lower relative elevation angle 109, the sheet 190 must be tilted towards the radiation source and its length adjusted. This somewhat deteriorates the quality of the concentration, depending on the location of the tilt pivot point 196 and on how far to the side the produced section falls on the catenary curve 192. Reasonably good average concentration can be obtained even if only one sheet 190 is used. For a low to medium grade heat producing thermal only collector (sufficient for heating and cooling of a building), one sheet 190 can be enough, even at high latitudes. For very high temperatures and or for primarily photovoltaic applications, and when more uniform radiation 102 flux may be required, two or more sheets 190 (sections) are needed. At or near the equator, a single sheet 190 reflector 110 provides excellent performance, and generation of several hundred ° C. temperatures should be possible.

The basic equation of the catenary 192 is expressed as follows:

$$y = \frac{a}{2}(e^{\frac{x}{a}} + e^{-\frac{x}{a}})$$

It can also be written in form:

$$y = a \cos h(x/a)$$

In this, y is the vertical position, x is the horizontal position, and for the purpose of finding the reflector geometry, a can be used as a scale factor. One way of finding the proper geometry would be to build an experimental collector 120 with the hanging sheet 190 adjustable in many ways. Another way is to do this experiment mathematically, for example, on a spread sheet.

First the positions of the front support 196 and the energy converter 150 are decided. From those, and from the relative elevation angle 109, the required angle of the sheet 190 at the front support 196 is calculated according to the principles of optical reflection. The angle of the sheet 190 automatically determines a starting point on the catenary curve 192. It is found by: s=tan b, and by: x=asinh s, where b is the angle of the sheet 190 at the starting point 196 and s is the length of the curve from the starting point 196 to the bottom of the curve. The function asinh is an inverse of sinh. The section of the curve is then scaled and plotted to the selected X-Y scale with the following equation:

$$Y = a\cosh\left(\frac{X - X\text{offs}}{a}\right) - a + Y\text{offs}$$

In this, Y is the vertical position, X is the horizontal position, a is an experimentally selected scale factor, Xoffs is the horizontal offset, and Yoffs is the vertical offset. The horizontal offset comes from the following: Xoffs=X0−x a, where X0 is the horizontal position of the front support 196, x is the horizontal starting position on the catenary curve 192 as calculated above, and a is the selected scale factor. The vertical offset is given by the following:

$$Y\text{offs} = Y0 - a\cosh\left(\frac{X0 - X\text{offs}}{a}\right) + a$$

where Y0 is the vertical position of the front support 196, and the other terms are as defined before. To calculate the direction of the reflection, the angle of the sheet 190 for each point is obtained by the following equation:

$$b = \arctan\sinh\left(\frac{X - X\text{offs}}{a}\right)$$

To obtain the desired concentration pattern, the value of the scale factor, a, is changed and the plotting process is repeated.

Figure 6A:
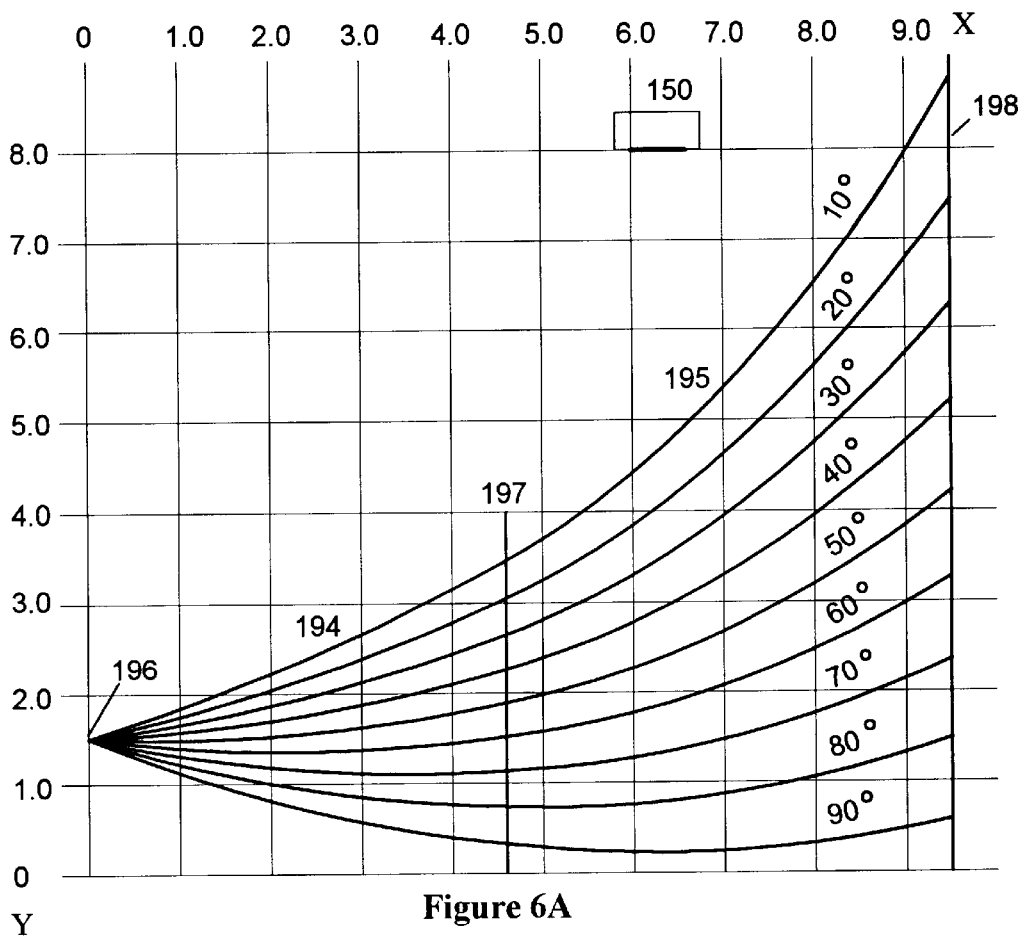
FIGS. 6A, 6B & 6C are plots of the theoretical aspects and quality of concentration produced by a sloping sheet reflector.
Figure 6B:
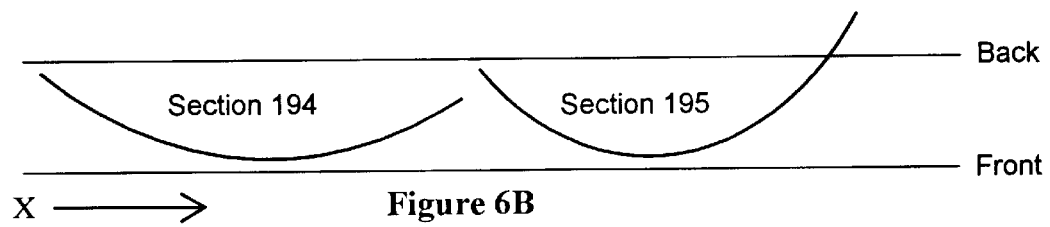
Figure 6C:
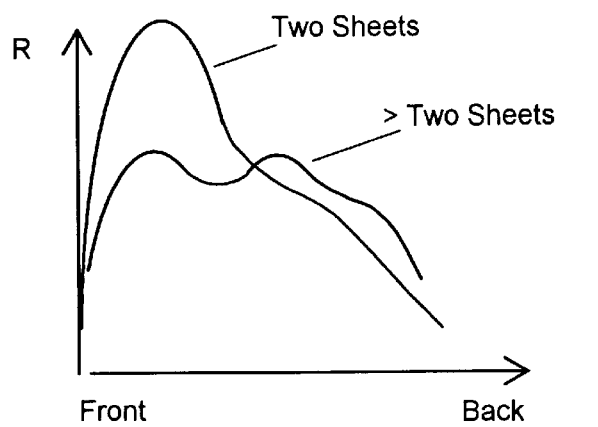

Referring to FIGS. 6A, 6B and 6C, FIG. 6A shows an actual X-Y plot of a double section reflector 110, optimized for maximum thermal energy collection. The first reflective sheet 194 extends from the front sheet support 196 to the middle sheet support 197. The second reflective sheet 195 continues the reflector 110 from the middle sheet support 197 to the back sheet support 198. The position of the sheets 194,195 is shown for the values of relative elevation 109 from 10° to 90°, in 10° intervals. The energy converter 150 is shown in its actual position. From this, it can be seen that at low elevational angles there is a "knee" on the curve at the junction of the two sections (197). When higher elevation angles are observed the knee disappears, and in fact, a single continuous sheet would produce an identical curve.

FIG. 6B is a plot of the typical radiation striking position pattern within the absorber aperture, as a function of distance X from the front sheet support 196. The first striking position curve is produced by the first sheet 194, and the second striking position curve is produced by the second sheet 195. Typically, higher radiation flux is present towards the front of the aperture, than towards the back of it. At mid relative elevation a steeper striking position curve is produced by the second sheet 195 than by the first sheet 194 because the curve of the second sheet 195 is farther away from the center of the catenary. This is further depicted in FIG. 6C which shows the typical pattern of concentration ratios when the curves of the two sheets 194,195 are optimized for the maximum thermal power. Another pattern of concentration ratios shows the approximate effect of the use of more reflecting sheets (sections) with the optimization towards more uniform flux, such as may be needed in primarily photovoltaic applications.

Figure 7A:
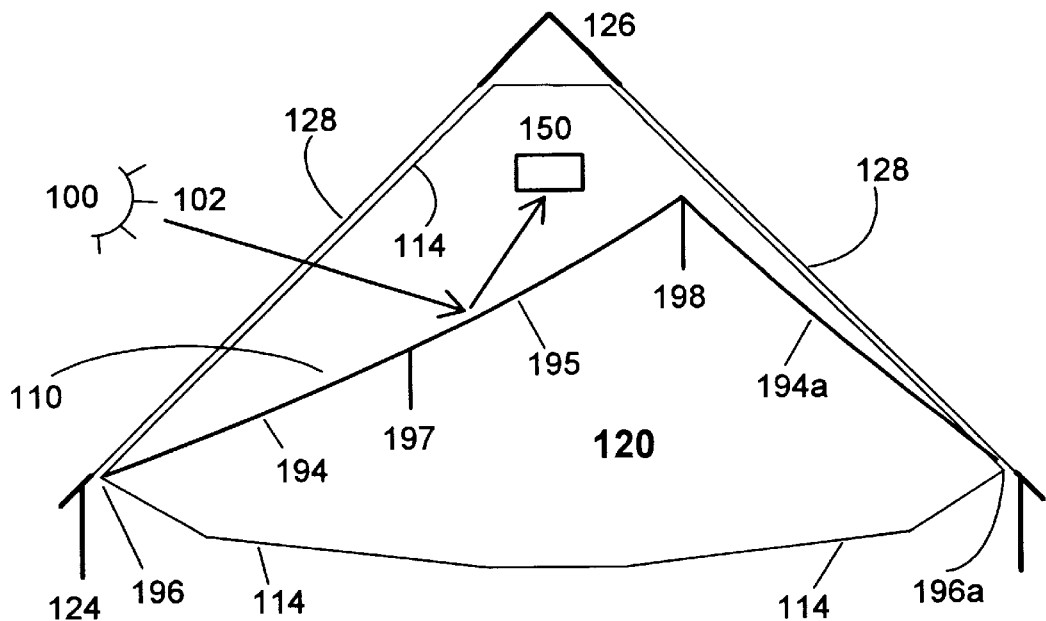
FIGS. 7A, 7B & 7C are diagrammatic representations of an orientation independent solar energy collector utilizing reflective sloping sheets as a concentrating reflector.
Figure 7B:
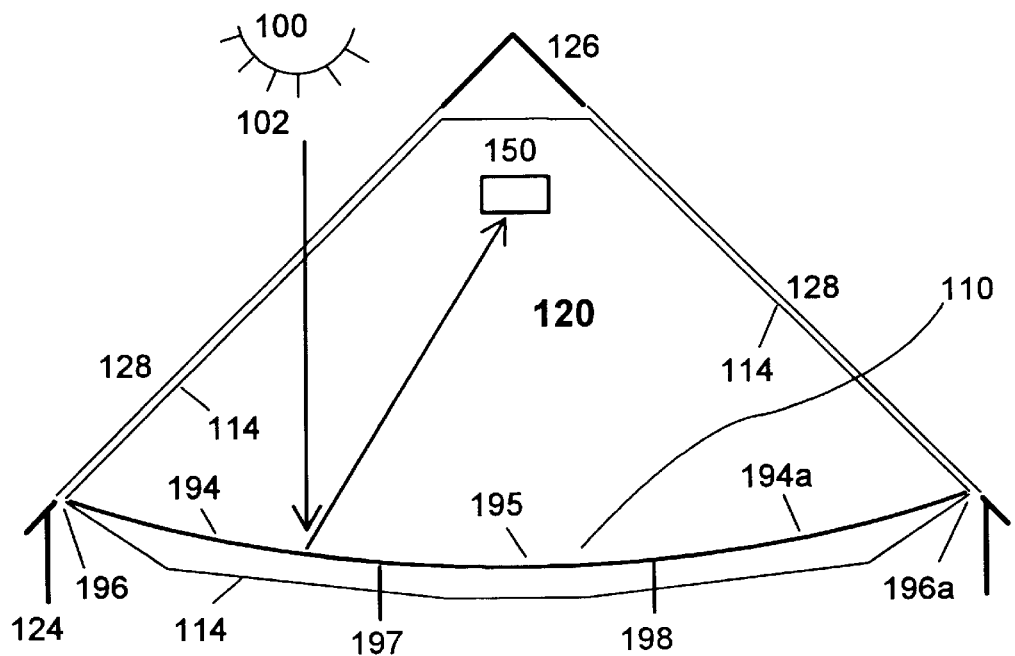
Figure 7C:
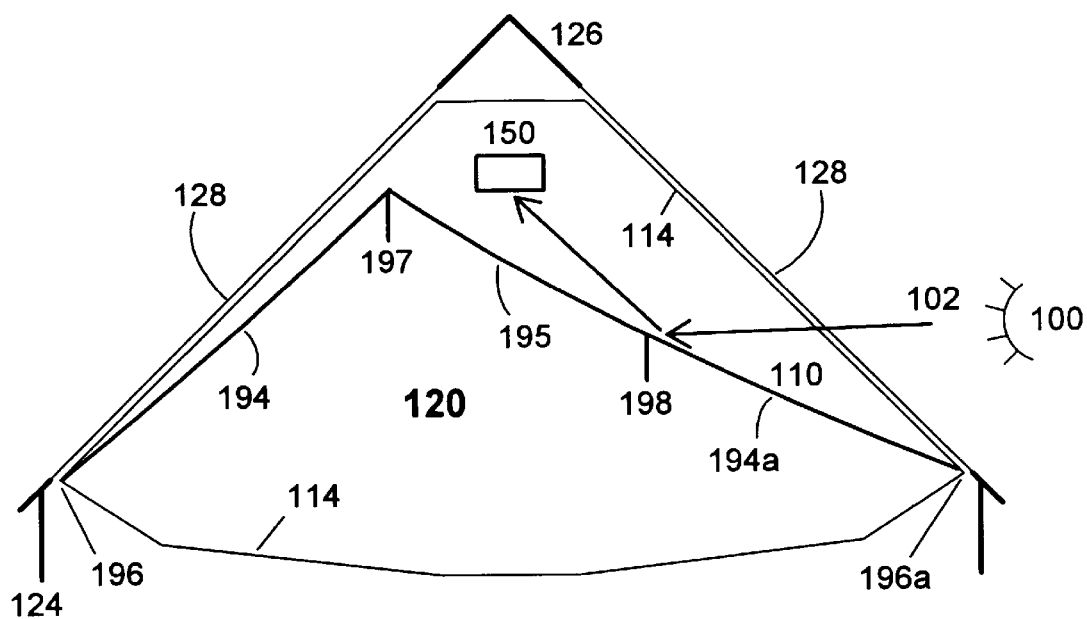

As the arrangement of sloping sheets described above only works well when the front of the collector faces the direction of solar noon, another arrangement is provided for orientation independent installation and is depicted in FIGS. 7A, 7B & 7C. A building 124 with a double sloping roof 126 with a transparent section 128 on both sides of a ridge is illustrated. The solar collector 120 with the horizontal energy converter 150 directly under the ridge of the roof 126, multiple sloping reflective sheets 194, 195, & 194a forming a concentrating reflector 110, and vertical directing reflectors 114, are shown. For the purpose of this description, it is assumed that the building 124 is viewed from the direction opposite to solar noon (from the North in northern hemisphere). The three hanging sheets 194, 195, 194a are supported by the leftmost support 196, two elevationally adjustable supports 197, 198 in the middle, and by the rightmost support 196a. In the morning (FIG. 7A) when the radiation 102 enters trough the left transparent section 128 of the roof 126, the sheet supports 197, 198 are elevated such that the concentrating reflector 110 is formed by the left 194 and middle 195 sheet sections. The sheet 194a on the right is kept substantially tight and straight, so that its line of concentration, if any, is practically diffused to the air, far away from the building 124. At solar noon (FIG. 7B), when the radiation 102 enters from directly above, both middle sheet supports 197 and 198 are lowered down, and for a brief moment, the sheets on both sides are tensioned such that the common line of concentration is at the energy converter 150. Alternatively, if this "thermal shock" at noon is not desired, the leftmost sheet 194 can be tightened before the rightmost sheet 194a is loosened. After solar noons the operation is exactly the opposite. The leftmost sheet 194 is kept tight to dispose its line of concentration and the middle 195 and right 194a sheets are used to form the concentrating reflector 110. Another way of viewing this arrangement is to look at it as two distinct concentrating reflectors 110 where the plain reference numerals refer to the left hand components and the reference numerals ending with letters refer to the right hand components. Since the concentrating reflector 110 in this configuration is formed to either side of the building 124, the vertical directing reflectors 114 must also extend all the way to both, the leftmost 196 and the rightmost 196a support points. An implementation of a simpler version of this arrangement, using a single sloping sheet, is now described in detail as one of the main preferred embodiments.

Figure 9:
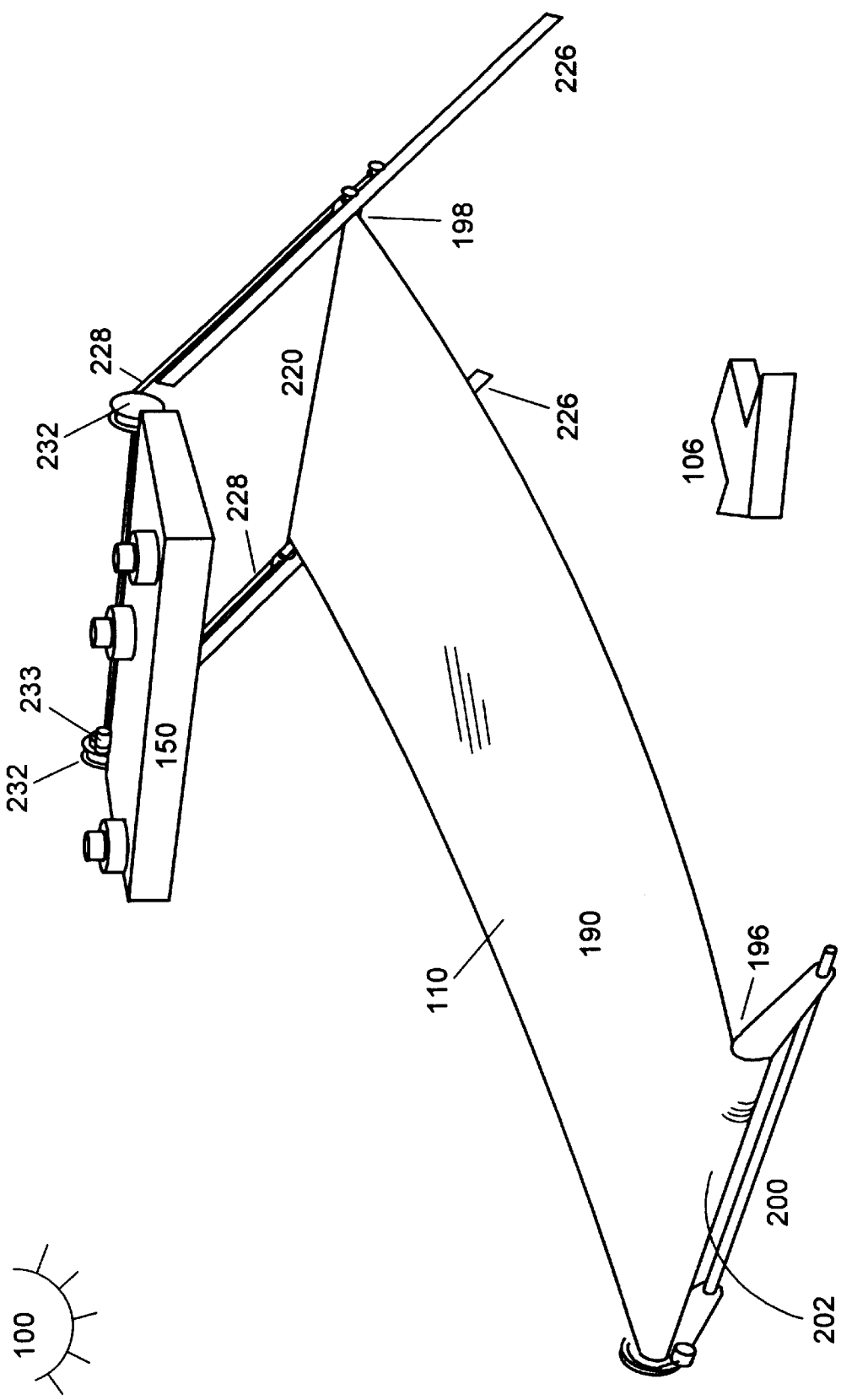
FIG. 9 is a perspective view of a sloping sheet concentrating reflector in an installation oriented towards the direction of solar noon.

Referring to FIGS. 8 and 9, more detailed views of the hanging sheet 190 of concentrating reflector 110 are presented. The arrangement to be described allows for two different installations. FIG. 8 illustrates an orientation independent installation, where the front of the concentrating reflector 110 does not have to face the direction of solar noon. In this form, the collector 120 may be installed its side facing the direction of solar noon, as indicated by an arrow 106. FIG. 9 illustrates an installation where the concentrating reflector 110 faces the direction of solar noon. In an orientation independent installation (FIG. 8), an energy converter 150 is provided with a sloping sheet 190 below the converter 150. The front end of the sheet is attached to a tensioning roll 202 in a tensioning assembly 200, providing a front sheet support 196, the tensioning roll 202 allowing the sheet 190 to be tightened and loosened as described in the foregoing theoretical description. From there, the sheet 190 is fed upwards and backwards over a freely rotating sheet support roll 215 at a front elevator 214, providing a middle sheet support 197, and from the front elevator 214 to a rear elevator 220, providing a rear sheet support 198, where the back end of the sheet 190 is fastened. Both elevators 214,220 are made movable over sloping rails 226, one on each side of the elevator 214,220, such that the front elevator 214 is moved along two rails 226 at the front of the energy converter 150, sloping downwards from the converter 150, and the rear elevator 220 is moved along two rails 226 at the back of the energy converter 150, these rails 226 also sloping down from the energy converter 150. Movement of the front elevator 214 is achieved by a stepper motor 231, which rotates two front elevator lift pulleys 230, to each of which a metal elevator lifting tape 228 from its upper end is attached. Each tape 228 then extends from a pulley 230, downwards to the front elevator 214 where the bottom end of the tape 228 is attached. When the stepper motor 231 is rotated in a first direction, it tightens the tapes 228 and pulls the elevator 214 upwards. When the motor 231 is rotated in a second direction, it loosens the tapes 228 and the elevator 214 is pulled down by its own weight. To move the rear elevator 220, precisely the same arrangement is duplicated at the back of the energy converter 150. The only difference is that the rear elevator stepper motor 233, and the rear elevator lift pulleys 232 are distinguished with their own numerals in this description. In the above organization, when the sun 100 is at the front of the collector 120, the front elevator 214 is moved to, and kept at its lowest position, and the rear elevator 220 is used to adjust the angle of the sheet 190 as needed for maintaining the line of concentration at the converter 150. When the sun 100 is at the back of the collector 120, the rear elevator 220 is kept at its lowest position, and the front elevator 214 is used to set the elevation angle of the sheet 190.

FIG. 9 illustrates an installation where the front of the collector 120 can be oriented towards the direction of solar noon, as depicted by the arrow 106. When the collector is located at mid latitudes, the front elevator 214, the front rails 226, the front elevator lift pulleys 230, and the front elevator stepper motor 231 can be left out. In this arrangement, the front end of the sheet 190 is attached to the sheet tensioning roll 202 in the sheet tensioning assembly 200, and is extended from there directly to the rear elevator 220, to which the back end of the sheet 190 is attached. To set the elevation angle of the sheet 190 such that the line of concentration is kept at the energy converter 150, the rear elevator 220 is moved on its rails 226 by rotating the rear elevator stepper motor 233 which rotates the rear elevator lift pulleys 232, which in turn will pull or loosen the metal elevator lifting tapes 228.

Figure 10:
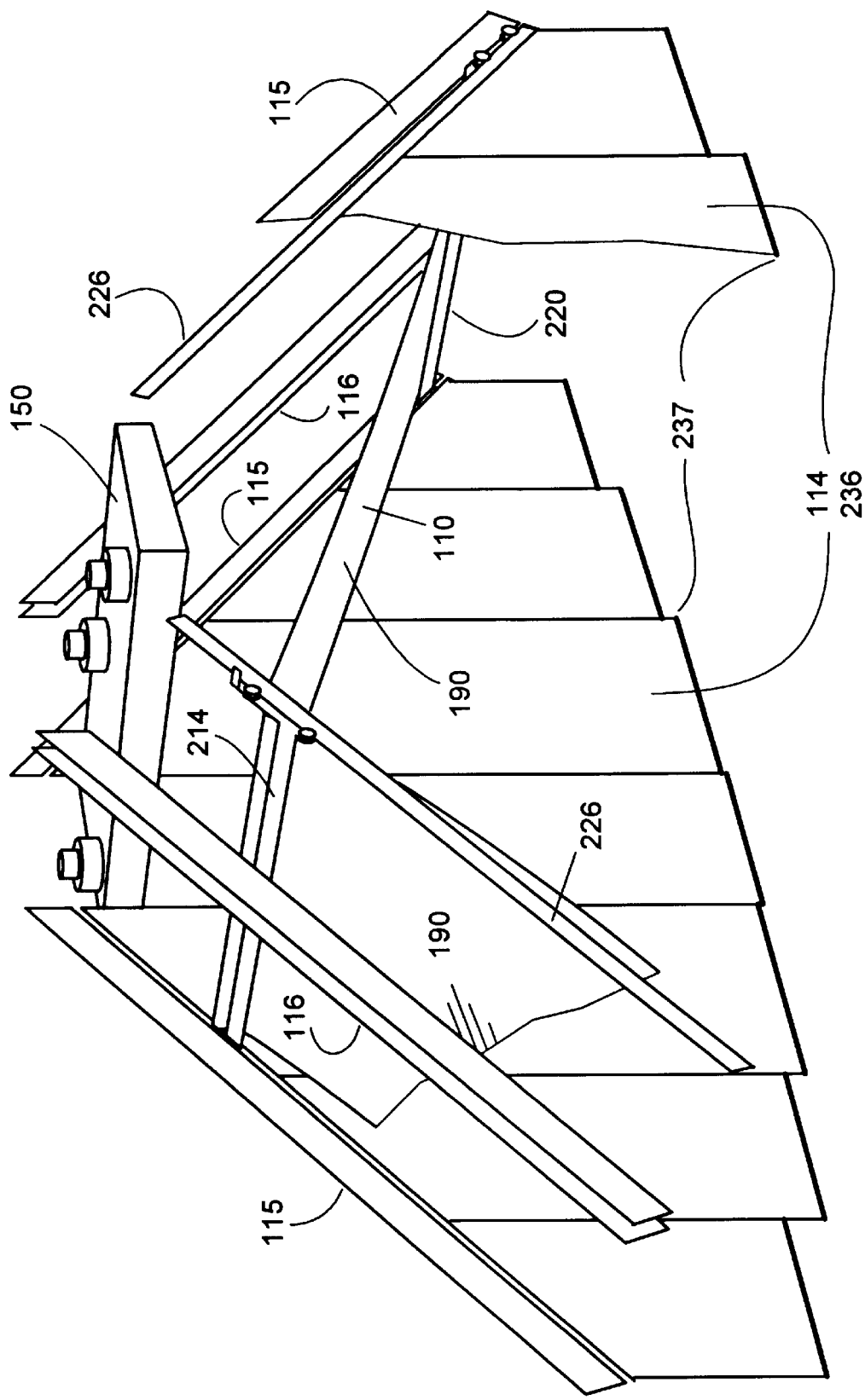
FIG. 10 is a perspective view of an arrangement of directing reflectors made from vertically hanging reflective sheets and used with a sloping sheet concentrating reflector.
Figure 11:
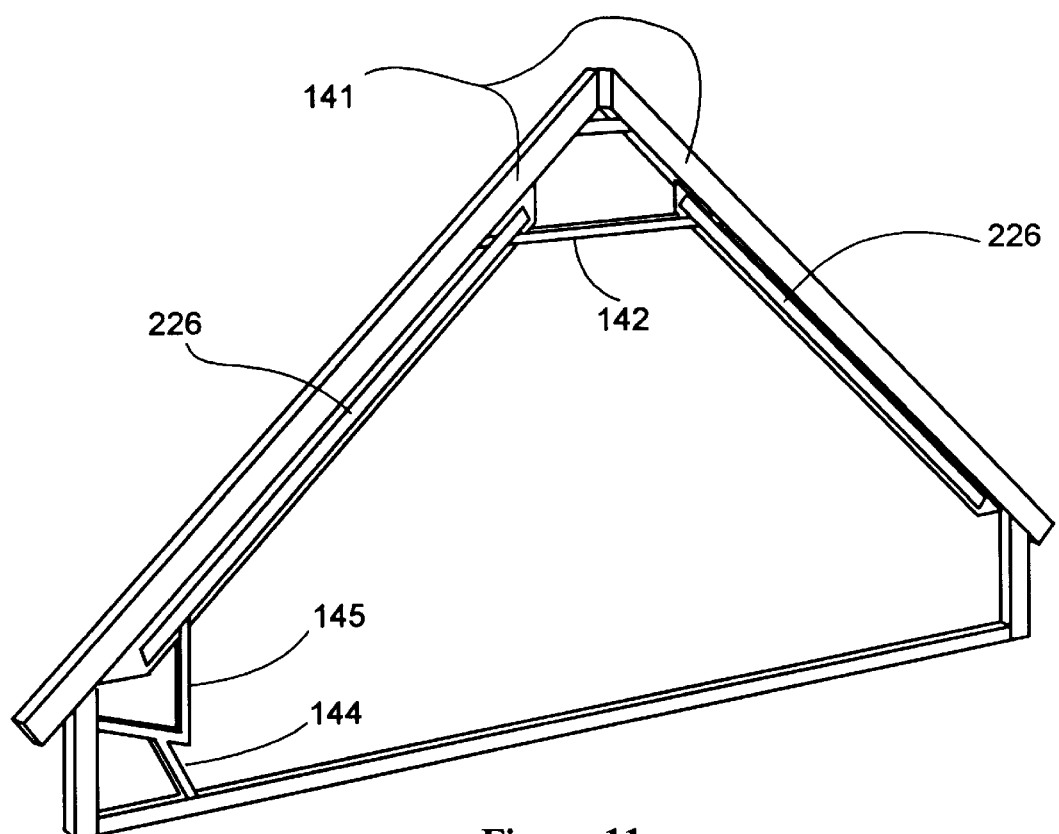
FIG. 11 is a detailed view of self supporting rafters with the support structures for a sloping sheet solar energy collector showing the arrangement of elevator rails, rollers and the support for vertically hanging sheets of a directing reflector.

Now referring to FIGS. 10, and 11 two directing reflectors 114 are provided, mounted along each side of the sloping sheet 190 concentrating reflector 110 and perpendicular to it. The main directing reflectors 114 are extended from below the lowest position of the concentrating reflector 110, to the rails 226 of the elevators 214 and 220 above, passing around the energy converter 150. To keep the sheets 236 stable, sheet weights 237 are attached to their bottom ends. Extensions 115 of the directing reflectors 114 are installed above the rails 226 leaving a small gap for the elevators 214,220 to reach the rails 226. Additional, auxiliary, directing reflectors 116 are provided to cover the sides of the rafters (or other structural members) supporting the transparent cover above. Thus, solar radiation arriving at the sides of the rafters or the support beams above the rails 226 is redirected towards to the concentrating reflector 110. In manufacturing the extensions 115, and auxiliary directing reflectors 116, similar inexpensive reflective sheets are bonded with rigid sheets of some suitable building material (such as gypsum board), and cut to required size and shape, or alternatively reflective metal sheets are used.

FIG. 11 shows self supporting rafters 141, similar to the ones used in a "Tri-Steel Framing System," which are pre-manufactured to provide mounting points for the rails 226, energy converter support 142 for the horizontal energy converter 150 along with the elevator lifting equipment 230 trough 233 (shown in FIG. 10). Tensioning assembly support points 144,145 are for the sheet tensioning assembly 200 (not shown). Since the rafters 141 will have to be manufactured anyway, they can be very economically made to include these additional features.

Figure 12:
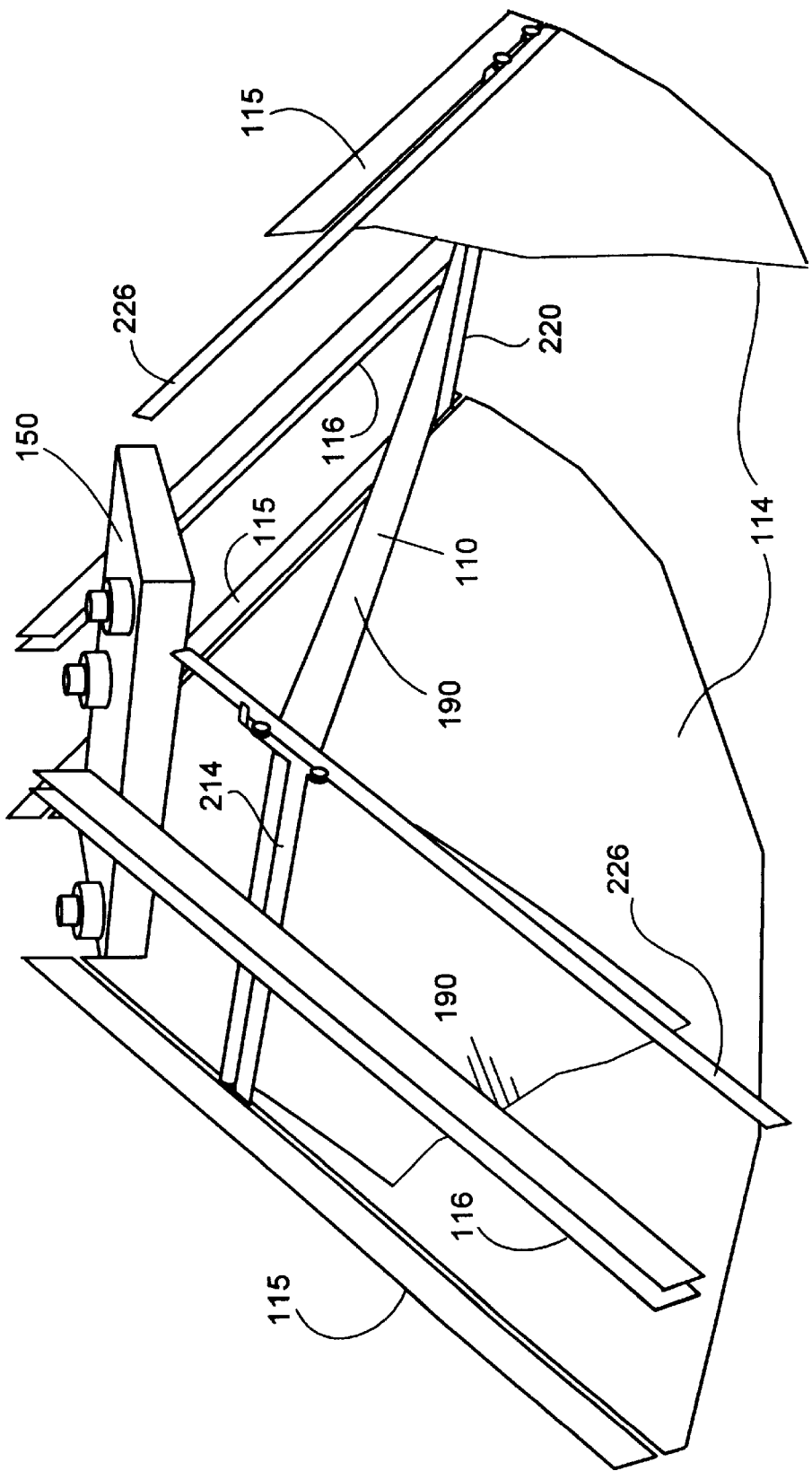
FIG. 12 is a perspective view of an alternative arrangement of a solar collector using rigid directing reflectors and sloping reflective sheet as a concentrating reflector.
Figure 13:
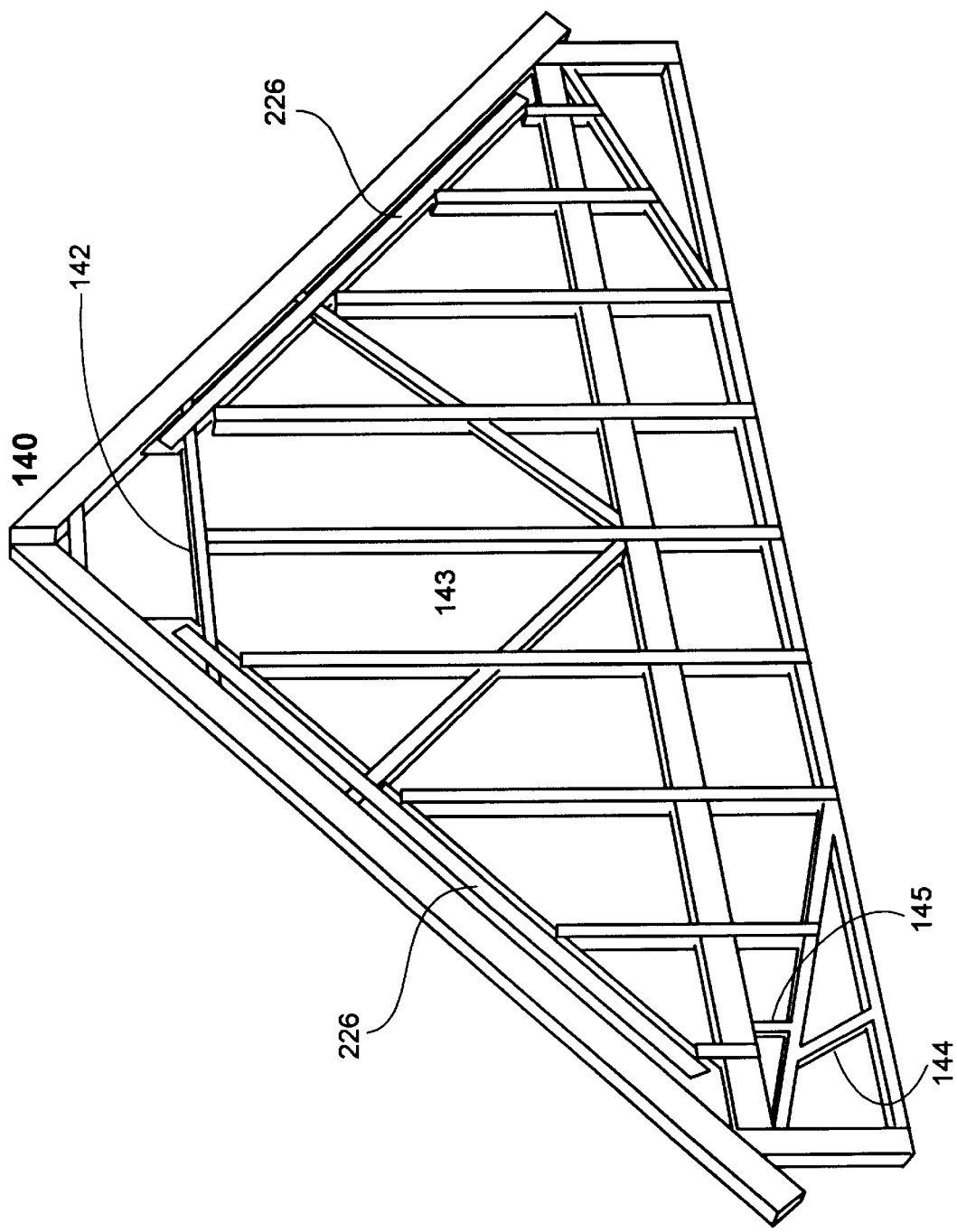
FIG. 13 is a perspective view of a manufactured truss of a building, with the support structures for a hanging sheet solar collector.

FIGS. 12 and 13 illustrate an alternative method of providing the vertical directing reflectors 114. Two rigid directing reflectors 114 are mounted, one along each side of the concentrating reflector 110 and perpendicular to it. As described before, the main directing reflectors 114 are extended from below the lowest position of the concentrating reflector 110, to the rails 226 of the elevators 214,220 above, passing around the energy converter 150. Extensions 115 of the directing reflectors 114 are installed above the rails 226 leaving a small gap for the elevators 214,220 to reach the rails 226. Additional directing reflectors 116 are provided to cover the sides of the rafters (or other structural members) supporting the transparent cover above. Thus, solar radiation arriving at the sides of the rafters or the support beams above the rails 226 is redirected towards the concentrating reflector 110. As with the sloping sheets 190, similar inexpensive reflective sheets are bonded with the rigid sheets, made of some suitable building material, such as gypsum board, and cut to the required size and shape. A pre-manufactured truss 140, suitable for the installation of the collector equipment including the rigid directing reflectors 114 is shown in FIG. 13. In it, the rails 226 for the elevators 214,220 are provided. An installation support 142 for the energy converter 150 and for the elevator lift components 230 trough 233 (not shown) are provided at the top. Two tensioning assembly support positions 144,145 are formed on one side of the truss 140 to facilitate the installation of the sheet tensioning assembly 200 (not shown). The use of the two positions 144,145 will be described later. Vertical reflector support studs 143 are formed at regular intervals for the installation of the rigid directing reflectors 114.

Figure 14A:
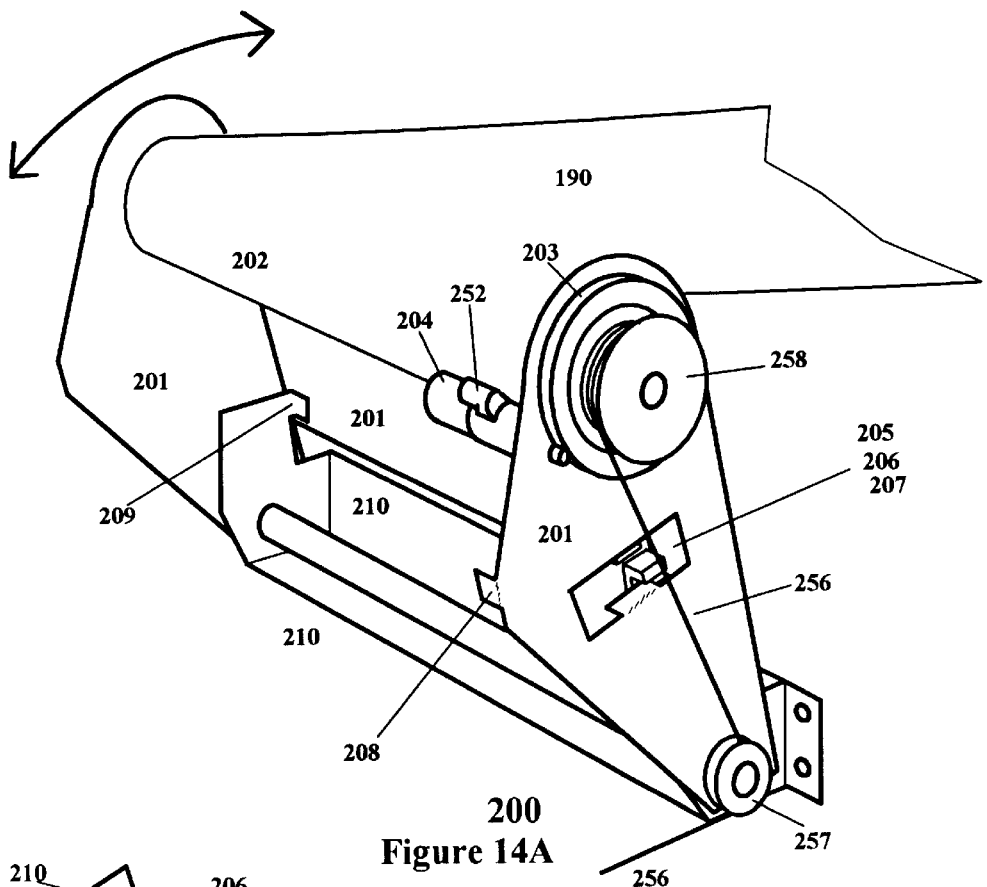
FIGS. 14A & 14B are perspective views of a sheet tensioning assembly and its detail.
Figure 14B:
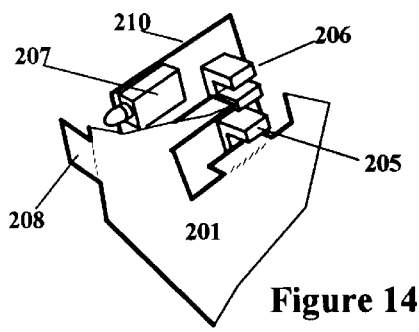
Figure 14C:
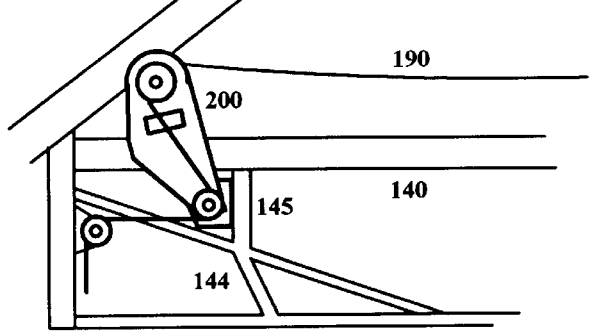
FIG. 14C is a side view of an installation of a sheet tensioning assembly.

FIGS. 14A, 14B & 14C illustrate the sheet tensioning assembly 200. The front end of the sloping sheet 190 is attached to the rotating tensioning roll 202, which is rotated by the tensioning gear set 203, which in turn is rotated by a stepper motor 204. Between the stepper motor 204 and the gear set 203 is a safety clutch 252 capable of disconnecting the stepper motor 204 from the gear set 203. The sheet tensioning roll 202, the gear set 203, and the stepper motor 204 are supported by a tilting yoke 201. During normal operation, the yoke 201 rests against the normal rest stopper 209 on a mounting chassis 210, pulled by its own weight and by the weight of the devices mounted on it. When the sheet 190 is pulled tight, so that it is practically straight, the yoke 201 will start moving away from the normal rest stopper 209. This movement will first activate a tension switch one 205, and if the movement continues, then activate a tension switch two 206, and finally an over tension stopper 208 will push the over tension switch 207, activating it. The above switches are all mounted on the stationary mounting chassis 210. On an orientation independent (FIG. 14C) installation, with the front elevator 214 (not shown) installed, the sheet tensioning assembly 200 is mounted on a first support position 144 provided in the pre-manufactured truss 140 or rafter arrangement. On an installation facing the direction of the solar noon, the front elevator 214 (not shown) is left out, and the sheet tensioning assembly 200 is mounted on a second support position 145. The described arrangement allows a micro processor 300 (described later) to control the tensioning of the sheet 190.

As part of a safety system, a safety tensioning pulley 258 is mounted at the end of the tensioning roll 202, next to the tensioning gear set 203. A safety cable 256 is attached to the safety tensioning pulley 258, treaded around guiding pulleys 257 to a suitable location where it can hang downwards, pulled by a weight attached to its other end. This arrangement is designed such that the safety clutch 252 is normally engaged, and that the detent force of the stepper motor 204 is stronger than the angular force produced by the weight pulling the safety cable 256. This keeps the sheet 190 in its position even when no current is applied to the motor 204. When the safety system "trips," the safety clutch 252 becomes disengaged, and the sheet 190 is pulled straight by the safety cable 256. The other operations of the safety system and the clutch 252 will be described in detail, later in this description. Also, programming of the micro processor 300 for sheet tensioning and positioning will be described later.

It should be understood, that this arrangement of sheet 190 tensioning is merely an example, and may be modified in many ways. For example, instead of using switches to detect the movement of the yoke 201, a single pressure sensor, similar to those in electronic scales, could be used. Alternatively, a tensioning roll 202 with an internal torque measurement device could also be used. Similarly, safety tensioning of the sheet 190 could be accomplished with a long coil spring, or the like.

Figure 15:
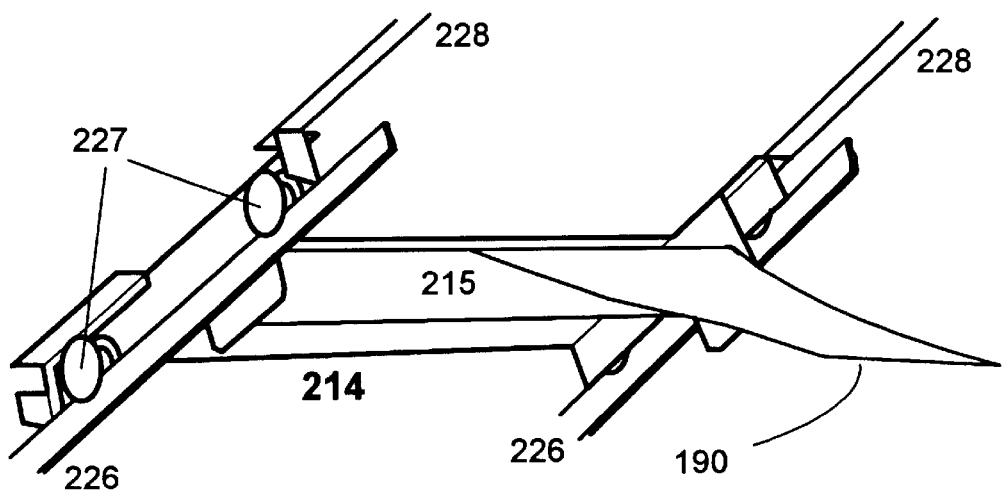
FIG. 15 is a perspective view of a front elevator for an orientation independent installation of a reflective sloping sheet.
Figure 16A:
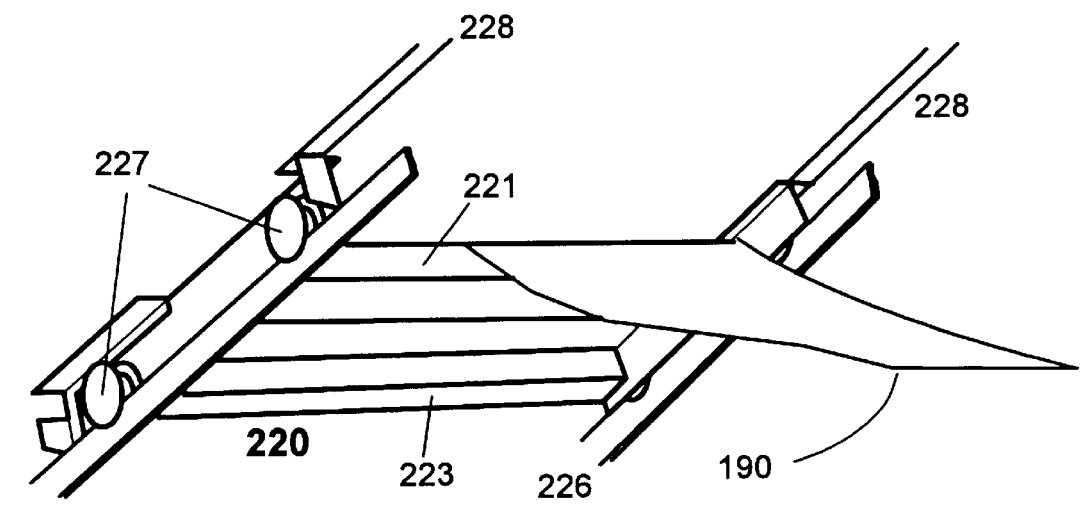
FIG. 16A is a perspective view of a rear elevator for a sloping reflective sheet.

FIGS. 15 and 16A show more detailed views of the front 214 and rear elevators 220. Each elevator has four wheels 227, or rollers, allowing it to slide easily up and down on the two rails 226. A rotating sheet support roll 215 is carried under the front elevator 214, such that the sheet 190 can rest over on top of the roll 215. Depending on the elasticity of the sheet 190 used, the roller 215 may be made slightly thicker from the middle. This will help to center the sheet 190, when it is moved over the roll 215. The elevators 214,220 are moved up by pulling the metal elevator lifting tapes 228 which are attached to the top corners of the elevators 214,220, above the rails 226. The elevators 214,220 move down pulled by their own weight when the tapes 228 are loosened from the pulleys 230,231 (not shown). The rear elevator 220 includes a rear elevator weight 223 to make it heavy enough to pull downwards with enough force, such that the yoke 201 of the sheet tensioning assembly 200 is tilted backwards when the sheet is allowed to tighten enough (shown in FIG. 14A).

Figure 16B:
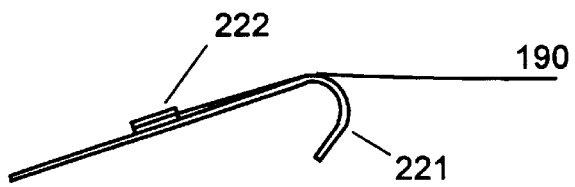
FIG. 16B is a side view of a sheet support bar in a rear elevator.

The rear elevator 220 carries a sheet support bar 221, shown in FIG. 16B, with a sheet end clamp 222, to which the rear end of the sheet 190 is attached.

Figure 17A:
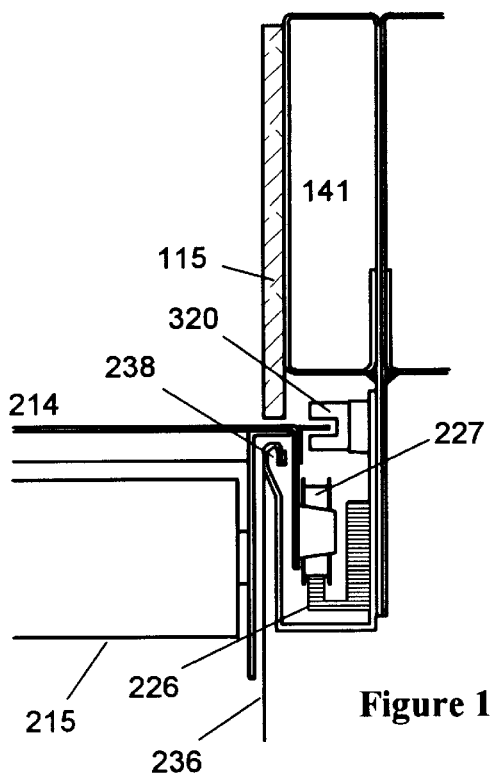
FIGS. 17A & 17B are cross sectional details showing the elevator rail and roller arrangement used with a premanufactured truss and rigid directing reflectors.
Figure 17B:
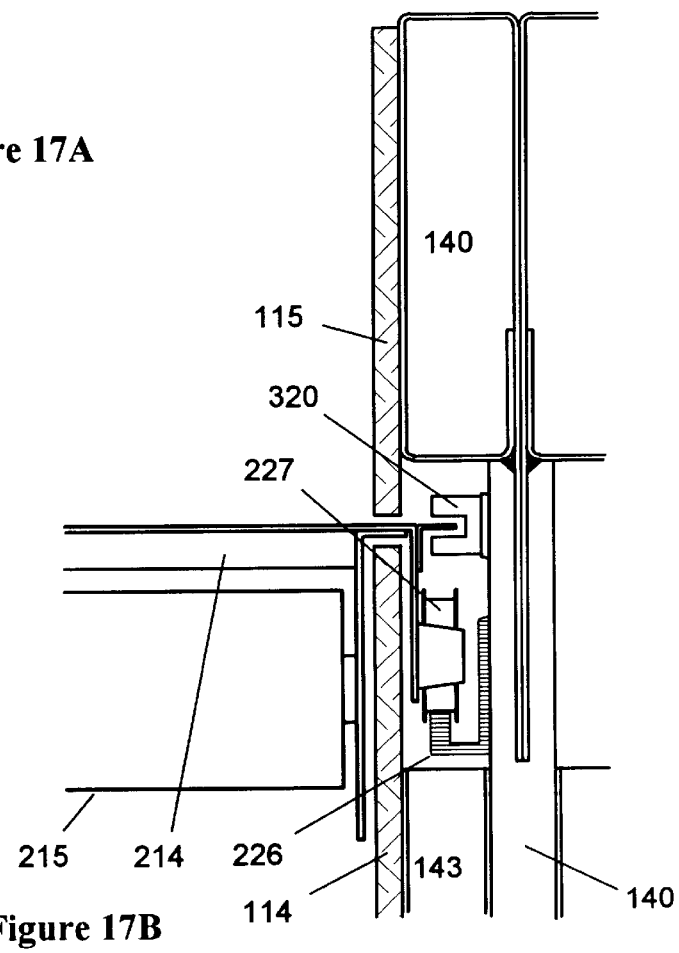

FIGS. 17A and 17B show a cross sectional detail of an elevator 214 and a rail 226 arrangement. The rail 226 is attached either to the members of a truss 140 or to a self supporting rafter 141. In the preferred version the vertically hanging sheets 236 of the directing reflector 114 are supported by the supporting clamps 238. In the alternative version (FIG. 17B) the directing reflector 114 support studs 143 are provided. The rigid directing reflector 114 is mounted on these studs 143. The extension 115 of the directing reflector is mounted above the rail 226, leaving a small gap in between. The elevator 214 forms a thin section extending through the gap between the reflectors 114,115, to outside the reflectors 114,115, where the wheels 227 rest on a rail 226. Both, the front elevator 214 and the rear elevators 220 (not shown) have this same arrangement.

Figure 18:
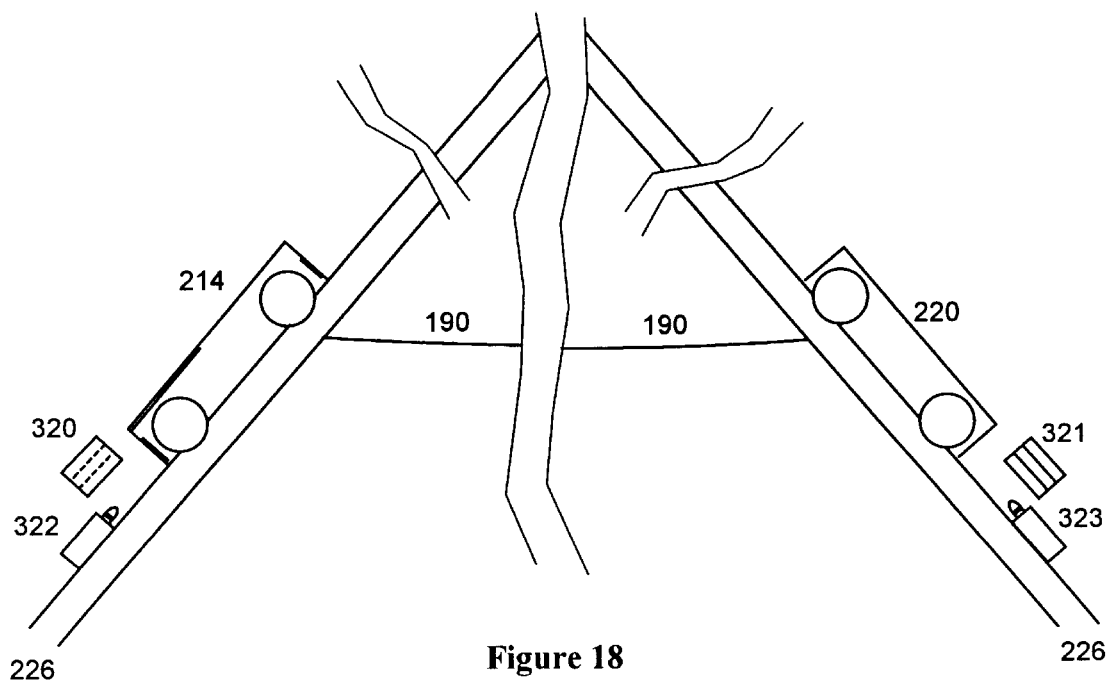
FIGS. 18 & 19 are side views of arrangements of electronic detector components used in controlling the positioning of a sloping reflective sheet.
Figure 19:
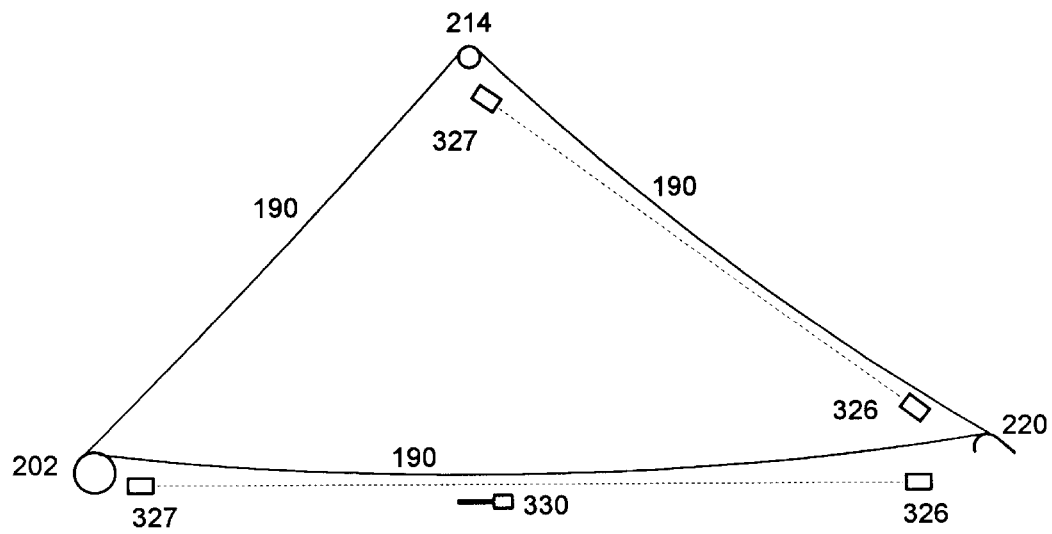

A few more switches and detectors are used for complete positioning of the sheet 190. FIGS. 18 and 19 depict these switches and detectors. To calibrate the position of the elevators 214, 220, vain switches 320, 321, called elevator calibration switches, are installed at the bottom end of the rails 226. These are used as elevator calibration sensors and are used for accurate detection of the home position of the elevators 214 and 220. The front elevator calibration sensor 320 is used at or near the bottom end of the front rails 226. Equally, the rear elevator calibration sensor 321 is used at or near the bottom end of the back rails 226. To prevent the elevators 214 and 220 to be driven down out of the rails 226, limit switches 322 and 323 are installed below the elevator calibration sensors 320 and 321, such that if the front elevator 214 is driven down past the front elevator calibration sensor 320, the front elevator limit switch 322 is activated. Similarly, if the rear elevator 220 is driven down past the rear elevator calibration sensor 321, the rear elevator limit switch 323 is activated.

To allow for accurate calibration of the slope of the sheet 190, an infrared transmitter 327 and infrared receiver 326 pair is provided under the sheet 190. This transmitter 327 receiver 326 pair is positioned such that the infrared beam crosses the path of the sheet 190 diagonally, from one side to the other. When the sheet 190 is lowered to a predetermined position, it breaks the infrared beam, thus giving an accurate indication of the position of the sheet 190. To guarantee a good calibration reading, the installation of the transmitter 327 receiver 326 pair is also dependent on whether the front elevator 214 is installed or not. When the front elevator 214 is installed, the transmitter 327 receiver 326 pair is mounted such that the calibration reading is taken when the front elevator 214 is at its topmost position, and the sheet 190 at its most extended position. Regardless of the type of installation, the calibration is always done with the rear elevator 220 at its bottom most position (at the rear elevator calibration sensor 321). This arrangement allows the sheet length calibration to be done when most of the sheet 190, is dispensed out from the sheet tensioning roll 202. To compensate for thermal expansion of the sheet 190, the ambient temperature at the vicinity of the sheet 190 is measured with a temperature sensor 330.

Figure 20A:
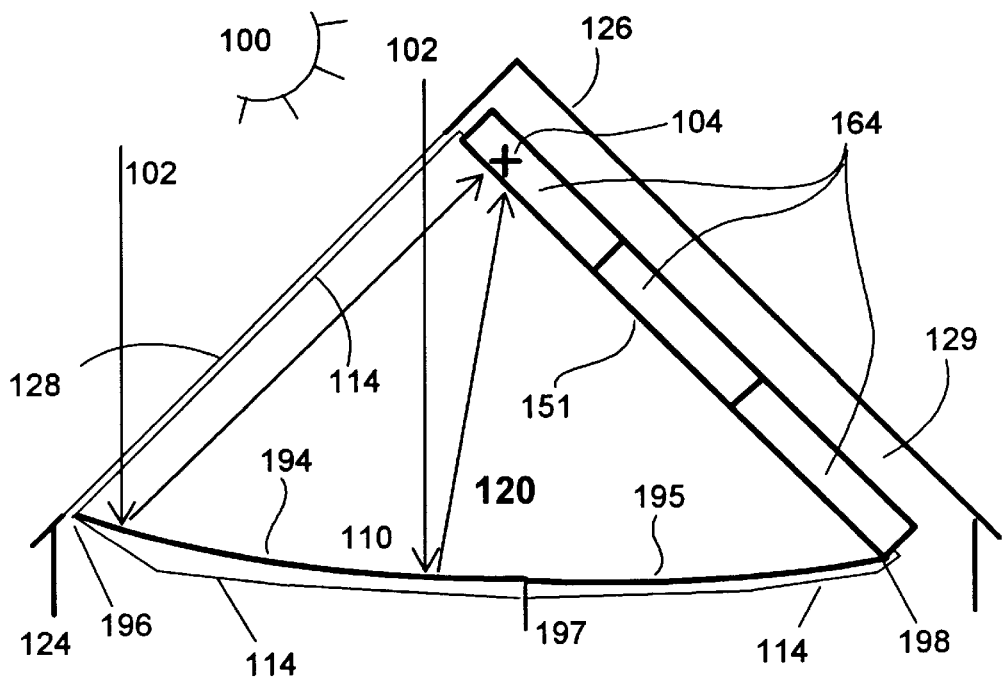
FIGS. 20A, 20B & 20C are diagrammatic side views of a collector using a fixed sloping sheet concentrating reflector and a multiple section thermal only energy converter arranged as a matrix.
Figure 20B:
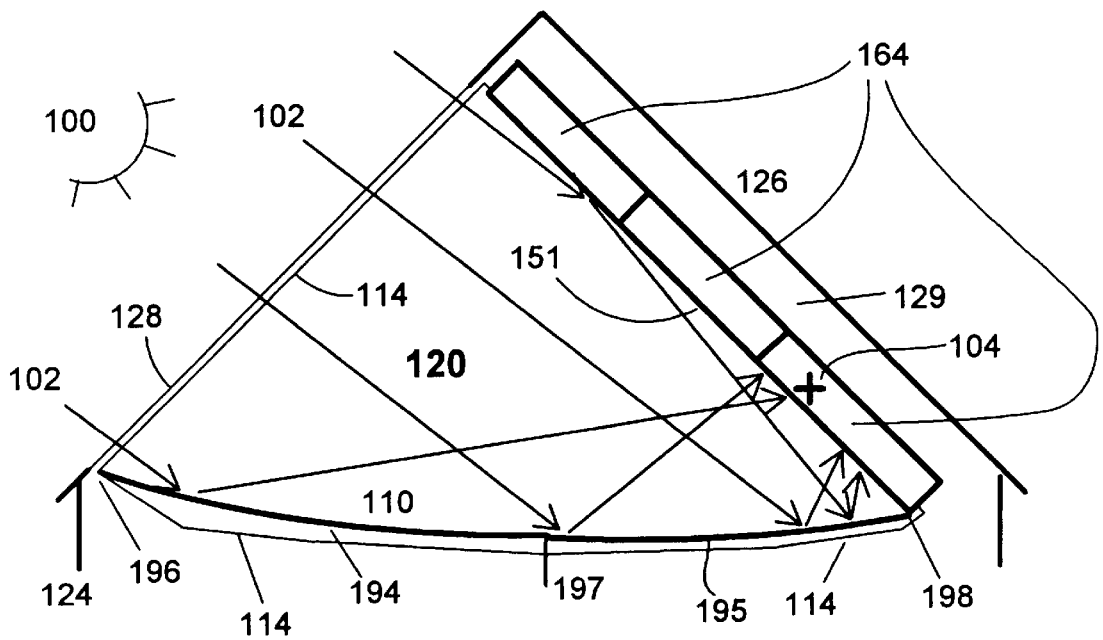
Figure 20C:
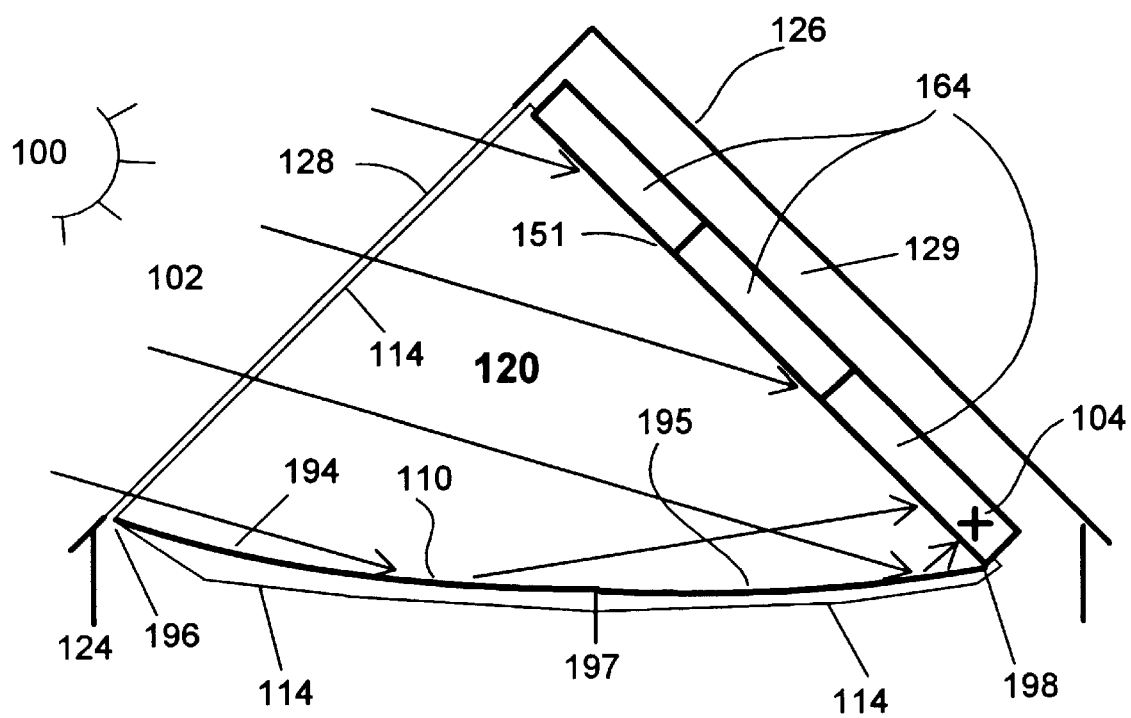

For the collector versions with stationary concentrating reflectors FIGS. 20A, 20B & 20C are now referred to. A concept of a collector with concentrating reflector 110 fixed at a permanent position with no means for significantly adjusting them, and an optimizing sloping energy converter 151 with multiple heat chambers 164 is shown. The collector equipment is installed in an attic of a building 124 having a sloping roof 126 with a ridge. The roof 126 is sloping from the ridge, down to two opposite sides of the building 124. The section of the roof 128 facing the sun, on the front side of the building 124, is made with glass panels, and the section on the opposite side, the back side, is made with standard roofing material. The energy converter 151 is placed under the roof section with standard roofing material, also sloping, parallel to the sloping roof 126, leaving a crawl space 129 in between the two.

The concentrating reflector 110, fixed at a stationary position, is constructed to concentrate radiation from the sun 100 along a substantially narrow and straight line of concentration 104 that is moving, dictated by the movement of the sun 100. An axis of the concentrating reflector 110 is parallel to the moving line of concentration 104. The concentrating reflector 110 is made from highly reflective flexible sheet material, hanging and sloping substantially horizontally in the air, and forming a catenary curve, its reflective side facing upwards. The arc of the concentrating reflector is comprised of two sheets 194,195, made from this material. The first sheet 194 extends from the front side of the building 124, from a front sheet support 196, to a middle sheet support 197, approximately in the middle of the building 124. The second sheet 195 extends from the middle sheet support 197, to the rear sheet support 198, at the back of a building 124.

Two vertical directing reflectors 114 are provided, one on each side of the concentrating reflector 110. These are made and installed using materials and methods as described before, and are vertically extended to cover the entire triangular area between the energy converter 151, the concentrating reflector 110, and the glass panels of the transparent section 128 of the roof 126.

When the sun 100 is at a very high relative elevation (FIG. 20A), above the building 124, the radiation 102 is concentrated at the uppermost heat chamber 164 of the energy converter 151. Depending on how the first sheet 194 is tensioned, the line of concentration 104 at the upper most heat chamber 164 can be made very narrow and sharp. When the sun 100 moves to lower relative elevations (FIGS. 20B & 20C), the line of concentration 104 moves downwards at the sloping energy converter 151. It also gets wider. At a relative elevation angle just below the angle of the back section of the roof 126 (and the energy converter 151), a portion of the incoming radiation 102 is reflected from the energy converter 151. With a proper setting of the angle and tension of the second sheet 195, this stray radiation is bounced back to the energy converter 151 with more favorable incident angle. At very low elevation angle, a large portion of the incoming radiation 102 will enter the energy converter 151 directly, and only a small portion is concentrated at the lowermost conversion element 153. Although the shown energy converter 151 resembles a flat panel collector, two major differences exist. The radiation 102 accepting side of the converter 151, in this arrangement, faces generally downwards, giving tremendous advantage in better thermal insulation properties. Further more, the use of multiple heat chambers 164 allows the conversion process to be optimized by controlling the heat chambers 164 individually. The conversion process with its optimization will be described in more detail with the description of energy converters 150, 151, & 152 below. This arrangement is advantageous, particularly for thermal energy collection in locations with high yearly temperature fluctuations. During the summer months, when the sun is at high relative elevations, very high temperatures are generated, providing for efficient cooling equipment use. During the winter months, the total collector area against incoming solar radiation 102 is at its largest, making the best out of available radiation 102, including diffused radiation 102. Although not as high temperatures as during the summer can be achieved, still high enough temperatures for energy storing and space heating purposes are generated.

Figure 21A:
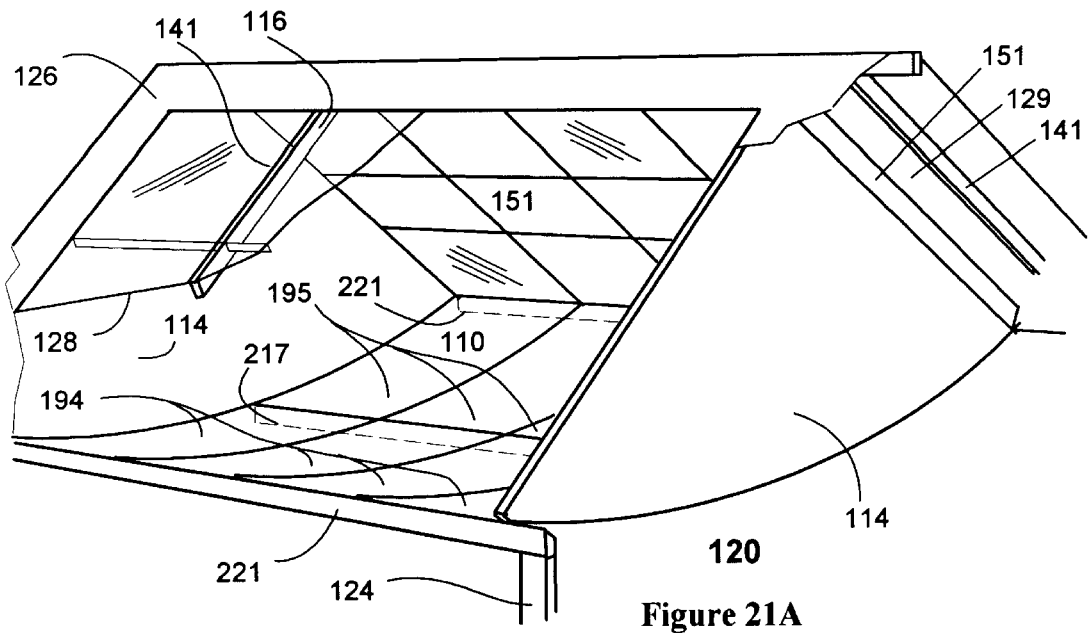
FIG. 21A is a perspective front view of a collector using fixed sloping sheet concentrating reflectors and multiple section thermal only energy converters arranged as a matrix.

FIGS. 21A, 21B and 22 through 23C show implementation details of a collector 120 and its reflectors 110 and 114. The sheet arrangement of the concentrating reflector 110 is shown in FIG. 21A. The concentrating reflector 110 is formed from the mentioned sloping sheets, such that the first set of sheets 194 is used in the front side of the building 124. A front end of each sheet 194 is attached to a sheet support bar 221 which runs along the front side of the building 124. Sheet 194 runs to a middle sheet support assembly 217. This middle sheet support assembly 217 is placed significantly below the front sheet support bar 221, in order to allow the sheets 194 to slope downward and inwards into the building 124. A second set of sheets 195 is used at the back side of the building 124, with a front end of each sheet 195 attached to the middle sheet support assembly 217, extending from there to a similar sheet support bar 221 at the back side of the building 124, just below the bottom most side of the energy converter 151.

Figure 21B:
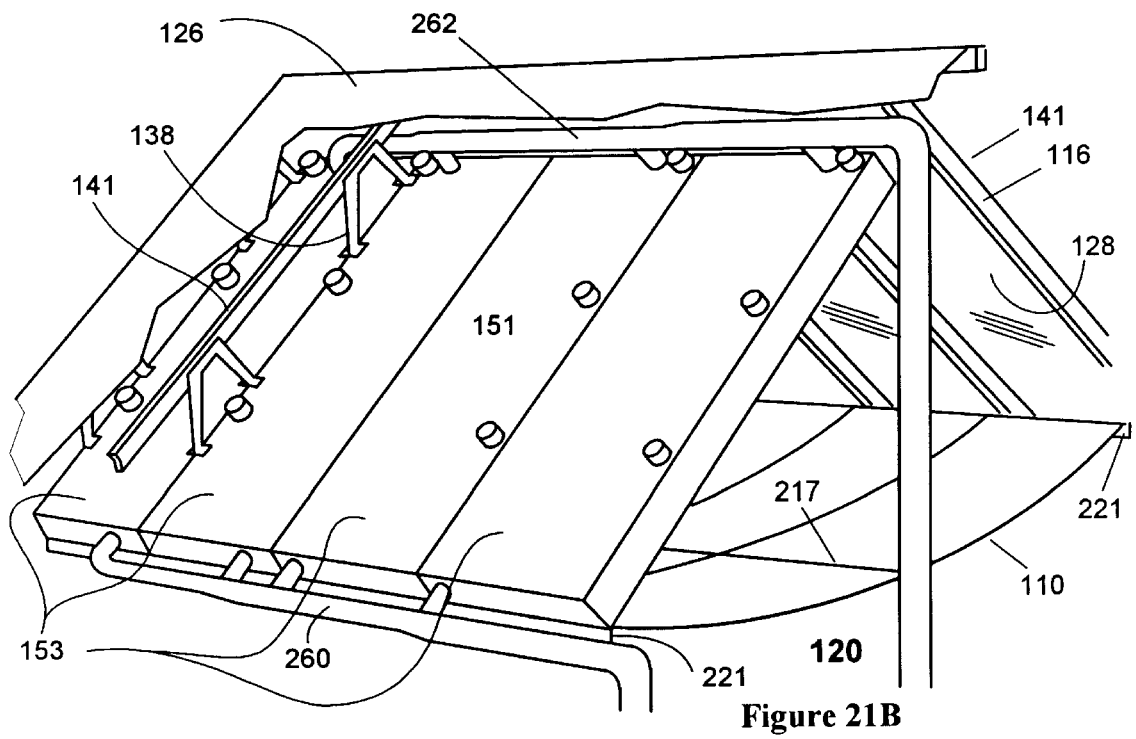
FIG. 21B is a perspective rear view of a collector using fixed sloping sheet concentrating reflectors and multiple section thermal only energy converters arranged as a matrix.

Vertical auxiliary directing reflectors 116 are mounted on and along each side of the rafters 141, perpendicular to the line of concentration 104 (not shown), on the front side of the building 124, above the concentrating reflector 110, such that the solar radiation arriving at sideways angles, striking the auxiliary directing reflectors 116 is directed down towards to the concentrating reflector 110, and from there to the line of concentration 104 (not shown). FIG. 21A also shows the energy converter 151 installed under the roof 126, leaving a crawl space 129 in between the roof 126 and the converter 151. FIG. 21B shows another installation of the non-tracking collector 120.

The energy converter 151 is assembled from multiple conversion elements 153, which contain the heat chambers 164 (not shown) inside. The conversion elements 153 of the sloping converter 151 are supported from self supporting rafters 141 with support arms 138 mounted to the rafters 141. In another version, shown in FIG. 22, the conversion elements 153 of the converter 151 are made to form large roofing components, and the energy converter 151 is thus integrated with the roof 126. More on this arrangement will follow with the description of the energy converters 150,151 & 152.

Figure 23A:
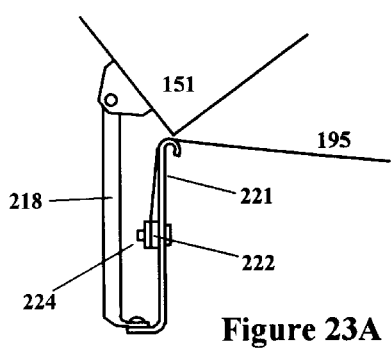
FIGS. 23A, 23B & 23C are detailed views showing the support devices for the fixed sloping sheets.
Figure 23C:
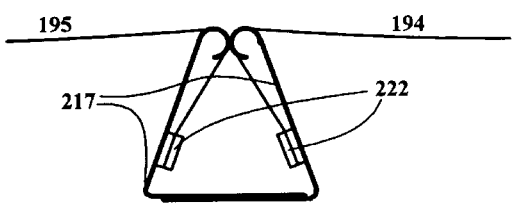
Figure 23B:
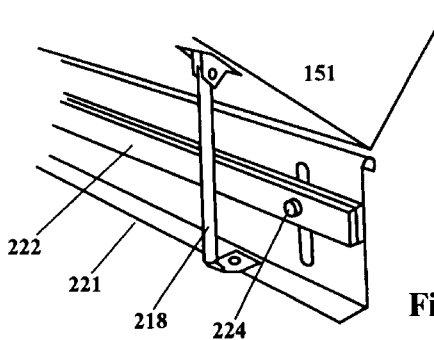

Referring to FIGS. 23A, 23B & 23C, the detailson the installation of the hanging sheets are shown. For proper shape and measurements, the sheets 194,195 are factory prepared with sheet end clamps 222 at the ends before shipping to the building site. The sheet support bars 221 near the walls are provided with mounting rods 218, which are mounted, either to the rafters (not shown), or to the energy converter 151. The sheet end clamp 222 is attached to the support bar 221 with locking screws 224, allowing slight adjustment in the tensioning of the sheets 194,195. The sheet end clams 222 at the ends of the sheets 194,195 in the middle of the building are mounted to a middle sheet support assembly 217, and have no adjustments.

Figure 24A:
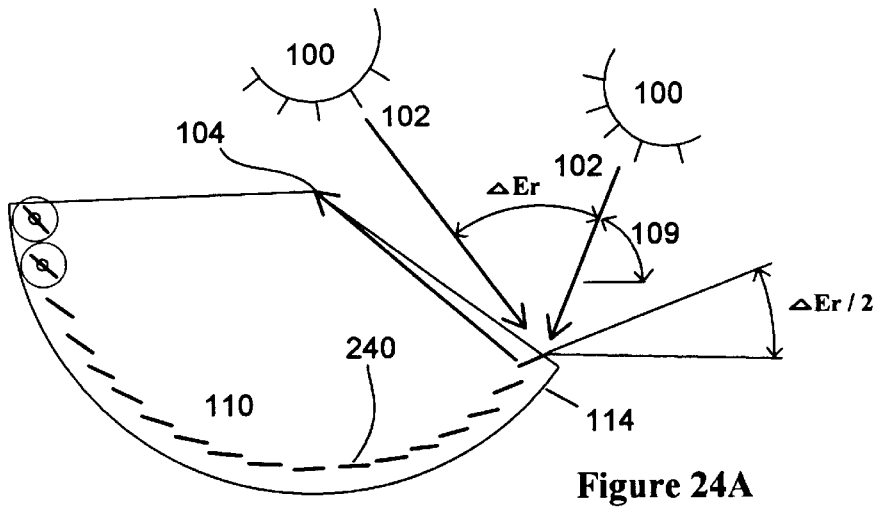
FIGS. 24A, 24B, 24C & 24D are diagrammatic side views of a collector using reflective strips for a concentrating reflector and illustrates the theoretical aspects of it.
Figure 24B:
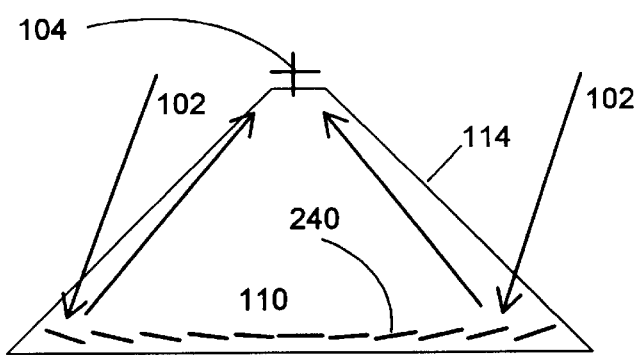

FIGS. 24A and 24B illustrate the use of multiple reflective strips 240 for the concentrating, main reflector 110. In FIG. 24A, the strips 240 are organized as a section of a circle. In FIG. 24B, the strips 240 are positioned along a straight line. The directing reflectors 114 are provided at the ends of the strips 240, and are extended towards to the line of concentration 104. The strips 240 are set up at an angle, such that the solar radiation 102 from the sun 100 striking each strip 240 is reflected to the common line of concentration 104, either directly, or by another reflection from the directing reflector 114. When the relative elevation 109 changes, the adjustment in order to keep the line of concentration 104 in its place is made by rotating the strips 240 to the direction of the change. According to the principles of optical reflection, the amount of rotation is exactly one half of the change in the relative elevation 109 angle. Because the amount of rotation is the same for each strip 240, the rotation can be accomplished by a simple mechanical linkage, or by a set of gears, driven by a motor. For maximum concentration, the strips 240 are curved similar to a parabolic reflector, thus producing a narrow line of concentration 104. The strips 240 can also be left straight, although with reduced maximum concentration.

Figure 24C:
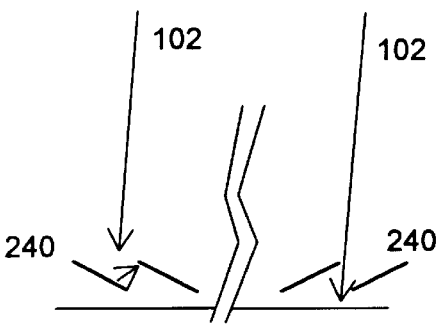
Figure 24D:
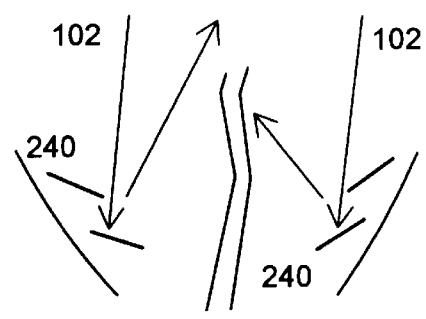

The difference between the strips 240 in the circle formation (FIG. 24A) and the strips 240 in the straight line formation (FIG. 24B) is that the optical losses are smaller when the strips 240 are positioned along a circle. This is depicted in FIGS. 24C and 24D. When the strips 240 are positioned along a straight line, some of the solar radiation 102 entering at certain angles will either reflect back and strike the adjacent strip 240, or fall between the strips. When the strips 240 are placed along a circle, these losses are eliminated.

Figure 25:
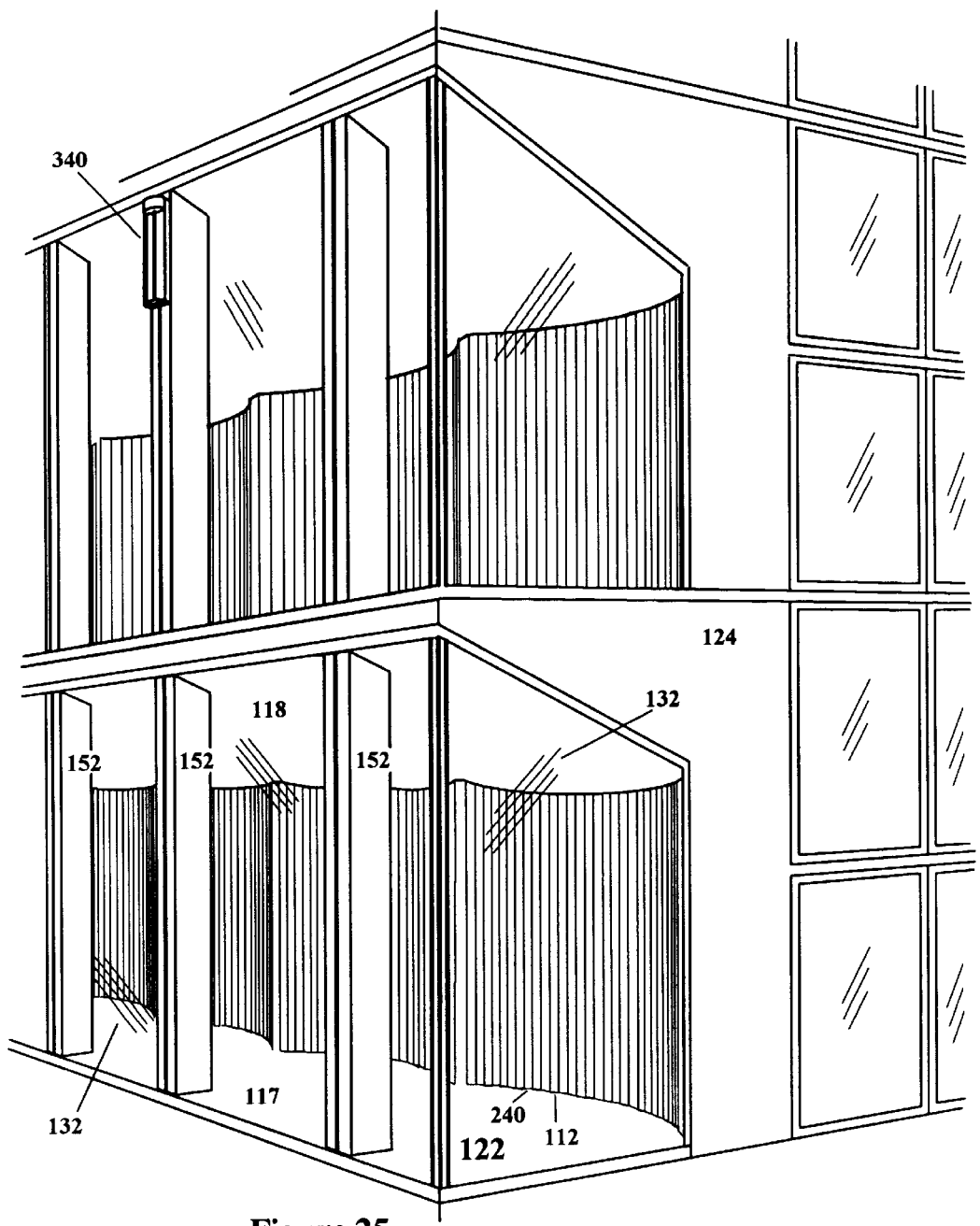
FIG. 25 is a perspective illustration of multiple vertical reflective strip collectors installed in a tall building.

Referring to FIGS. 1 and 25, an arrangement of a reflective strip 240 concentrating reflector 112 utilized in a vertical directing and concentrating solar energy collector 122 is now described as one of the main preferred embodiments. An array of vertical directing and concentrating solar collectors 122 according to the present invention are shown. To get most of the winter time low solar elevation and low radiation levels, the illustrated arrangement is utilized. When the sun is at its lowest, the performance of the horizontal collectors 120 is somewhat reduced and is supplemented with the vertical collectors 122 (FIG. 1). In a tall building, where no significant roof area is available for installation of solar collectors, multiple vertical collectors 122 are installed along a wall, as depicted in FIG. 25.

Figure 26:
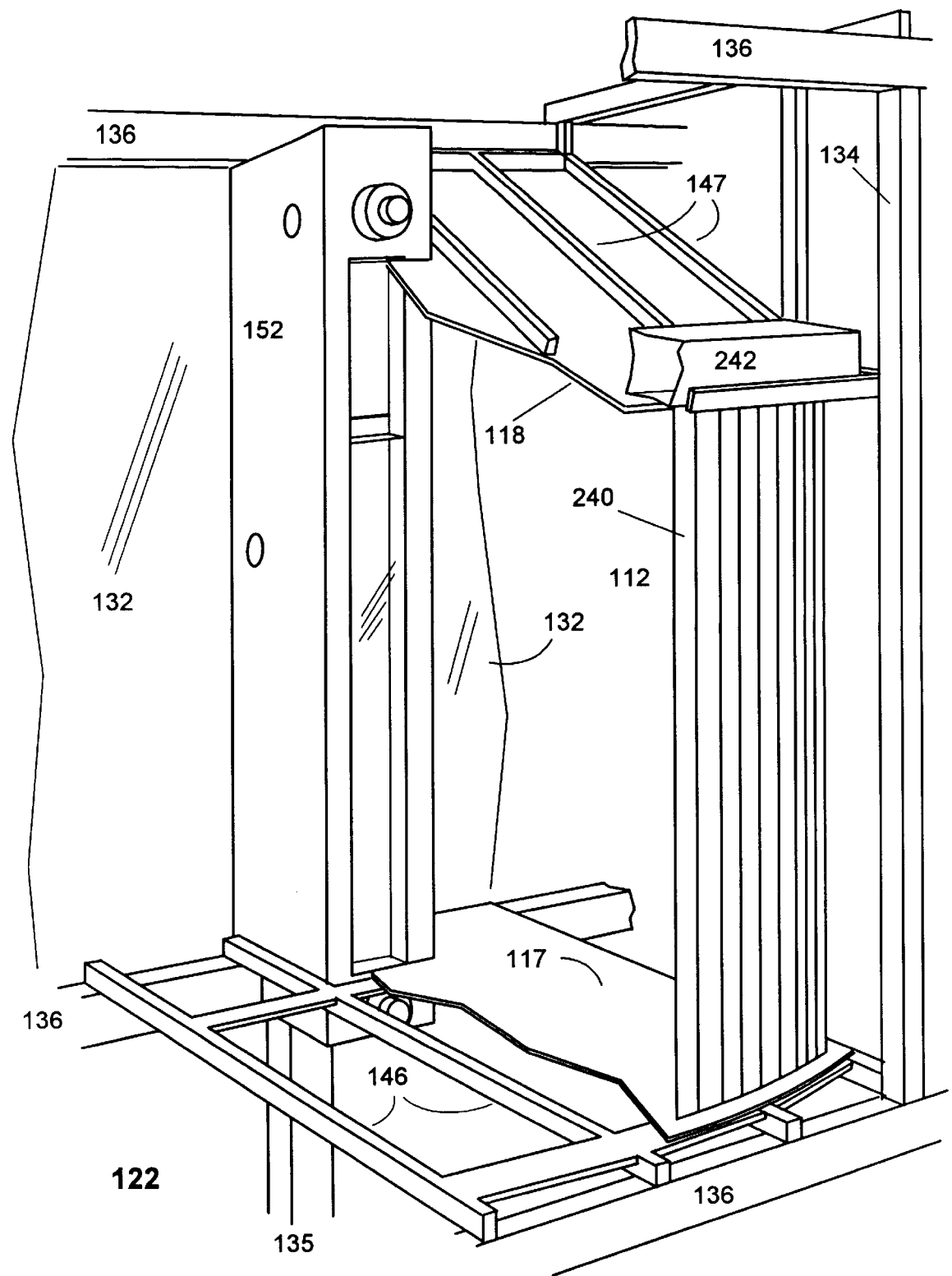
FIG. 26 is a perspective view of a vertical reflective strip collector showing its main components as installed in a building.

Referring to FIG. 26, a more detailed description of the installation of the vertical collector is shown. In a vertical directing and concentrating solar energy collector 122, installed inside a transparent protective wall 132, vertical highly reflective strips 240 are provided around a vertical energy converter 152, in the formation of a section of a circle, producing a concentrating reflector 112. The strips 240 are slightly curved along their vertical axis such that they form a small section of a cylindrical reflector and are provided with a rotating mechanism 242. This arrangement resembles vertical blinds hung to form a section of a circle. The alignment of the strips 240 is pre-calibrated such that for a given direction of incoming solar radiation, the radiation reflected from each strip 240 is directed to a common vertical line of concentration, which is located at the focal point of the formed section of a circle. Thus, when the angle of the incoming solar radiation changes with the change in the sun's azimuth angle, all strips 240 are easily rotated to keep the common line of concentration in the center of the circle.

To achieve maximum concentration when the sun is at a low elevation angle, and to prevent loss of solar radiation when the sun is at a higher elevation angle, two specially aligned directing reflectors 117, 118 are provided. A lower horizontally placed directing reflector 117 is located just below the concentrating reflector 112 and is extended from under the strips 240, past the energy converter 152, to the outside edges of the converter 152, where the transparent protective sheets 132 (FIG. 25)are installed. An upper, upwards tilted, directing reflector 118 extends from near the upper end of the strips 240 of the concentrating reflector 112, past the converter 152. The tilting angle of the upper directing reflector 118 is selected such that a maximum solar radiation reflector area is obtained without losing solar radiation at low elevation angles due to a portion of that radiation not reaching the concentrating main reflector 112. The reflectors 117 and 118 are manufactured by bonding an inexpensive reflective sheet (such as Mylar) with a rigid sheet of building material.

Figure 27:
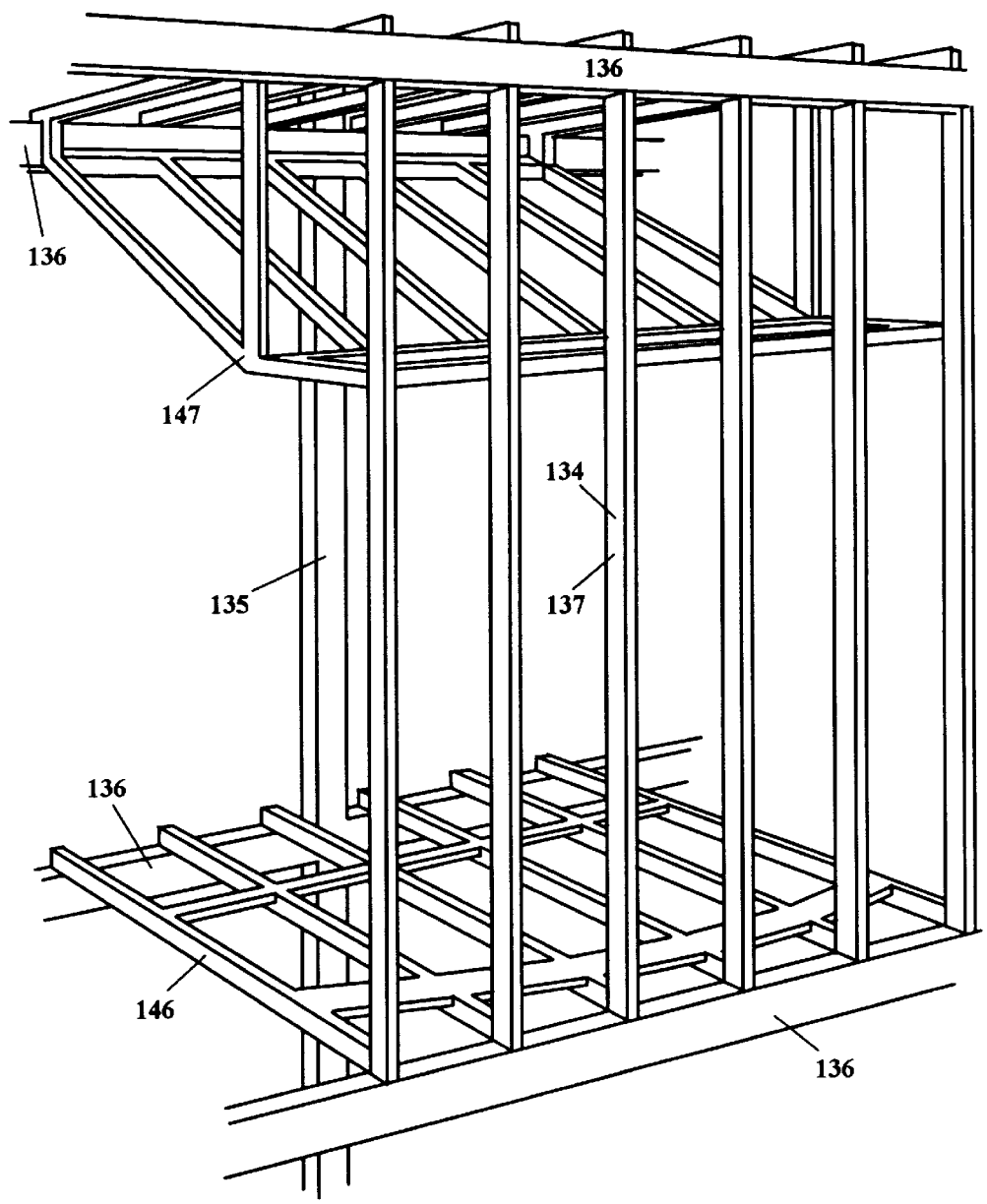
FIG. 27 is a perspective view of the support frames of a vertical reflective strip collector installed within the framework of a building.

To simplify installation of the vertical collectors 122, pre-manufactured framing components are provided (FIGS. 26 & 27). These components are produced with standard techniques used in building industry, such as cold forming of steel. To support the weight of the front side equipment of the collectors 122, such as the vertical energy converters 152, and the transparent protective sheets 132, vertical support columns 135 and horizontal beams 136 are installed forming open squares that allow solar radiation to enter the building. The upper directing reflector 118 and the strip rotating mechanism 242 are supported by an upper support frame 147. The lower directing reflector 117, in the lower most collector 122, is supported by a lower support frame 146. When multiple collectors 122 are installed on top of each other, the lower directing reflector 117 is installed directly on top of the upper support frame 147 of the collector 122 below it.

Figure 28A:
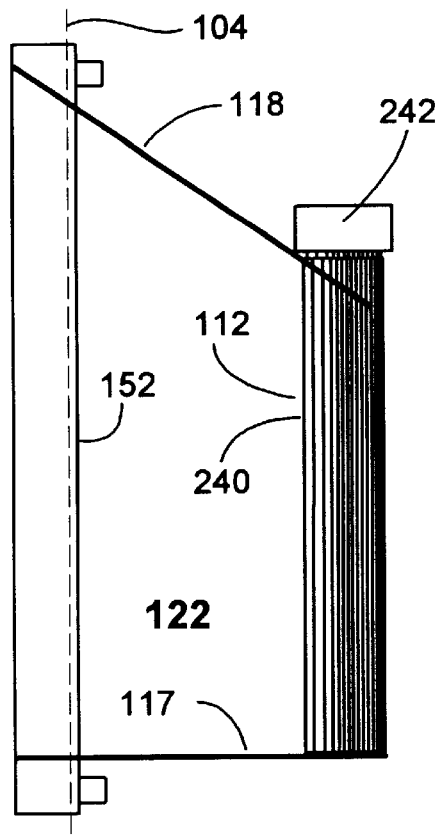
FIG. 28A is a side view of a vertical reflective strip collector.
Figure 28B:
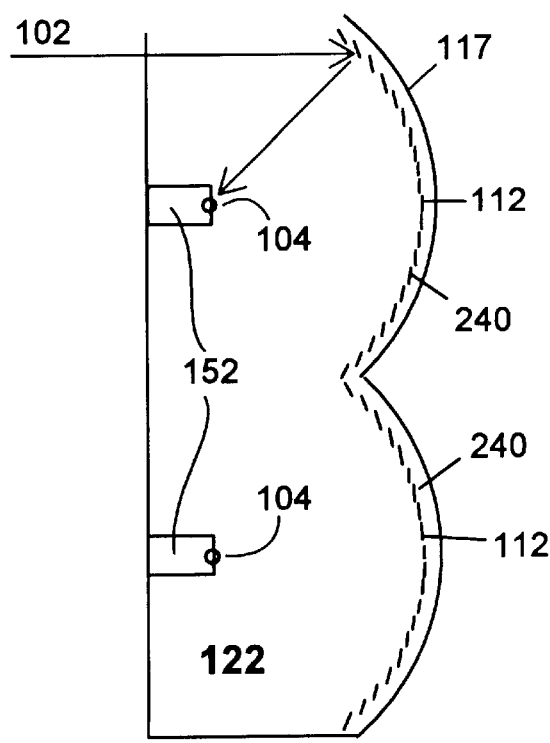
FIG. 28B is a top view of a vertical reflective strip collector.
Figure 28C:
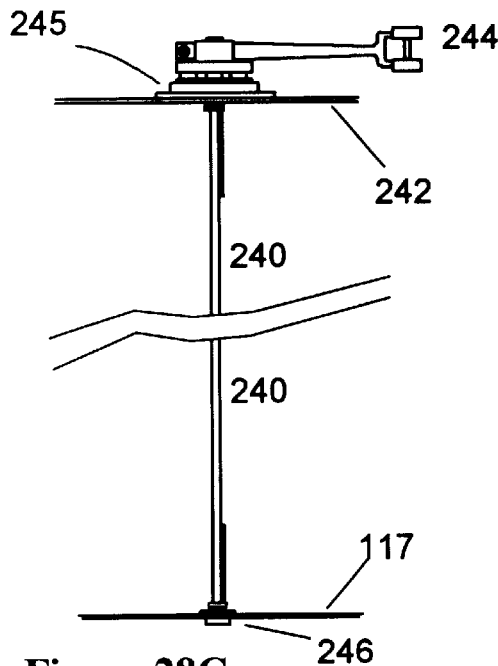
FIGS. 28C & 28D are detailed illustrations of the support and rotation mechanisms for the reflective strips.

The concentrating reflector 112 is constructed from highly reflective strips 240 placed on a formation of a section of a circle, with the focal point of the circle being at the line of concentration 104, as illustrated by the top view in FIG. 28B. This arrangement resembles vertical blinds. The strips 240 are made in such a way that they can be rotated around their vertical axis, and are hanging, supported by an upper bearing 245, in the strip rotating mechanism 242, installed above, as shown in FIGS. 28A & 28C. A lower bearing 246 is provided at the bottom of each strip 240, attached to the lower directing reflector 117, such that it will keep the strip 240 horizontally stable, but carries no vertical load. The strips 240, essentially hanging, pulled down by their own weight, are made from lightweight material, with cost effective manufacturing processes (such as thin electroplated metal strips).

Figure 28D:
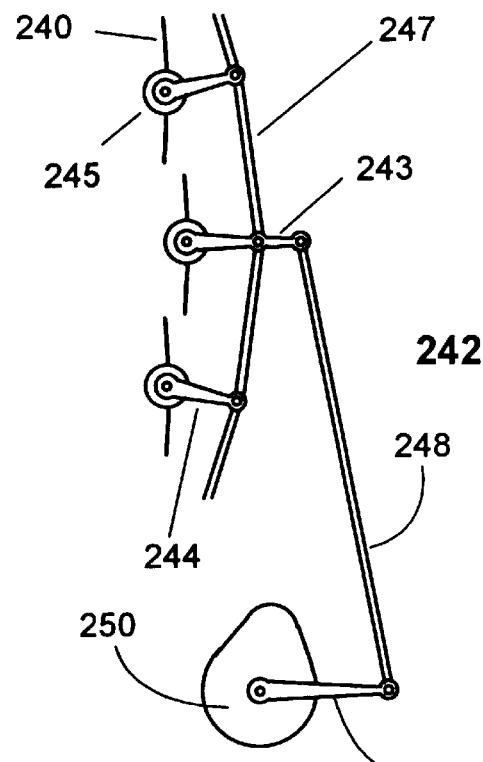

Referring to FIG. 28D, a mechanical linkage is used to tie the strips 240 together, so that they are all rotated with a single rotating actuator 250, which is driven by a stepper motor. The actuator 250 turns an actuator lever 249, which pushes or pulls an actuator link 248. The other end of the actuator link 248 is connected to a power link 243, which is connected to a strip 240 in the center of the strip array. All other strips 240 are linked to this power link 243 via serial links 247 connected through individual strip levers 244, one provided for each strip 240. The strip levers 244 of the last strips 240 on each side are pulled outwards by springs (not shown), such that any slag in the linkage will be taken out.

The foregoing has described the preferred reflector arrangements of the directing and concentrating solar energy collectors. As stated earlier, many other configurations using the same basic principles are possible. Although it is believed that those already presented will provide the best economies in their intended implementations, a few of the alternative configurations will be briefly described so that more comprehensive understanding of the practical utilization of these principles may be gained.

Figure 29:
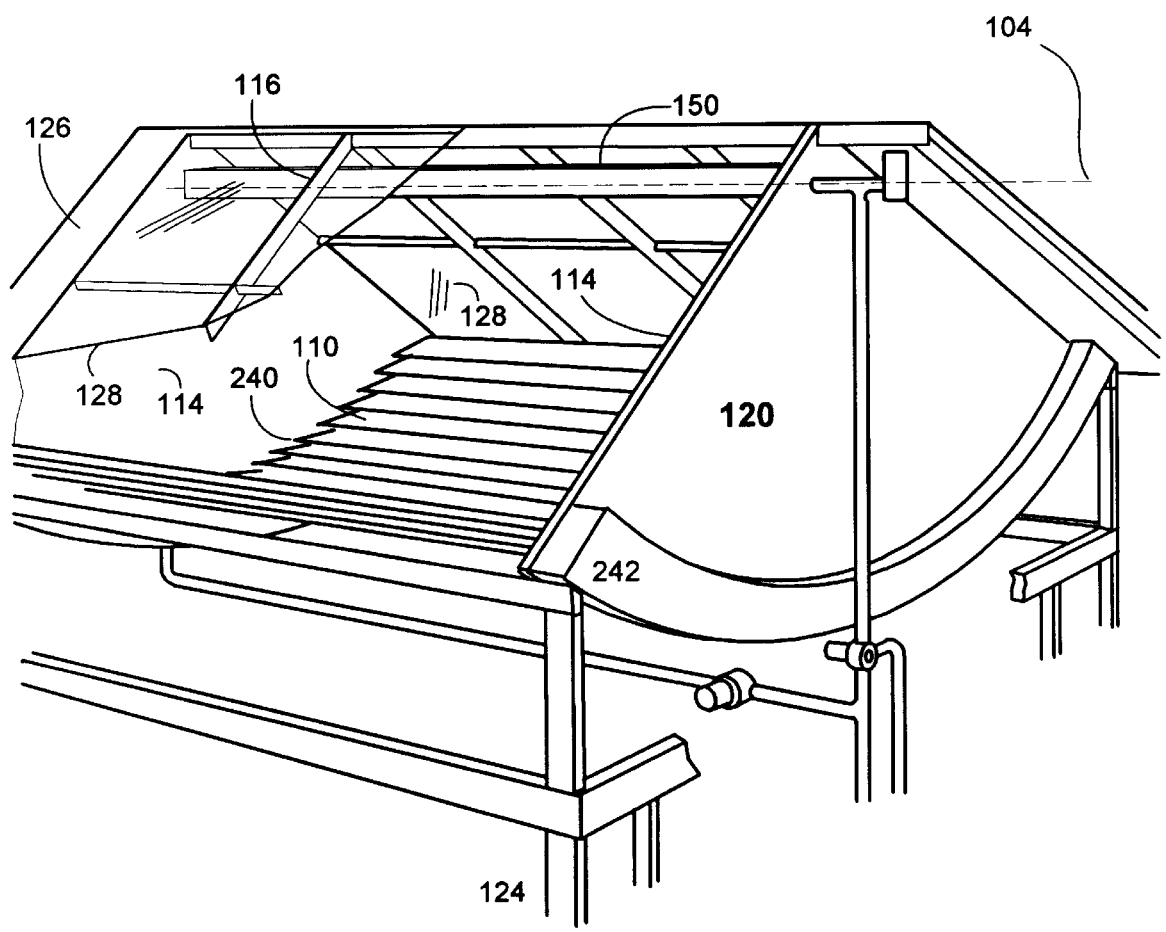
FIG. 29 is a perspective view of an alternative horizontal circular arrangement of reflective strips forming a concentrating reflector suitable for a building.
Figure 30:
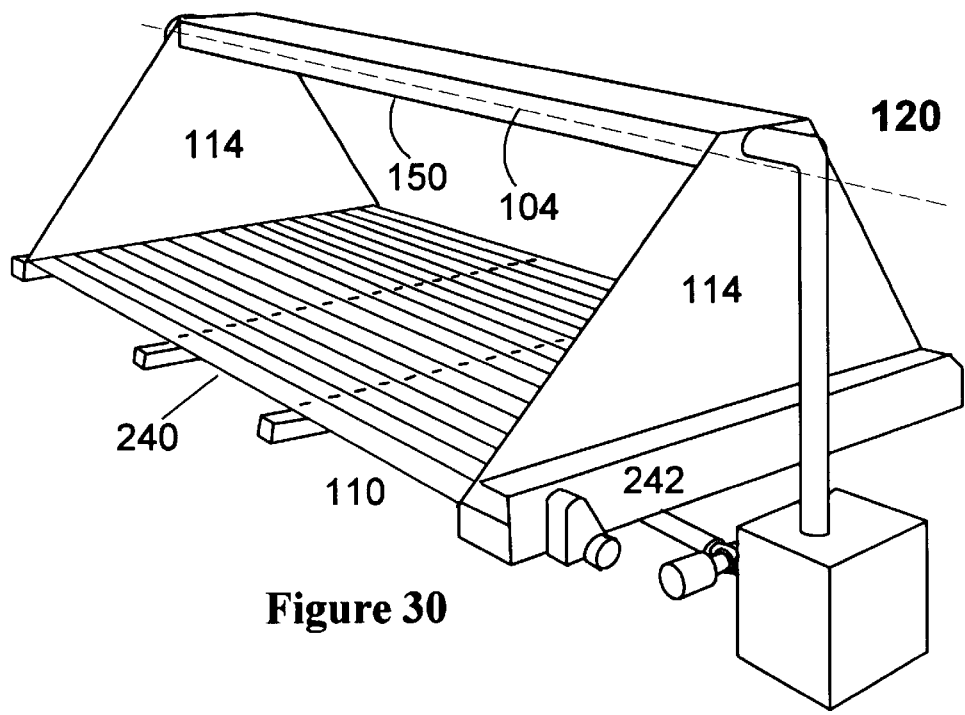
FIG. 30 is a perspective view of an alternative horizontal straight line arrangement of reflective strips forming a concentrating reflector.

Referring now to FIGS. 29 & 30, a directing and concentrating solar energy collector 120 using the reflective strips 240 as a concentrating reflector 110 in horizontal orientation is shown. Utilization of stronger, rigid, reflective strips 240 would yield concentrating reflectors 110 strong enough to be placed in orientations other than vertical. These could be manufactured using methods such as molding of fiber reinforced polymers, extruding aluminum, or cold forming of steel. The collector 120 is installed in a building 124 under a transparent section 128 of a roof 126. To reduce the optical losses, as described before, the strips 240 are employed in a formation of a section of a circle. The directing reflectors 114 are provided at the ends of the reflective strips 240 of the concentrating reflector 110, as well as on the sides of the reflector's support structures. The directing reflectors 114 at the ends of the strips 240 are extended all the way from the concentrating reflectors 110 to the transparent section 128 of the roof 126. In order to accomplish single axis tracking of a changing solar radiation source, the strip rotating mechanism 242 is provided at one end of the strips 240. An absorber or a converter 150 is placed above the concentrating reflector 110, at the line of concentration 104. When a solar collector of this form is positioned such that the concentrating reflector 110 is horizontal, with the line of concentration 104 directly above, it can serve as a general purpose configuration. It is especially well suited for the lower latitudes of the earth, and is not particularly sensitive to collector's orientation in relation to the north-south axis of the earth. If the strips 240 are curved to form a hyperbolic reflector, very high concentrations, and therefore, high temperatures can be efficiently attained.

FIG. 30 shows a similar arrangement, with the difference being that the strips 240 are placed in a straight line. This form is obviously less efficient, but may yield somewhat lower capital cost.

Figure 31:
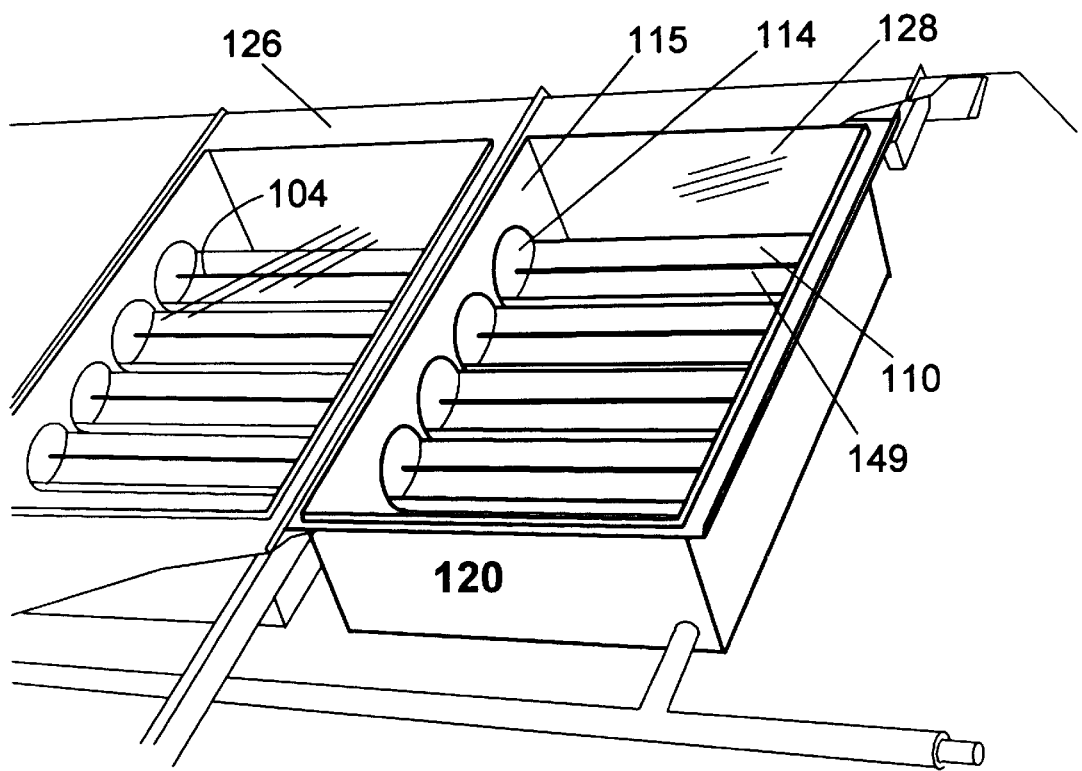
FIG. 31 is a perspective view of an alternative solar collector arrangement using an array of cylindrical parabolic reflectors to concentrate radiation.

Referring now to FIG. 31, a parabolic trough concentrating reflector is shown. A parabolic trough concentrating reflector 110 is made to rotate around the stationary line of concentration 104. Directing reflectors 114, shaped to a flat circular disk, one on each side of the concentrating reflector 110, are attached to the concentrating reflector 110 and rotate with it. A stationary, darkened heat pipe 149 is installed at the line of concentration 104, so that it passes trough the holes in the middle of the directing reflectors 114. An array of these combinations is mounted in a box like solar thermal energy collector 120. The top of the collector box 120 is made of durable transparent 128 material for entry of solar radiation. Inside, along the sides of the box, perpendicular to the concentrating reflectors 110 and the heat pipes, stationary directing reflector extensions 115 are provided. These extensions 115 have circular openings, slightly bigger than the rotating directing reflectors 114. The extensions 115 are mounted such that the directing reflectors 114 are left inside these openings, surfaces of both reflectors 114,115 being flush. Thus a continuous directing reflector 114,115 is extended from the concentrating reflectors 110, past the heat pipes 149, to the transparent top cover 128 of the collector box 120. To rotate the concentrating reflector 110 for maintaining the line of concentration 104 at the heat pipe 149, the methods described elsewhere in this description are directly applicable. Other types of concentrating reflectors 110 may also be used with this arrangement, such as hyperbolic, generally curving cylindrical, or a fresnel reflector. However, a reflector curved strictly to the shape of a parabola should produce the highest concentration.

Essentially, FIG. 31 shows an improved version of the parabolic trough thermal solar collector that has been utilized in various solar power plant projects (such as Luz company's SEGS series for Southern California Edison and International Energy Agency's tests in Spain). Significant improvements are the directing reflectors 114, 115, and a transparent protective cover 128 allowing more compact placement of the collectors 120 and longer life time of the reflectors. With the all around protective cover, it is also possible to use more cost effective materials and production processes, such as molding of polymers.

While the efficiency and cost figures of this version of directing and concentrating collector 120 may not rival the figures of the versions described before, it may still serve some useful purpose. This form of concentrating collector 120 can be more easily installed within an existing roof 126 structure, whose slope cannot be changed, and whose structural members may be constructed from wood. It is conceivable that these boxes may also be installed on top of a roof 126. Although, as stated, the efficiency of this collector 120 may not appear to be that good in the present context, but when compared with the flat panel technology, it is excellent. Using a parabolic concentrating reflector 110, an average concentration ratio in excess of 10 is possible, and from 3 to 5 is attainable even in marginal conditions. To improve the thermal efficiency, similar techniques that have been used with parabolic trough concentrators, could be employed. These have different thermal shields, either partially or fully surrounding the heat pipes 149. Even a glass tube with a vacuum inside has been used. However, elaborate solutions like that may not be worth the cost, and may also create more problems than they solve. Furthermore, it is pointed out that since the heat pipe 149 already resides within a closed box, where there is no wind, the thermal losses from it to the surrounding air are less than with a heat pipe 149 exposed to outside air.

This concludes the detailed description of reflector configurations of the present invention, and some important variations of them. The energy converters 150, 151 & 152 employed in preferred embodiments, suitable for those reflector configurations, will be described hereinafter, first in theory, and then in the form of implementation.

For primarily direct electricity generation, a control strategy to maintain the conversion elements at some specific temperature, or to limit the temperature to below some specific limit, is much more appropriate. For example, most silicon (Si) photocells provide best efficiency when they are kept cool. Gallium arsenide (GaAs) cells prefer much higher temperatures. Naturally, for the temperature limiting strategy to work, there must be a heat sink guaranteed to stay at lower temperature, into which the generated thermal energy is "dumped."

The control methods which will be presented here apply directly to best efficiency and temperature limiting strategies, and provide the basis for the highest temperature strategy.

FIG. 32A depicts an arrangement of a multiple sectioned energy converter 150, 151 used in a horizontally installed collector. This takes advantage of a high solar radiation flux, which occurs on only a part of a line of concentration 104. Each section has its own heat chamber 164, and receives its independent flow of heat transport fluid trough its transport fluid inlet 166, from a common entry header 260. Each section further has an independent transport fluid outlet 168, equipped with a valve or a damper 172, which has an associated digitally movable actuator, venting out to the common exit header 262. A temperature sensor 180 is provided in each section, before the transport fluid outlet 168, generally in the area of highest temperature in that section. The sections are separated from each other with section walls 177, each containing an insulating air gap. This arrangement allows the thermal conversion process to be controlled to the desired effect, which may be to maximize the efficiency, to maximize the temperature, or to keep the temperature at the best range for the PV cells used in solar radiation to electricity conversion. To control the temperature of a section, the following proportional algorithm is used:

if $Tx \geq (Td + Th)$ $Dp = \min(1.0, (Tx - (Td + Th))Gh)$ else $Dp = 0$

In the above algorithm, Tx is the exit temperature measured by the sensor 180, Td is the demand temperature (such as the measured temperature of a heat storage), Th is the threshold or temperature differential to determine when the valve or damper 172 should begin to open, Dp is the position of the exit valve or a damper (0 being closed and 1.0 being 100% open), and Gh is the gain determining the control range. The temperature control diagram shown in FIG. 33 also illustrates the algorithm.

FIG. 32B depicts a similar arrangement for a vertical energy converter 152. With this organization, multiple sections are configured in a bypass layout, such that the heat transport fluid from the entry header 260 flows through an inlet 166 to a first heat chamber 164. The topmost part of the chamber 164 has a bypass valve or a damper 174, which, depending on its position, vents the fluid, either to the next heat chamber 164 above the first, or to the bypass channel 171, or to both. In the intermediate chambers 164 above, this organization is repeated. In the topmost part of the last chamber 164 on top of the converter 152, no access to the bypass channel 171 and no valve or damper is provided. Instead, the heat transport fluid is allowed to flow directly to an outlet 168. The outlet 168 connects with the top end of the bypass channel 171, so that it receives any bypass flow there is. Following the top end of the bypass channel 171 the outlet 168 has an exit temperature sensor 180 and an exit valve or a damper 172. Each chamber 164 is further equipped with a temperature sensor 181,182,183 at the top, just before the exit or a bypass valve or a damper 174. This arrangement is particularly advantageous when used with the vertical reflector arrangement, previously shown in FIG. 3B. This allows highly efficient thermal energy collection even when the sun is at very low elevation angle. At such conditions, the bottom part of the converter 152 receives a high concentration of energy, and the top part of it receives no solar radiation at all. The upper sections are simply bypassed, and left relatively cold. Since the sections organized in bypass relationship interact more closely than completely independent heat chambers 164, a slightly more complicated control algorithm for the bypass dampers 174 is provided as follows:

if $T3 < (T2 + d)$ $D2 = 0$ else $D2 = \min(1.0, (T3 - (T2 + d))Gd)$ if $T2 < (T1 + d)$ $Dx1 = 0$ else $Dx1 = \min(1.0, (T2 - (T1 + d))Gd)$ $D1 = \max(Dx1, D2)$ The above assumes a vertical converter with two bypass sections as shown in FIG. 32B, but can be easily modified for more or fewer sections by adding or removing if-else statements. The terms are as follows: T1 through T3 are the section temperatures measured by the sensors 181 trough 183, starting from the bottom. D1 and D2 are positions of the bypass dampers in the same order, with a value of 0 being closed (bypass fully open) and a value of 1.0 being 100% open (bypass fully closed). Dx1 is a temporary variable, Gd is a gain determining the control range, and d is a temperature differential desired between the sections. The exit valve or a damper 172 of the vertical converter 152 is controlled by the same algorithm as the section exit valve 172 for the horizontal converter 150, previously described.

FIG. 32C shows a complete heat transport loop. The loop consists of multiple energy converters 150 152 connected to the entry and exit headers 260,262, such that a heat transport fluid enters the converters 150 152 from the entry header 260, and leaves the converters 150 152 to the exit header 262. Movement of the transport fluid is propelled by a variable flow pump or a blower 267 before the entry headers 260 connected with pipes or ducts 264. The exit headers 262 are connected via pipes or ducts 264 to a two-way system control valve or damper 265, such that the transport fluid leaving the converters 150 152 arrives at the control valve or damper 265. Just before entering the control valve or damper 265 the fluid passes a system temperature sensor 266 to measure its temperature. Depending on the position of the control valve or damper 265, the transport fluid is then circulated through a heat extracting device 270 (heat using equipment), such as a heat storage or a heat exchanger, or through a bypass pipe or a duct 268, or both, before entering the pump or blower 267 again. The variable flow rate pump or blower 267 and the system control valve or damper 265 are both digitally controlled by a micro processor (not shown).

Figure 33:
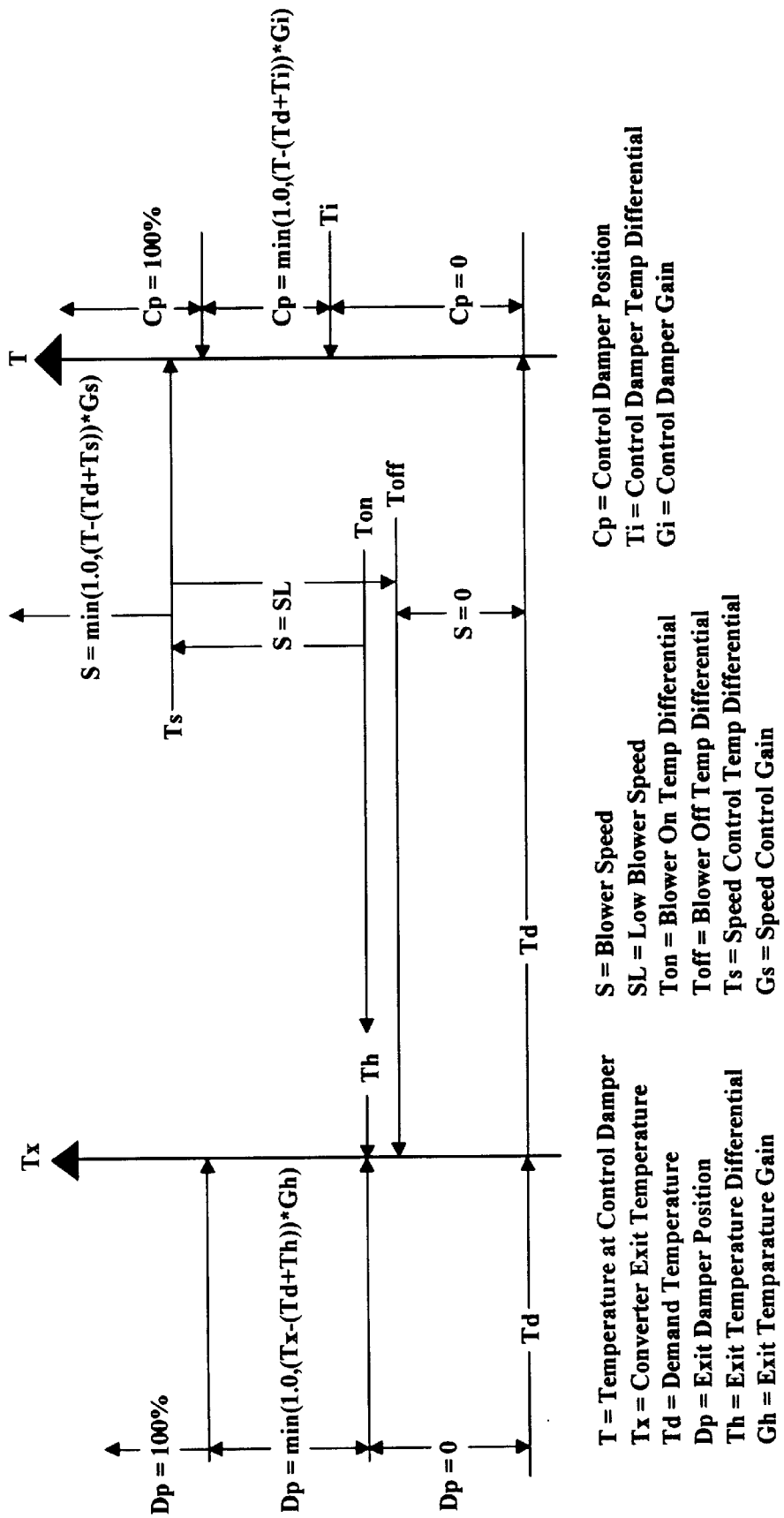
FIG. 33 is a diagrammatic representation of a proportional temperature control model of a heat transport loop.
Figure 34A:
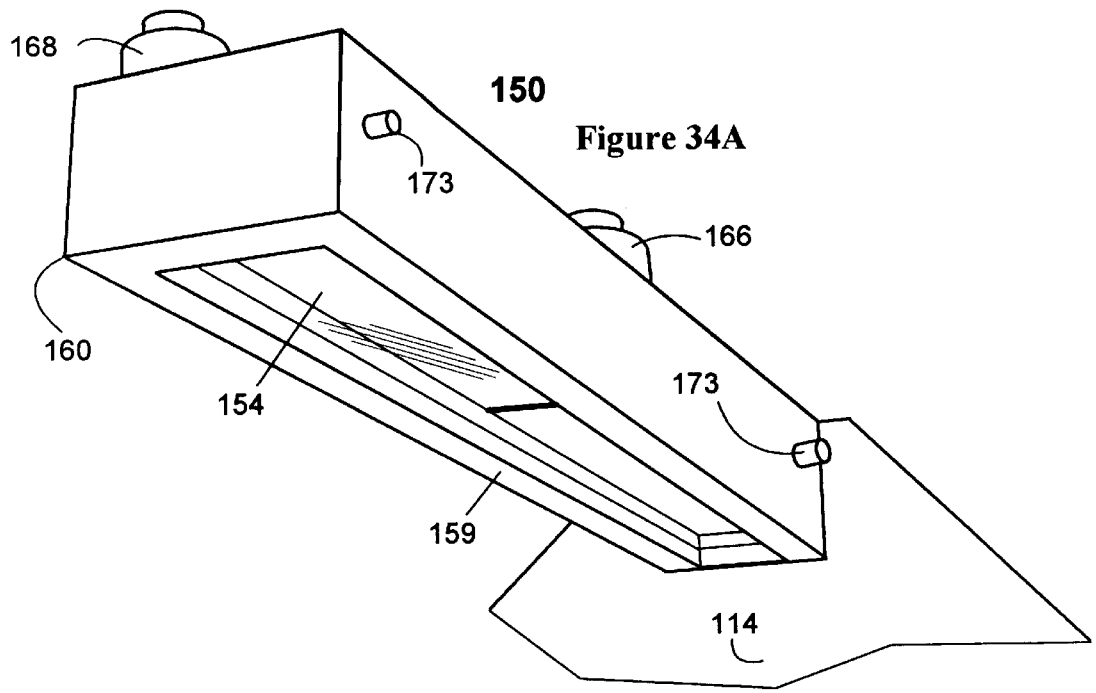
FIG. 34A is a perspective view of a horizontal energy converter with two parallel heat chambers.
Figure 34B:
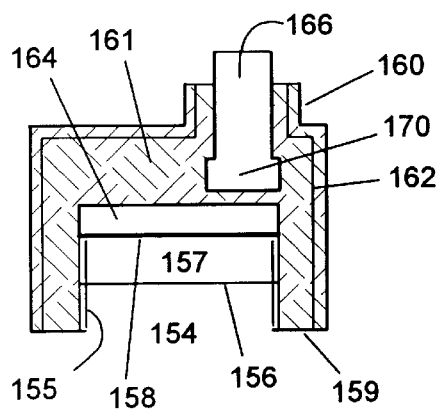
FIG. 34B is a cross sectional view from the side of a horizontal energy converter showing a heat transport fluid inlet.
Figure 34C:
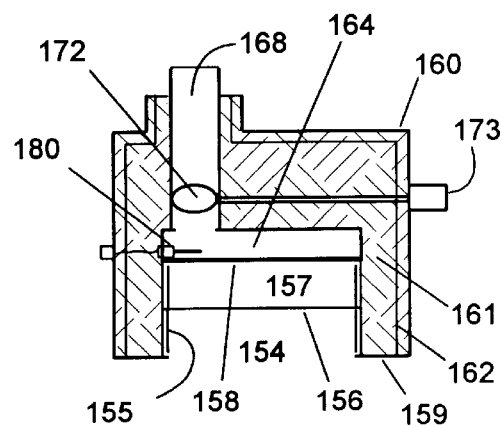
FIG. 34C is a cross sectional view from the side of a horizontal energy converter showing a heat transport fluid outlet and a flow control device.
Figure 34D:
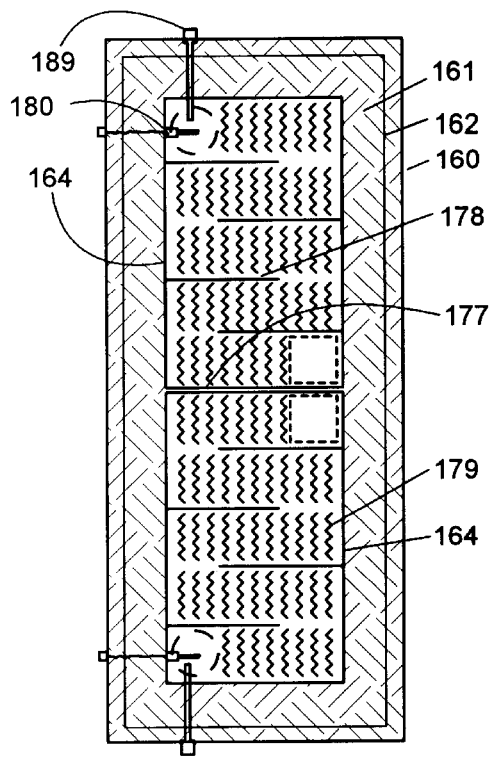
FIG. 34D is a cross sectional view from the top of a horizontal energy converter showing the details of the heat chambers.
Figure 34E:
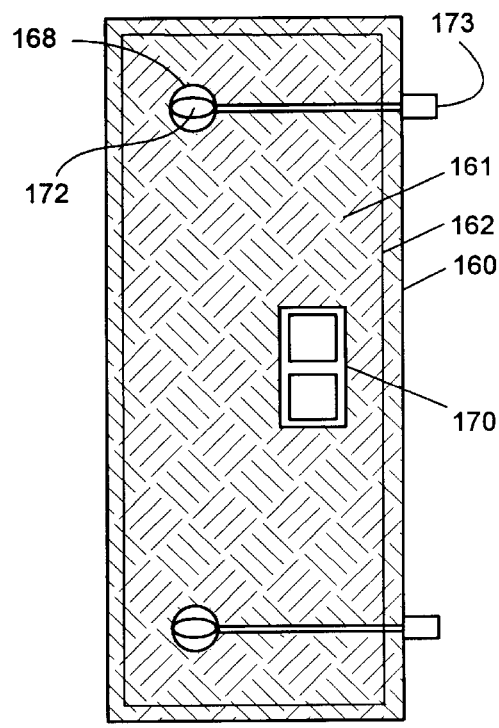
FIG. 34E is a cross sectional view from the top of a horizontal energy converter showing the heat transport fluid flow control devices.
Figure 34F:
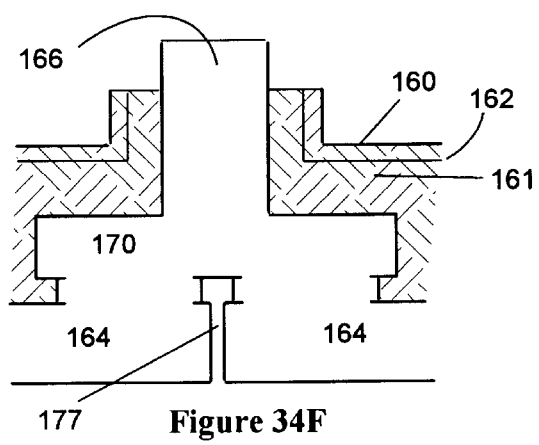
FIG. 34F is a cross sectional view from the back of a horizontal energy converter, detailing a heat transport fluid inlet and manifold.
Figure 35A:
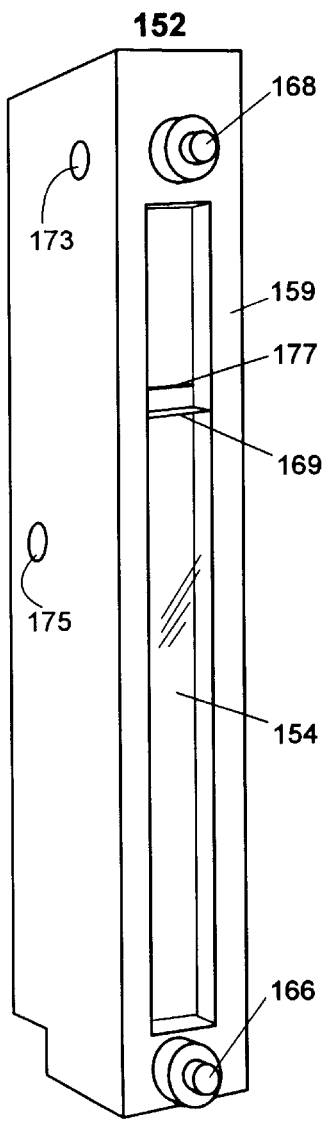
FIG. 35A is a perspective view of a vertical energy converter with two heat chambers with a bypass arrangement.
Figure 35B:
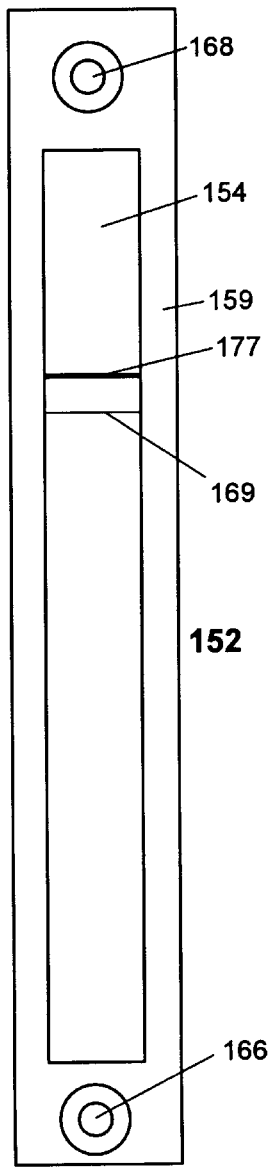
FIG. 35B is a front view of a vertical energy converter with two heat chambers with a bypass arrangement.
Figure 35C:
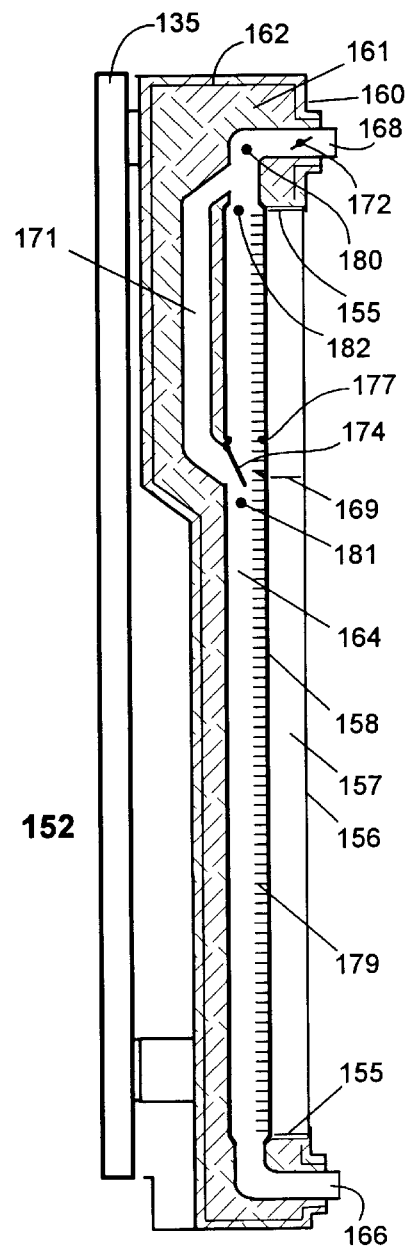
FIG. 35C is a cross sectional side view of a vertical energy converter with two heat chambers and a bypass channel
Figure 35D:
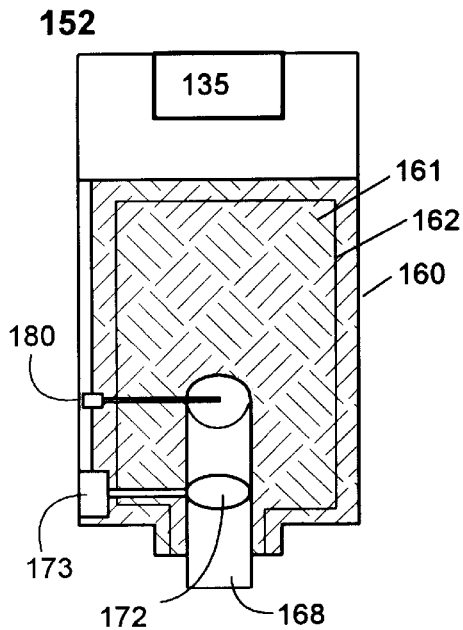
FIG. 35D is a cross sectional view from the top of a vertical energy converter showing a heat transport fluid outlet and an exit flow control device.
Figure 35E:
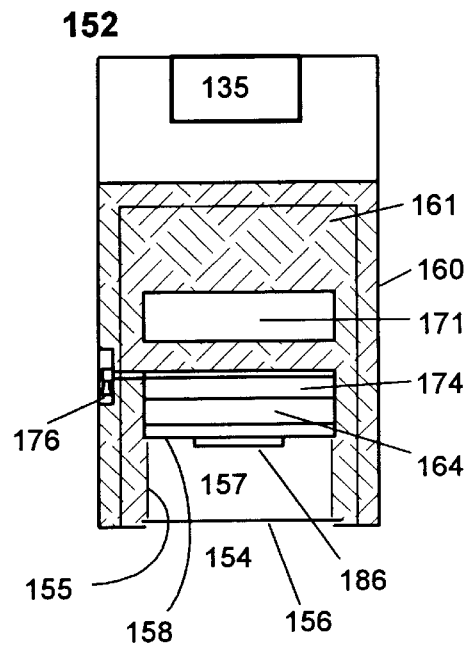
FIG. 35E is a cross sectional view from the top of a vertical energy converter showing a bypass flow control device.
Figure 35F:
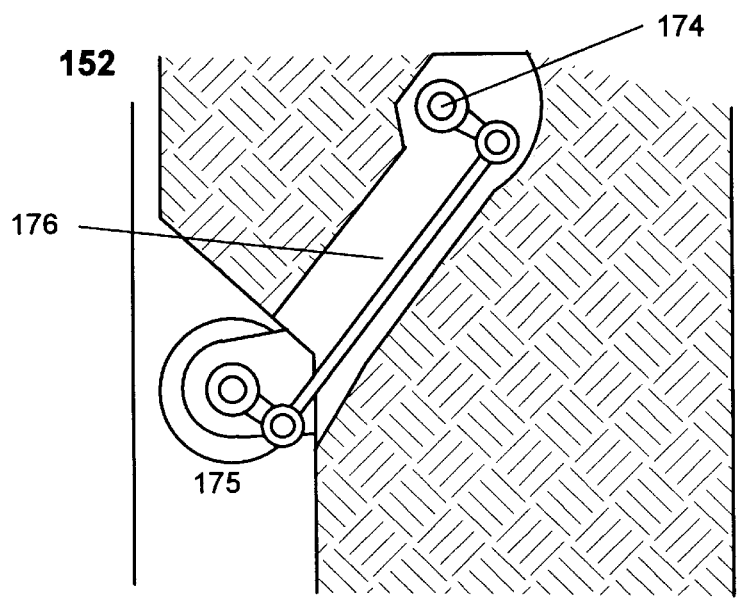
FIG. 35F is a detailed sectional side view of a vertical energy converter showing a bypass flow control device linkage.

The temperature control diagram shown in FIG. 33 along with FIG. 32A–32C is referred to for the discussion of the system control algorithms. To set an example of how the entire system is controlled, it is assumed that the heat extracting device 270 is a heat storage and the system is controlled to maximize the thermal efficiency. Controlling of the individual exit valves or dampers 172 is done according to the algorithm described previously, and depicted on the left side of the temperature control diagram (FIG. 33). The flow rate of the heat transport fluid at the system level is controlled according to the following:

if $T < (Td + Ts)$ if $S = 0$ if highest $Tx \geq (Td + T\text{on})$ $S = SL$ else if highest $Tx < (Td + T\text{off})$ $S = 0$ else $Sx = \max(SL, Gs(T - (Td + Ts)) + SL)$ $S = \min(1.0, Sx)$ In the above, T is the temperature at the system control valve or a damper 265 measured by the system temperature sensor 266, Ts is the flow (or speed) control temperature differential threshold, "highest Tx" is the highest exit temperature measured by the exit temperature sensors 180 at the converters 150,151,152, Ton is the pump or blower 267 turn on differential threshold, Toff is the pump or blower 267 turn off differential threshold, SL is the lowest allowed flow rate (or speed), Sx is a temporary variable, Gs is the gain determining the flow control temperature range, Ts is a flow control temperature differential threshold, Td is the temperature of the heat storage (demand temperature), and S is the flow rate (or speed).

The position of the system control valve or a damper 265 is determined by the following:

if $T < (Td + Ti)$ $Cp = 0$ else $Cp = \min(1.0, Gi(T - (Td + Ti)))$

Where, Ti is the control valve or damper 265 opening differential threshold, Gi is the gain to determine the temperature range of the valve or damper control, Cp is the position of the control valve or a damper (0 being full bypass and 1.0 being bypass closed with 100% flow to the heat storage), and other terms are as before.

When the described threshold and gain settings are properly selected, a smooth and efficient temperature control operation will result. In such operation, when the system is cold, all exit valves or dampers 172 are closed, the system control valve or a damper 265 is in full bypass position, and the pump or a blower 267 is turned off. When the temperature in one or more converters 150,151,152 reaches the differential threshold Th, the exit valve or a damper 172 in such a converter 150,151,152 begins to open. At about the same time, the pump or a blower 267 is turned on, initially at a very low flow rate (SL), just to cause enough circulation to warm up the pipe or duct network 260,262,264,268. When the temperature increases in the converters 150,151,152 and in the heat transport loop, the exit valves 172 will open more, and the system control valve or a damper 265 begins to move away from full bypass position, shifting some flow to the heat storage. As the transport loop gets more fully heated, and the temperature at the system temperature sensor 266 reaches the differential threshold Ts, the proportional flow control begins. By that time, the system control valve or damper 265 has been shifted to 100% flow trough the heat storage, with the bypass flow 268 fully stopped. If the temperature keeps increasing above the flow control differential threshold Ts, the flow is quickly increased to limit this temperature increase. In the evening, or during a cloud passage, as the converters 150,151,152 begin to cool, the above control cycle is reversed. The flow is quickly reduced to low (SL), and the control valve or damper 265 is shifted to bypass position. However, the pump or blower 267 is not stopped completely until the highest temperature measured at the converters 150,151,152 drops below the flow off differential threshold Toff. In this way, the system remains ready during brief cloud passages, and no "hot spots" are created when the sun appears again.

With reference now to FIGS. 34A–34F, aspects of an actual implementation of the horizontal energy converter 150 is shown, using air as the heat transport fluid with two independently controllable heat absorbing sections and high temperature PV panels 186. The horizontal energy converter 150 includes two thermal conversion elements in the form of two heat chambers 164, each having a controllable damper 172, a radiation receiving aperture 154 with a transparent thermal sheet 156 below the heat chambers 164, internal side reflectors 155, thermal insulation 161,162, and a protective casing 160. This implementation is optimized towards lower cost rather than towards highest performance. The lower cost is achieved by using only two heat chambers 164, as opposed to three (with the middle one split) or more chambers.

At the bottom of the heat chamber 164 is the absorber plate 158 facing the concentrated solar radiation. The absorber plate 158 is made from sheet metal which is treated for good radiation absorptance from the outside, and fitted with heat convection increasing fins 179 from the inside. Each heat chamber 164 is divided into multiple heat transport zones with divider walls 178, such that the air, used as the heat transport fluid, is forced to circulate evenly on top of the absorber plate 158. The heat chambers 164 are separated from each other by section walls 177 having a thermally insulating air gap. A damper 172, driven by a micro processor 300 (described later) controllable actuator 173, is provided at the gas outlet 168 of each heat chamber 164, allowing the conversion temperature to be controlled individually in each heat chamber 164. Placement of the outlets 168 is at both sides at the front corner of the converter, on top of each heat chamber 164, at an area of typically highest solar radiation flux. An exit temperature sensor 180 for each heat chamber 164 is located in the heat chamber 164, directly below the gas outlet 168. A common air inlet 166 for the two heat chambers 164 is provided on top of the heat chambers 164, and is connected to the heat chambers 164 through an internal manifold 170.

The radiation entry aperture 154 forms a tall, downward facing cavity 157. It is assembled with a transparent, convection loss reducing, thermal sheet 156 approximately half way down the cavity 157. It is also provided with internal vertical reflectors 155 facing inwards to the cavity at all sides, both above and below the transparent sheet 156. The transparent sheet 156 is fitted below the absorber plate 158 and the photovoltaic panels 186 (not shown) to take advantage of the heat transport properties of a horizontal air space. Extending the cavity 157 downwards, below the thermal sheet 156, by at least 100 mm further reduces the thermal losses without introducing a second thermal sheet which would increase the optical losses.

The upper internal reflectors 155 at the sides of the cavity 157 extend upwards from the transparent sheet 156 and end before the absorber plate 158, such that they never touch the absorber plate 158. They are manufactured from either highly reflective metal or insulating ceramics with a reflective coating. The lower internal reflectors 155 at the sides of the cavity 157 extend downward from the transparent sheet 156, ending just before the casing 160 at the aperture rim 159. The arrangement of the internal reflectors 155 enables the line of concentration to be placed at the opening of the aperture 154, resulting in smaller aperture area, thus reducing both conduction and convection heat losses.

A glass fiber thermal insulation 161 with the radiation shield 162 is provided at all sides and at the top of the heat chambers 164. The glass fiber insulation 161 is placed around all hot parts, inside the radiation shield 162. The thickness of the fiber insulation 161 at the sides is at least 100 mm, and at least 250 mm at the top. The radiation shield 162 is formed of aluminum foil, with the polished side facing inwards.

A casing 160 extending from all edges of the aperture 154, around the side insulation 161 and over the top insulation 161 is provided for mechanical protection. The sections of the casing around the aperture rim 159, facing down, are formed from reflective metal. A secondary radiation shield may be provided by polishing the inside of the casing 160.

The described horizontal energy converter 150 is installed on top of a concentrating reflector 110 (shown in FIG. 10), such that the line of concentration produced by the reflector 110 is located at the opening of the aperture 154, the directing reflectors 114 surround the converter 150 from the sides and from the bottom, and are in line with or slightly inward from the internal reflectors 155.

For the vertical directing and concentrating collector 122 (shown in FIG. 26), a vertical energy converter 152 with two heat chambers 164 is provided in a permanently fixed position, at the focal point of a section of a circle formed by the reflective strips 240. Its aperture 154 faces the reflective strips 240.

Referring now to FIGS. 35A–35F, various detailed views of the vertical energy converter is shown. The vertical energy converter 152 includes a thermal conversion element with two heat chambers 164, high temperature PV panels 186 attached to the absorber plate 158 of the heat chamber 164, a radiation receiving aperture 154 with a transparent thermal sheet 156 at the outer edge of the aperture cavity, internal side reflectors 155, thermal insulation 161, 162, and a protective casing 160. The side of the heat chamber 164 facing the concentrated solar radiation, i.e. the absorber plate 158, is made of a metal sheet which is treated for good radiation absorbance from the outside, and fitted with heat convection increasing fins 179 from the inside. A heat chamber 164 at the bottom connects with an insulated gas inlet 166 at its bottom end, allowing the cool transport gas to enter the chamber. The bottom heat chamber 164 has a bypass damper 174 at its top end, allowing the heated gas to be vented out, either to the top heat chamber 164 above, or to a bypass channel 171, or both. The top heat chamber 164 vents directly to an exit damper 172 located at an insulated gas outlet 168 above. The exit damper 172 is rotated by a digital actuator 173 containing a stepper motor, which is controlled by a micro processor 300 (not shown). The bypass channel 171 terminates just before the exit damper 172, letting the bypass flow out of the converter in a normal manner. A digital bypass damper actuator 175, containing a stepper motor, is mounted in an open space below the bypass channel 171, outside the insulation 161, 162, and linked to the bypass damper 174 with a bypass damper link 176. In this way, the actuator 175 is placed away from the side of the heat chamber 164, where it would compromise the insulation 161, 162, or would have to be placed outside the casing 160. As with the exit damper actuator 173, the bypass damper actuator 175 is also controlled by a micro processor 300 (not shown).

Three temperature sensors are used to measure the temperature at various points such that the energy collection process is controlled by a micro processor 300 (not shown), as discussed in the theoretical description. A first sensor 181 is installed at the top part of the lower heat chamber 164, just below the bypass damper 174. A second sensor 182 is placed at the top part of the upper heat chamber 164, just below the gas outlet 168. A third sensor 180, the exit temperature sensor, is mounted in the gas outlet 168, before the exit damper 172.

The radiation entry aperture 154 forms a substantially deep (at least 150 mm is recommended) radiation facing cavity 157. The cavity 157 is assembled with a transparent convection loss reducing thermal sheet 156, at the outer edge of the cavity 157. The cavity 157 is also provided with internal reflectors 155, perpendicular to the absorber plate 158, facing inwards to the cavity 157 at all sides, inside the transparent sheet 156. The arrangement of internal reflectors enables the line of concentration to be placed at the opening of the aperture 154, at the transparent thermal sheet 156, resulting in a narrower converter, thus reducing both conduction and convection heat losses. To prevent air circulation in the cavity 157, between the sections formed by the two heat chambers 164, a reflective cavity divider 169 is placed in the cavity 157, between the two sections.

A glass fiber 161 thermal insulation with a radiation shield 162 is provided at all sides. The glass fiber insulation 161 is installed first around all hot surfaces, followed by the radiation shield 162 (such as aluminum foil), and more glass fiber 161 is installed on top of the radiation shield 162. A casing 160 extending from all edges of the aperture 154, around the insulation 161 is provided for mechanical protection. The sections of the casing 160 around the aperture, facing towards the concentrated solar radiation, are formed from reflective metal, thus reflecting the radiation away, in case of an out of alignment concentrating reflector.

Figure 36A:
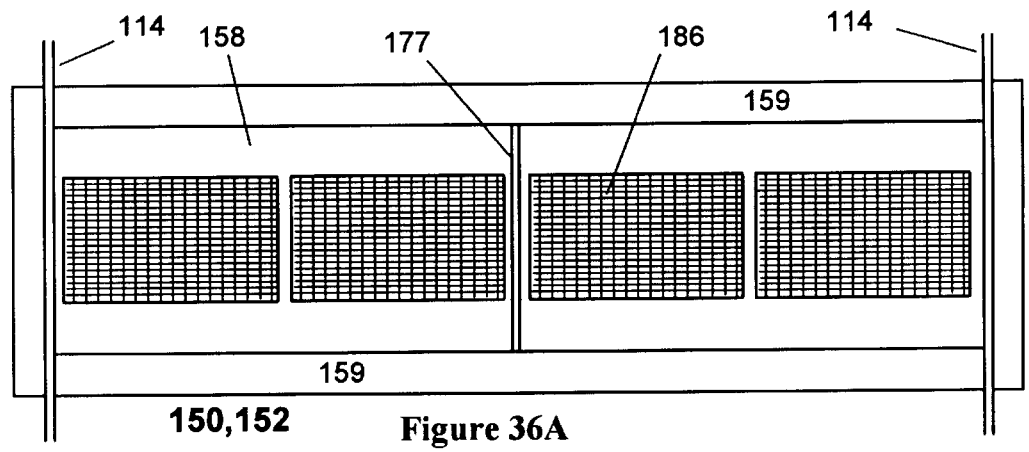
FIGS. 36A, 36B, 36C & 36D are illustrations of the installation and connections of photovoltaic cells in an energy converter.
Figure 36B:
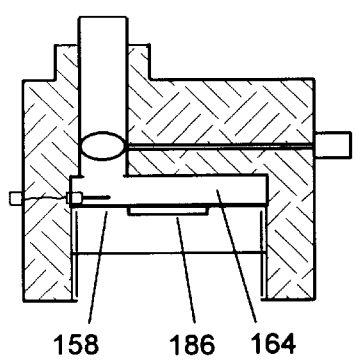
Figure 36C:
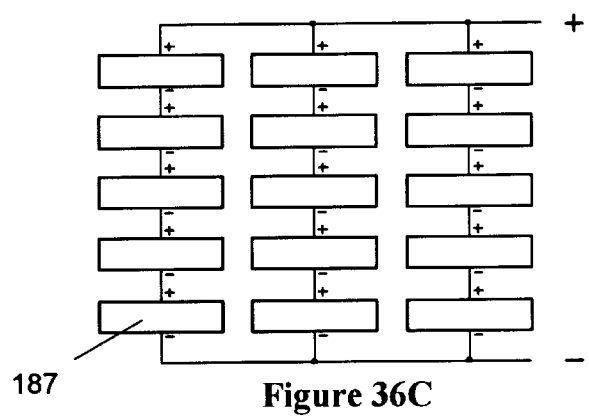
Figure 36D:
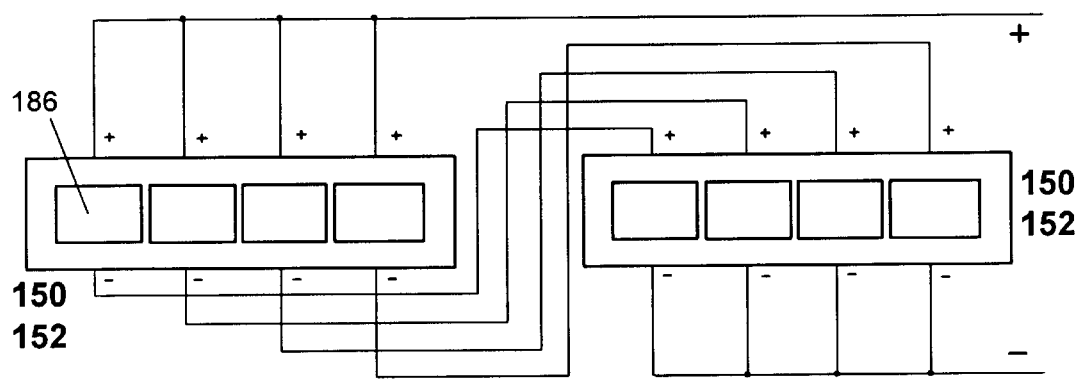

FIGS. 36A–36D describe the installation details of the PV panels. To provide a hybrid of thermal and photo electric energy converters 150,152, high temperature PV panels 186 are attached to the outside of the absorber plate 158 at the side of the heat chambers 164 facing the concentrated solar radiation. The best results would most likely be obtained by manufacturing the entire absorber plate 158 with the PV cells 187 as a unit. These panels 186 are composed from PV cells 187 specially manufactured to operate with concentrated solar radiation at high temperatures. Although some silicon cells (Si) for concentrated operation have been manufactured, and can be used, because of potentially high temperatures, it is recommended that some form of gallium arsenide (GaAs) cells be used. To accommodate the changes in solar radiation flux patterns, the individual cells 187 are mounted in rows perpendicular to the directing reflectors 114 and in columns parallel to the directing reflectors 114. The cells 187 in the same column are connected in series, and the columns are connected in parallel to each other. This arrangement reduces the "blocking diode effect" occurring when some of the cells connected in series receive less solar radiation and end up limiting the current through the entire chain. When multiple converters 150,152 exist at the same installation, the panels 186 in different converters 150,152, receiving an identical radiation pattern, can be connected in series, as depicted in FIG. 36D.

Figure 22:
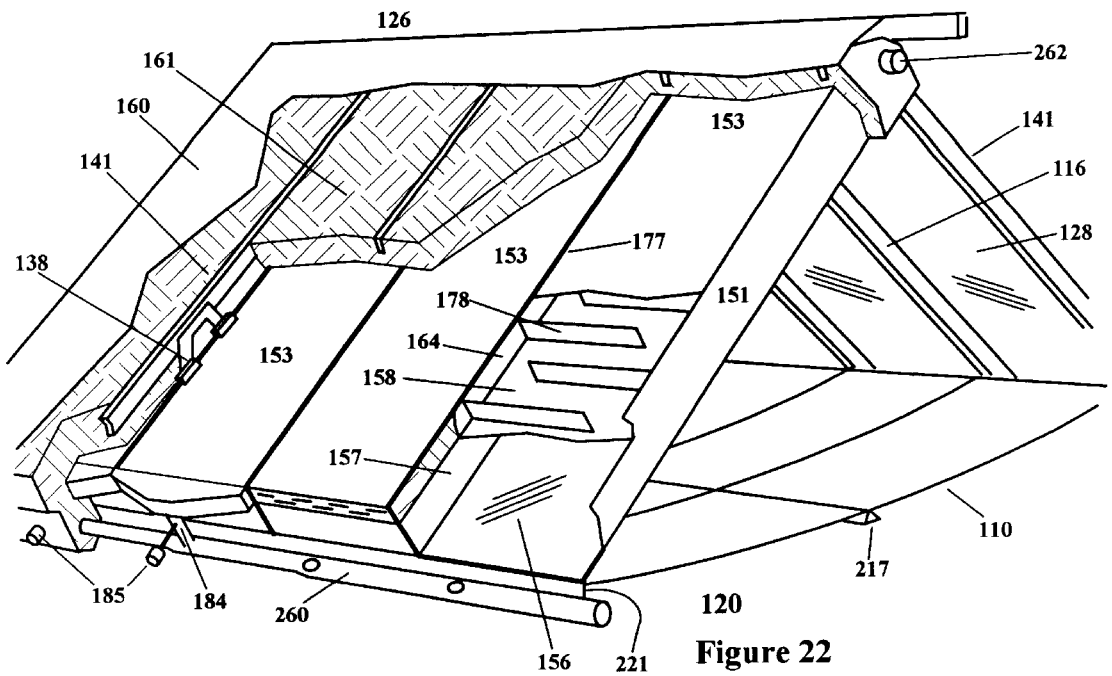
FIG. 22 is a perspective rear view of a collector using fixed sloping sheet concentrating reflectors and multiple section thermal only energy converters arranged as an array.
Figure 37:
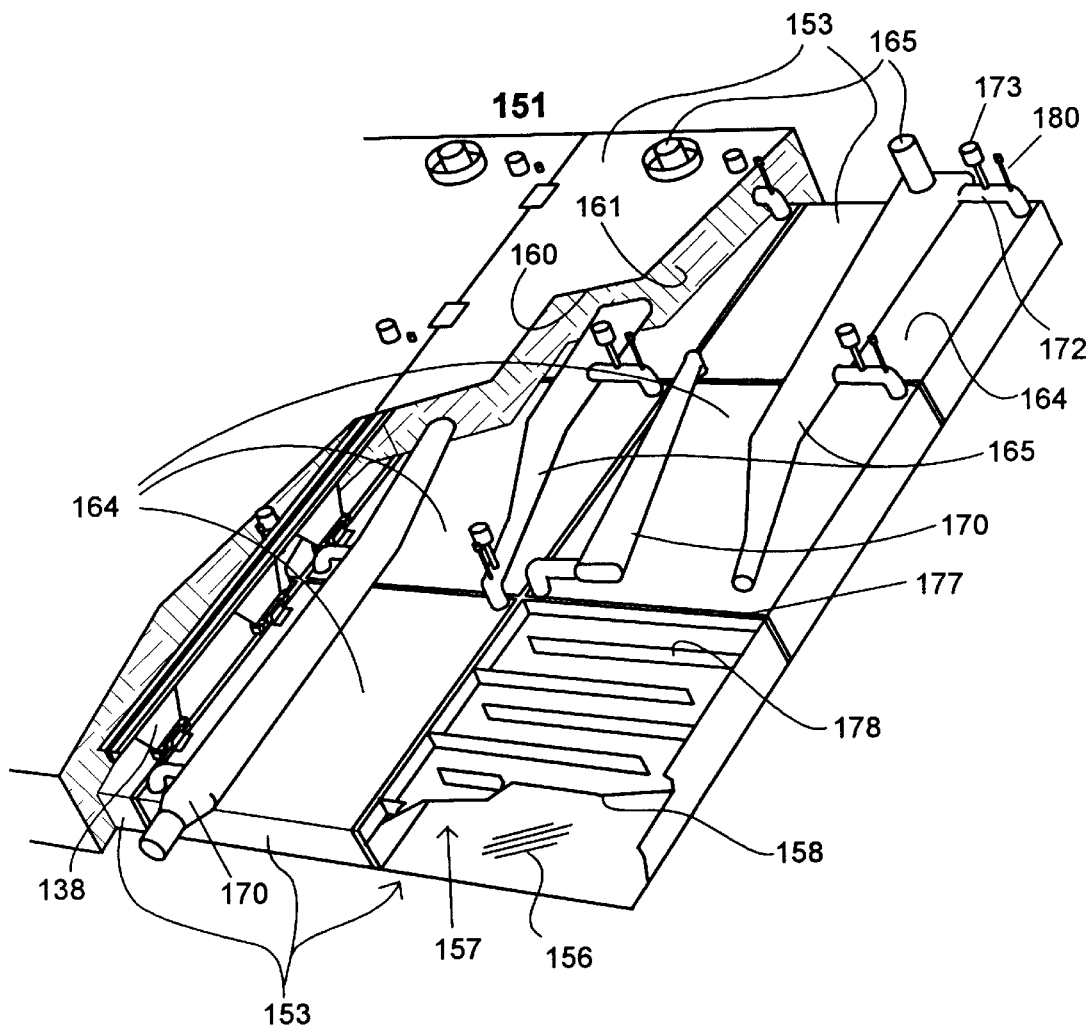
FIG. 37 is a detailed perspective view of a thermal energy converter in a matrix arrangement for installation under a sloping roof.
Figure 38:
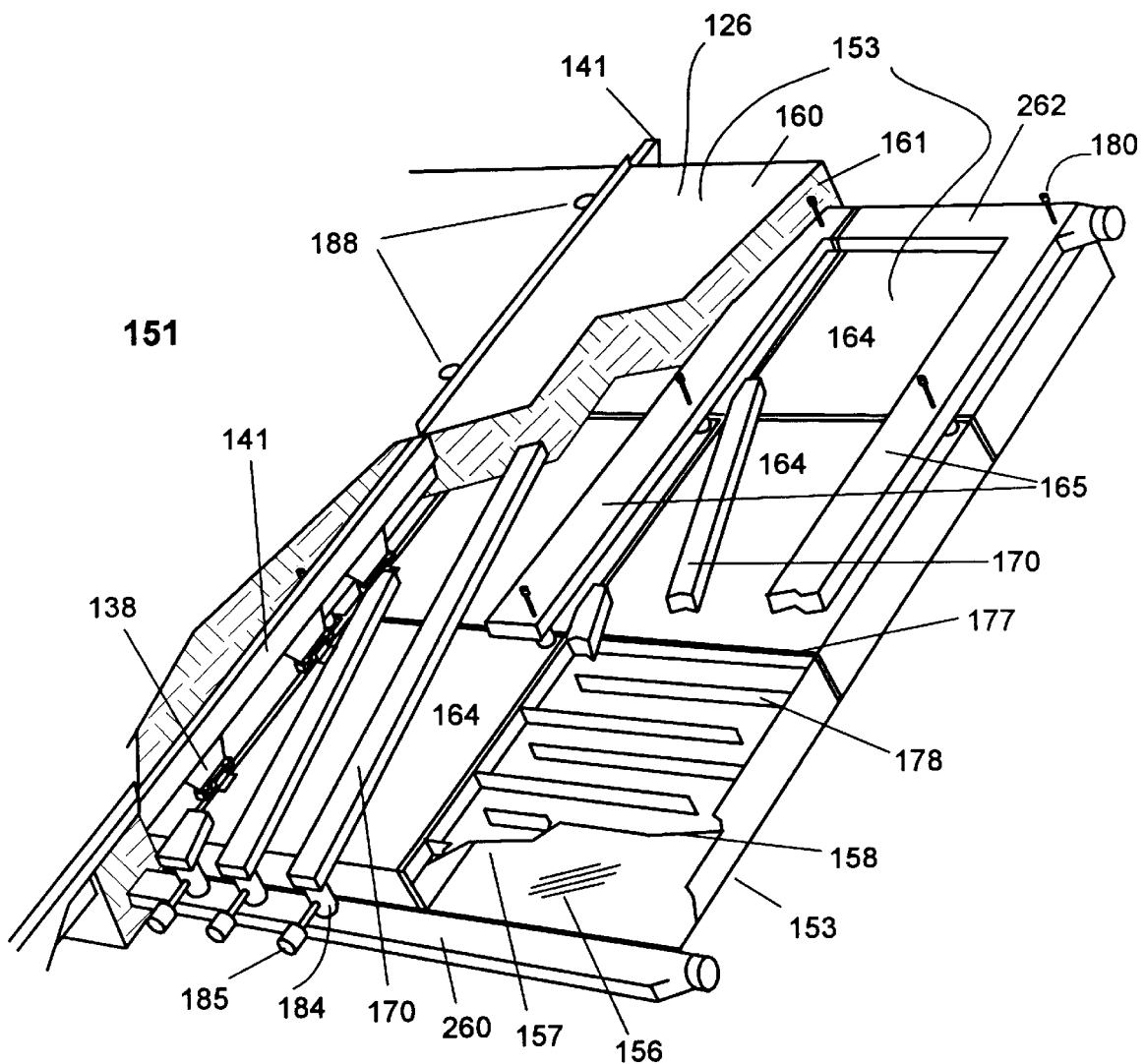
FIG. 38 is a detailed perspective view of a thermal energy converter in a matrix arrangement for installation as part of a sloping roof.

For the description of energy converters 151 used with non tracking reflector configurations, FIGS. 21B & 22 are now briefly referred to again, and more particularly FIGS. 37 & 38. In these, some of the most prominent variations are shown. Versions shown in FIGS. 21B & 37 are designed for installation under a roof 126, leaving a crawl space between the roof 126 and the sloping energy converter 151, providing maintenance access. The version shown in FIGS. 22 & 38 are designed to integrate the section of the roof 126 and the energy converter 151 completely, with no empty space in between the two. In all of these, the sloping energy converter 151 is extended over the entire area of movement by the concentrated solar radiation, with multiple conversion elements inside, in various configurations. Each conversion element is controlled individually.

These arrangements offer two major advantages over the prior art. One, the radiation receiving transparent thermal sheet 156 faces generally downwards (for example at a 45° angle), and is located inside the building 124, where there is no wind. Two, the multiple independent conversion elements offer the advantages of the concentrating collector without having to track the position of the sun. However, it is pointed out that at present time these advantages may only materialize in collection of thermal energy. With today's prices of PV cells, it would probably not be economical to generate electricity in this configuration using PV cells. Nevertheless, with a significant drop in the cost of PV cells, this equation would change. Because of that, a method of using PV cells with this configuration will also be described.

Having the transparent thermal sheet 156 facing down at a 45° angle, instead of up at a 45° angle produces from 3 to 4 times better thermal energy retention, on otherwise comparable energy converters. Having the thermal sheet 156 inside the building 124, allows the sheet 156 to be made very thin, thus adding only a minimal optical loss. The better thermal retention will far outweigh this added optical loss. Having the energy converter divided into multiple active sections has the advantage of enabling high temperatures to be maintained very efficiently, as already described in the foregoing. In addition, no tracking of the sun's position is required. All that is needed is a simple temperature control strategy, as also described. By using simple stepper or other digital motor actuated dampers or valves, a very simple and reliable system is achieved.

Two different ways of dividing the energy converter 151 into multiple sections are provided. Referring to FIG. 22 again, a simple array of long (or tall) heat chambers 164 is shown. The sloping energy converter 151 is first divided into multiple conversion elements 153, extending from near the wall of the building to near the ridge of a sloping roof 126. Inside each conversion element 153, a single heat chamber 164 is extended from one end of the element 153 to the other. This arrangement takes care of the sun's movement in an east-west direction, and moderately high temperatures can be generated during several hours of the day. The transparent thermal sheet 156 is located below the heat chamber 164, leaving a substantially thick air space, or a cavity 157, in between (at least 100 mm is recommended). The downwardly facing side of the heat chamber 164 is darkened from the outside, providing an absorber plate 158. Inside the heat chamber 164, internal dividers 178 force the heat transporting fluid to circulate in even fashion, reaching all parts of the heat chamber 164. The flow controlling entry dampers or valves 184, with their entry damper actuators 185, are located down below the energy converter 151, near the wall of the building, allowing access to them from below. An entry header 260 below the entry dampers or valves 184 provides the source of heat transporting fluid, connecting to the heat chambers 164. The heat transfer fluid exits the heat chambers 164 from their top ends, entering an exit header 262, under the ridge of the roof 126. The conversion elements 153 are mounted to self supporting rafters 141 with support arms 138. Roofing panels 160 are attached to the rafters 141 and the space above the energy converter 151 is completely filled with glass fiber insulation 161.

To achieve yet higher temperatures, another way of dividing the energy converter 151 into multiple sections is depicted in FIGS. 37 & 38. In addition to the array of conversion elements 153, multiple heat chambers 164 within each conversion element 153 are provided. The heat chambers 164 are organized as an array in the direction perpendicular to the line of concentration. Thus, a rectangular matrix of heat chambers 164 is formed, providing very good separation of different zones of concentration. Manifolds 170 are provided for the heat transport fluid to enter the heat chambers 164, and exit channels 165 are provided for the transport fluid exit. Exit temperature sensors 180 are placed at the transport fluid exit for reading the temperature at top part of each heat chamber 164. The version shown in FIG. 37 is intended to be installed under the roof 126, leaving a crawl space in between the roof 126 and the energy converter 151. The flow of heat transport fluid from each chamber 164 is controlled with an exit damper or valve 172. Each conversion element 153 is internally supported with support arms 138. In the version depicted in FIG. 38 the conversion elements are supported with their support arms 138 directly from the rafters 141, leaving no crawl space. The manifolds 170 receive the heat transport fluid from the flow controlling entry dampers or valves 184 at the bottom. Access to the exit temperature sensors 180 is provided via removable temperature sensor caps 188 on the roofing panels 160. All versions have an insulating gap 177 between the heat chambers. The internal features of the heat chambers 164 are identical to the ones already described.

As mentioned before, the use of PV cells with the sloping energy converter 151 does not appear to be economical at present time. However, with a significant decrease in PV cell prices, it may become desirable to use them. In this configuration, the best result is obtained by organizing the PV cells in small groups with the individual cells in each group connected in series. These formed groups should then be connected parallel to each other in order to increase the total current.

This concludes the description of the directing and concentrating solar energy collectors 120,122 themselves. A detailed description of a complete energy collection system and various related aspects will now follow.

SOLAR ENERGY SYSTEM

Figure 39:
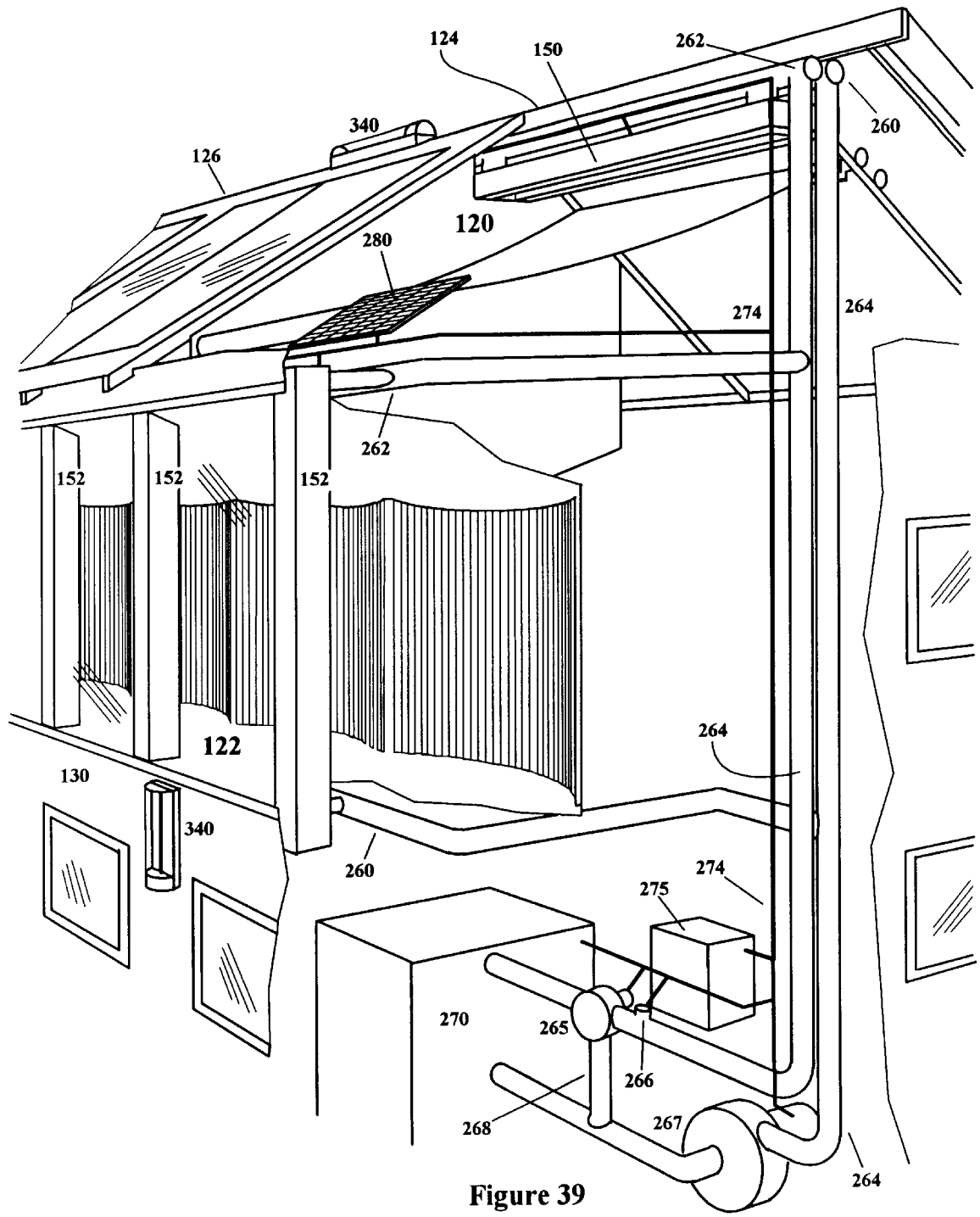
FIG. 39 is a perspective view of the invention showing the installation of heat transport ducts, cables, and the control equipment.

Referring now to FIG. 39, a complete installation of multiple horizontal 120 and vertical 122 tracking collectors with heat transport ducts 264, electrical cabling 274, and control equipment 275, in a building 124, is shown. A heat transport loop is provided where air is used as a heat transport fluid. The heat extracting, or using equipment 270 is not specified by the present invention, but is assumed to be either a heat storage or a heat exchanger. A two-way control damper 265 is installed close to the heat using equipment 270, such that the air is either circulated through the heat using equipment 270 or through a bypass duct 268, bypassing the heat using equipment 270. A blower 267 draws air from either the heat using equipment 270 or from the bypass duct 268, blowing it out through ducts 264 to entry headers 260 at the energy converters 150,152. After passing through the converters 150,152 the air is forced through the exit headers 262, then through a duct 264 and back to the control damper 265, thus forming a closed heat transport loop. To measure the temperature of the air in the loop, a system temperature sensor 266 is mounted in the duct 264, just before the air enters the control damper 265. A control box 275 is provided for the micro processor (not shown) components and for the electrical power conditioning devices. A small flat PV panel 280 is also provided on the roof 126. Since both horizontal 120 and vertical 122 collectors are present, two radiation scanners 340 are provided. One is mounted horizontally on the roof 126 and the other is mounted vertically on the same wall 130 as the vertical collectors 122. Both are facing the sun 100 in the same way as their respective collectors 120,122 are.

Figure 40:
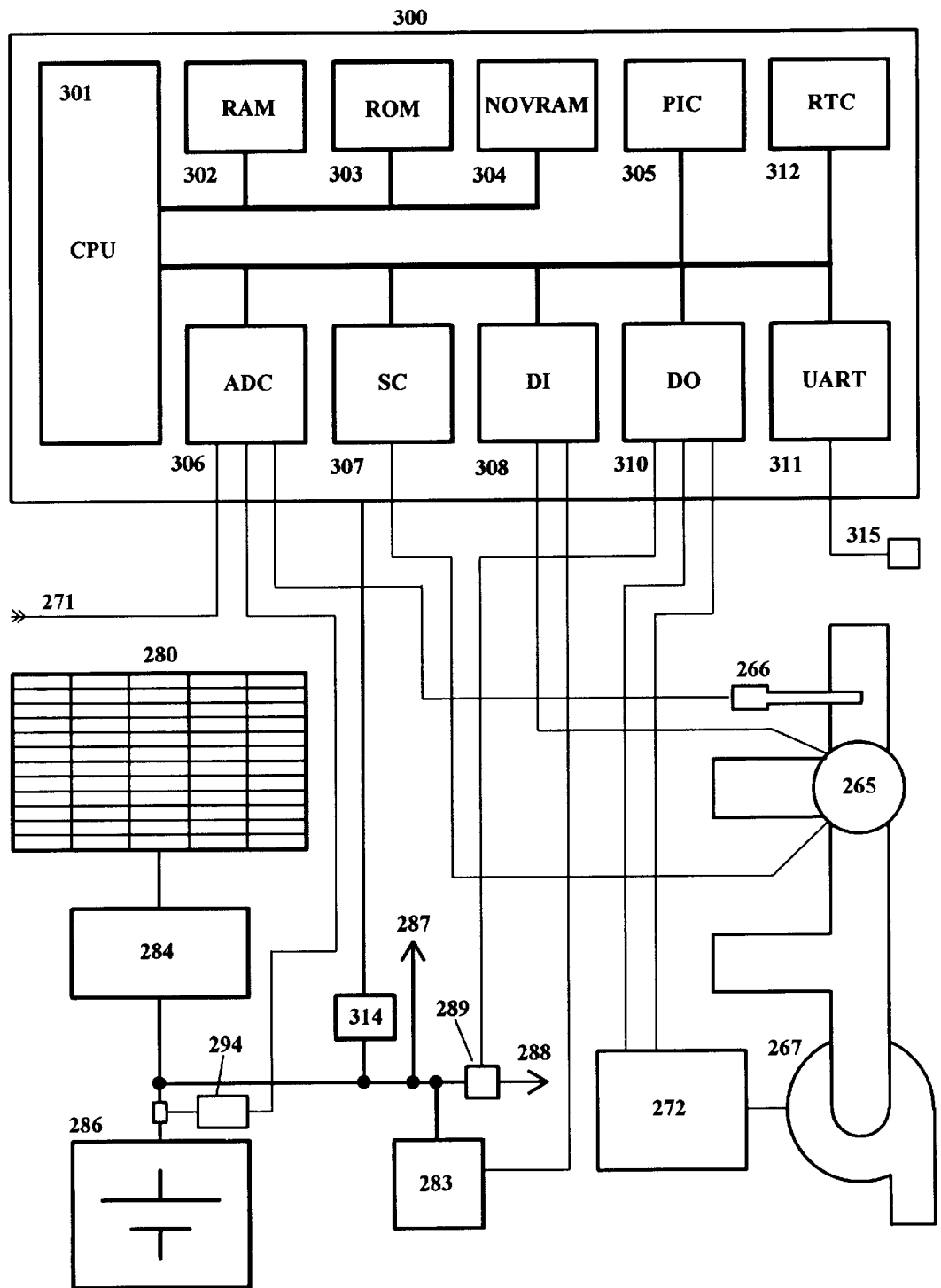
FIG. 40 is a block diagram showing a micro processor with its power supplies and a heat transport loop control components.

In FIG. 40 a micro processor system 300 with a central processing unit 301 (CPU), random access memory (RAM) 302, read only memory (ROM) 303, and non volatile (NOVRAM) memories 304 is shown. Within the micro processor system 300, optionally an accurate real time clock 312 may also be provided. To enable the micro processor 300 to obtain measurements and control the process, various input and output devices are provided. A multiple channel analog to digital converter (ADC) 306 is used for reading analog signals, such as temperatures. Multiple stepper motor controllers (SC) 307 are used to drive stepper motors, such as positioning the reflectors and dampers. A multiple channel digital input device (DI) 308 is provided for reading the position of the switches and other digital sensors. A multiple channel digital output device (DO) 310 is used to control a power distribution relay 289 and a speed controller 272. Four channels from the micro processor's programmable interrupt controller (PIC) 305 are made externally available, to be used with the radiation scanners 340 (not shown in FIG. 40). A serial universal asynchronous communication receiver transmitter (UART) 311 is provided so that the micro processor 300 can communicate with a personal, or other, computer for the purposes of installation and maintenance.

The micro processor's 300 read only memory 303 is installed with software to control and operate the various aspects of the system. Essentials of the software will addressed later in the description.

Also in FIG. 40 a block diagram of a main control loop and system power supplies are shown. The system temperature sensor 266 is wired to one of the ADC 306 channels so that the micro processor 300 can read the transport loop temperature. A home position of the control damper 265 is signaled by a digital signal, wired to a DI channel 308. A control damper 265 is positioned with one SC 307. The speed of the blower 267 is controlled by a motor speed controller 272, which is controlled by two Do 310 channels. When both DO 310 channels are activated at the same time, the speed is reset to zero. From then on, one DO 310 channel is pulsed to increase the speed, and the other is pulsed to decrease the speed. A flat PV panel 280 feeds an auxiliary regulator 284 to provide DC power to the micro processor 300 and other devices. Raw DC power is further regulated with a micro processor power supply 314, before feeding the micro processor 300. A battery 286 provides power to the micro processor 300 during nights and cloudy periods. A current probe 294 is connected in series with the battery, and feeds to one of the ADC 306 channels. This allows the micro processor 300 to determine if the battery 286 is being drained too much. A line regulator 283 is used to obtain power from a utility grid (not shown). One DI 308 channel is wired to the line regulator 283, so that the micro processor 300 can detect the presence of utility power. DC power distribution 288 to the other devices is wired through a power distribution relay 289, which is deactivated by the micro processor 300 via one DO 310 channel to save battery power when no significant solar radiation or other power is available. A safety circuit power distribution 287 is routed directly from the main DC power bus to assure the safety devices are always powered.

A source of demand temperature signal 271 wired to the ADC 306 depends on the heat using equipment (not shown in FIG. 40). It can be as simple as a temperature sensor in the heat storage. The RS232 connector 315 is provided for an external computer connection and is wired to the UART 311.

Figure 41:
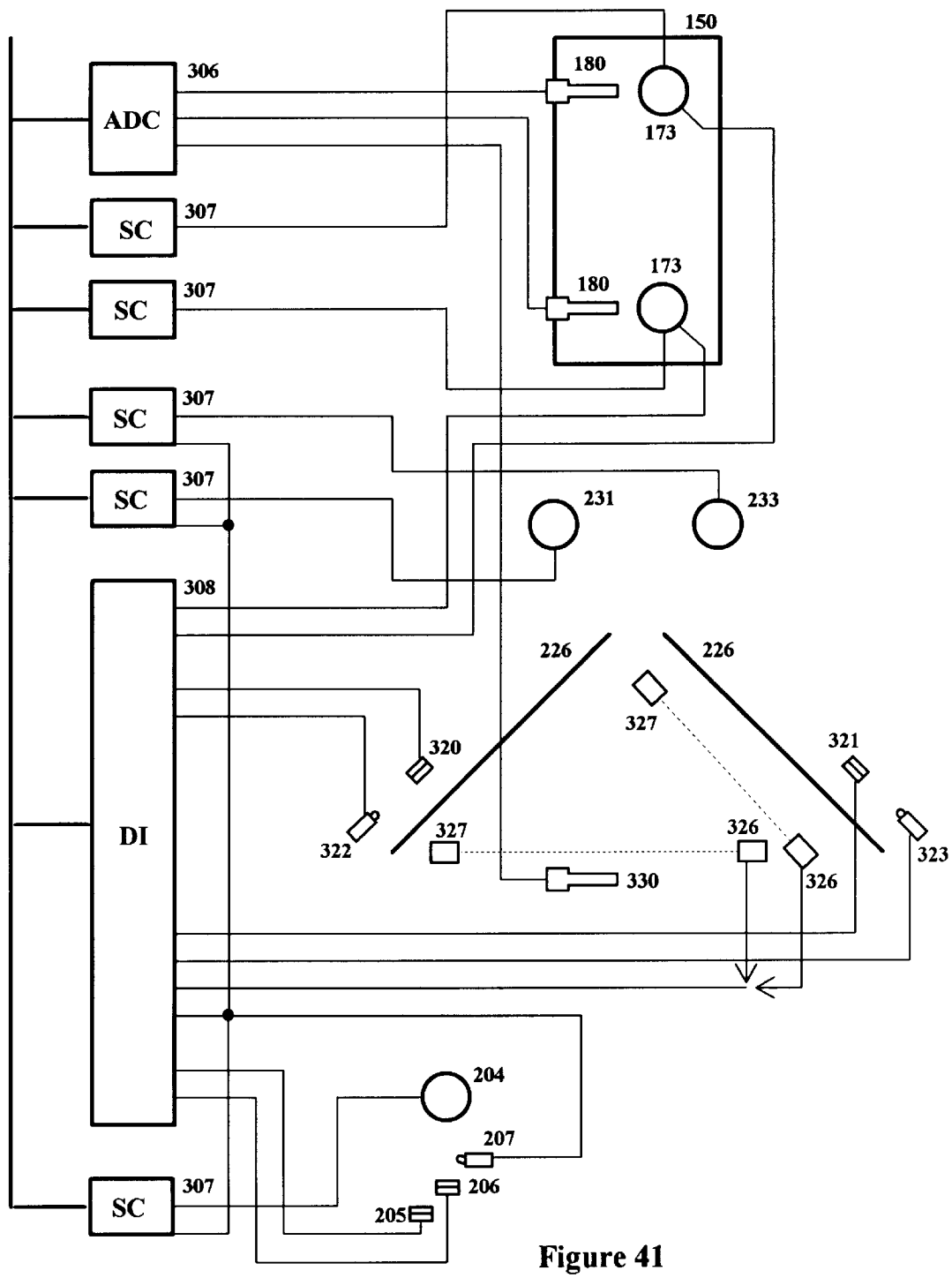
FIG. 41 is a block diagram of micro processor connections to control the positioning of a reflective sloping sheet.

FIG. 41 shows a block diagram of the controls used in the horizontal collectors. Two exit temperature sensors 180 in the energy converter 150 are wired to their respective ADC 306 channels. Two exit damper actuators 173 have their home position sensors wired to two DI 308 channels, so that the micro processor can detect when the dampers are closed. To control the damper actuators 173 two stepper controllers 307 are wired to drive the actuators 173. The stepper motors 231, 233 are wired to their respective stepper controllers 307 to achieve the movement of the elevators 214,220 (shown in FIG. 18). To detect and calibrate the position of the elevators 214,220, all switches 320, 321, 322, 323 along the rails 226 are wired to their dedicated DI channels 308. The slope calibration infrared receiver 326 is wired to one DI 308 channel for the proper calibration of sheet length. The ambient temperature sensor 330 for the temperature compensation calculations is wired to one ADC 306 channel. The sheet tensioning stepper motor 204 is wired to its corresponding SC 307 to allow the micro processor 300 to control tensioning of the sheet. The sheet tension switches 205, 206 in the sheet tensioning assembly are wired to their DI 308 channels. The limit switch 207 in the tensioning assembly is wired to one DI 308 channel and to the stepper controllers 307 controlling the sheet tensioning motor 204, and the elevator motors 231, 233 such that if the limit switch 207 is ever activated, the stepper motors can no longer be operated. This requires manual intervention, but it is acceptable since it would be a highly abnormal situation. The limit switch 207 is never activated unless some malfunction occurs. On an installation without the front elevator 214 its corresponding control components are left out (231, 320 & 322).

Figure 42:
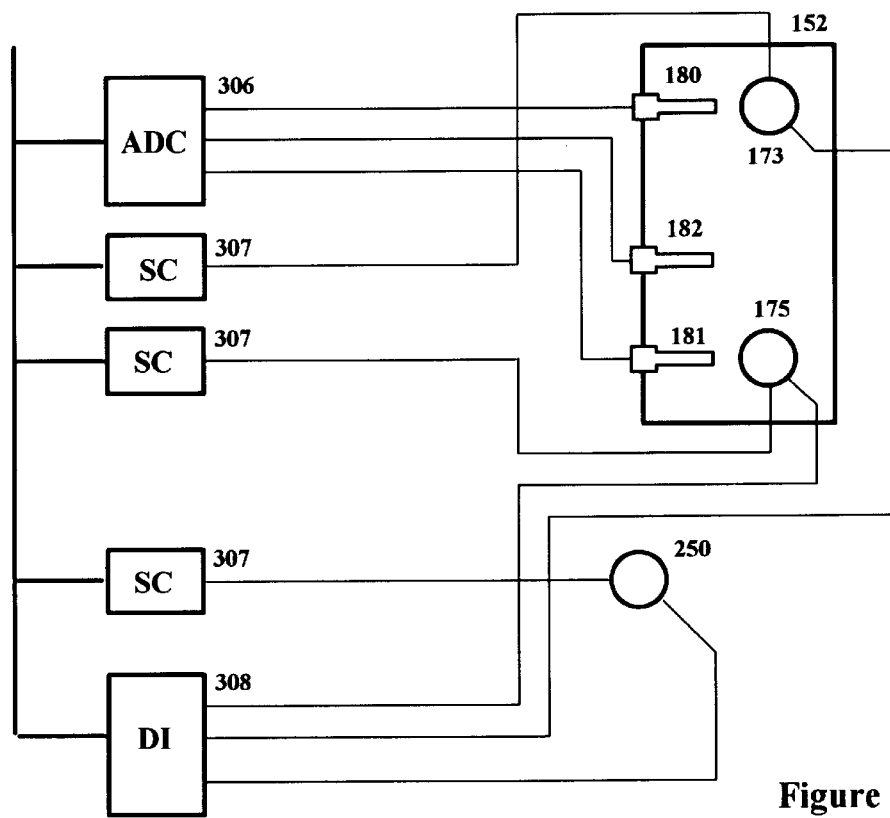
FIG. 42 is a block diagram of micro processor connections to control the rotation of the reflective strips.

In FIG. 42 an equivalent block diagram is shown for a vertical solar energy collector. In a vertical energy converter 152 the two heat chamber temperature sensors 181, 182 are wired to two ADC channels 306, and the exit temperature sensor 180 is wired to its ADC channel 306. The bypass damper actuator 175 and the exit damper actuator 173 both have their home position sensors wired to two DI channels 308. Movement of the actuators 173, 175 is accomplished with two stepper controllers 307. The reflective strip actuator 250 has an internal home position sensor which is wired to one DI channel 308, so that the micro processor can calibrate the position of the reflective strips 240. The strip actuator 250 is moved with a stepper controller 307 connected to it.

Figure 43:
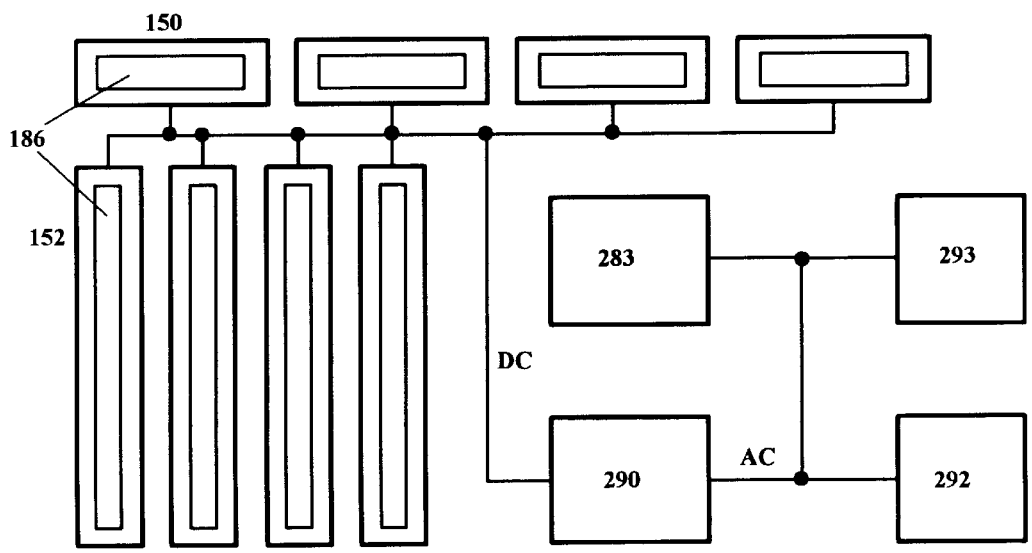
FIG. 43 is a block diagram of an energy distribution system for electrical power from the energy converters.

FIG. 43 shows a block diagram of the electrical power distribution from the energy converters 150, 152. The high temperature PV panels 186 are connected in parallel and in series as described previously, and feed DC power to a power conditioner 290. The line regulator 283 is used for powering the micro processor 300 and other equipment, as discussed before. The power conditioner 290 generates utility grade AC power which is used for local AC loads 293 in the building, with the excess power fed to a utility grid 292.

Figure 44A:
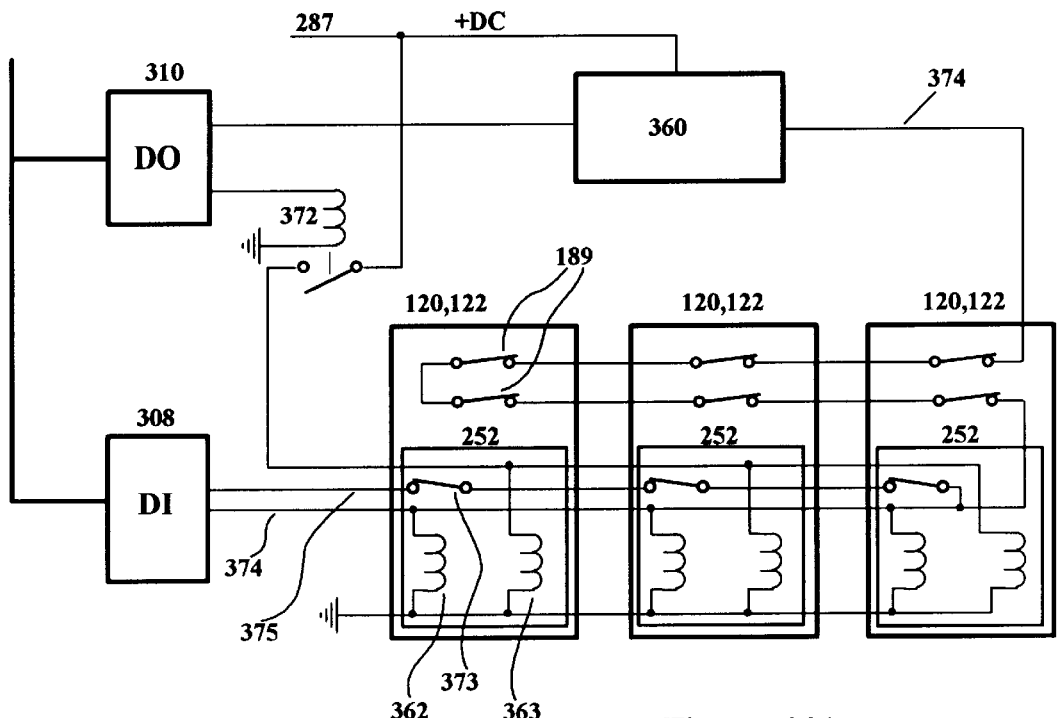
FIG. 44A is an electrical diagram of a safety circuit used in the collectors with tracking concentrating reflectors.

FIG. 44A depicts a safety circuit, an essential part of the aforementioned safety system. It is the heart of the safety system for the tracking collectors 120,122 being capable of generating very high temperatures. A safety timer 360 is electrically connected to a DO channel 310 of the micro processor. The micro processor keeps regularly toggling this output. If it stops toggling the line, the safety timer 360 times out and de-energizes the safety signal 374, which is wired through a series of over temperature switches 189, located in the collectors 120,122. From there, the circuit continues to the holding solenoids 362 of the safety clutches 252, and to a DI channel 308 of the micro processor. Thus, if the software in the micro processor stops functioning, or if it detects a serious failure, and stops toggling the safety timer 360, or a dangerously high temperature is developed in one of the heat chambers, the holding current from the solenoids 362 in the safety clutches 252 is removed. As described before, the safety clutches 252 are disengaged and the concentrating reflectors are sent to their "off" positions, terminating the concentration of solar radiation. An arming solenoid 363 in each safety clutch 252 is used to re-engage the clutches 252 by activating an arming relay 372, either after the circuit has been tripped, or during initial power up sequence. A clutch confirmation switch 373 in each safety clutch 252 is connected when the clutch 252 is engaged. These switches 373 are wired in series providing indication via a DI channel 308 to the micro processor if any of the clutches 252 have become disengaged.

Figure 44B:
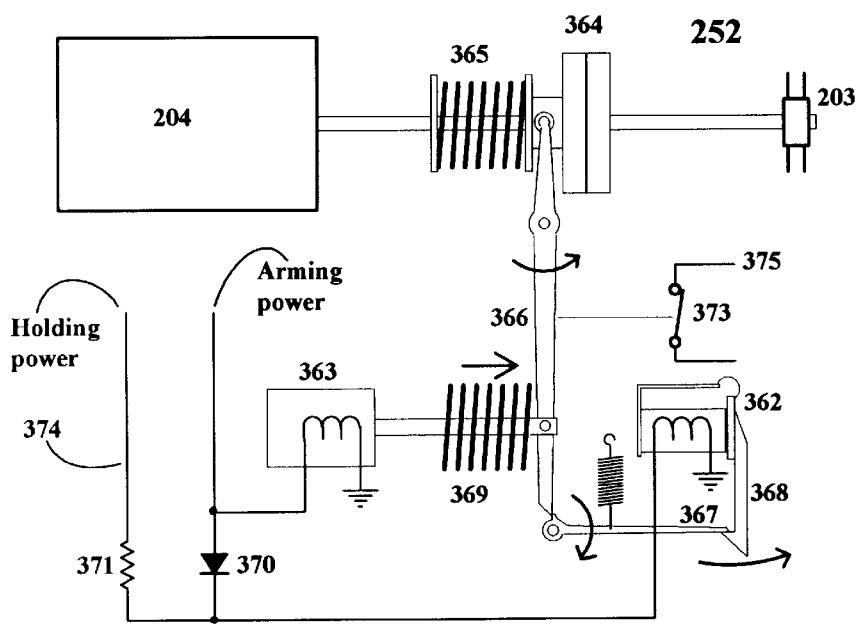
FIG. 44B is a diagrammatic representation of a safety clutch used in the collectors with tracking concentrating reflectors.

It is not known if a commercially available safety clutch 252 with the described capabilities can be found. Because of this, the principle of such a clutch 252 is shown with a diagram in FIG. 44B. The stepper motor 204 is connected to the gear set 203 through a clutch 364, which is held engaged by the force from a holding spring 365. A clutch release lever 366 is normally held behind a detent lever 367, keeping the clutch 364 engaged. The detent lever 367 in turn is held against a notch in a trigger lever 368, which is held in position by the holding solenoid 362. When the safety circuit trips, and the holding power is lost, movement of various parts, indicated by the arrows, occurs. The trigger lever 368 moves away from the detent lever 367, which in turn is tilted by the force originating from a release spring 369, thus releasing the clutch release lever 366. The ratio of the forces from the two springs 365,369 is such that the clutch 364 will disengage. The clutch release lever 366 further actuates a clutch confirmation switch 373, providing an indication of the current position of the clutch 364. Once disengaged, the clutch 364 can be re-engaged by applying a current trough the arming solenoid 363. The arming circuit is also connected to the holding circuit via diode 370, sending full arming voltage to the holding solenoid 362. Once arming has occurred, the holding solenoid 362 will receive small current from the holding circuit via resistor 371. This organization allows the holding current to be kept very small, such that the circuit can be operated from a battery 286 (shown in FIG. 40) without draining it at an unacceptable rate.

FIGS. 45–51 show various views and diagrams of operating principles of a radiation scanner 340. The scanner's 340 installation in relation to the solar energy collectors 120,122 is illustrated in FIGS. 1, 25, & 39.

Figure 45:
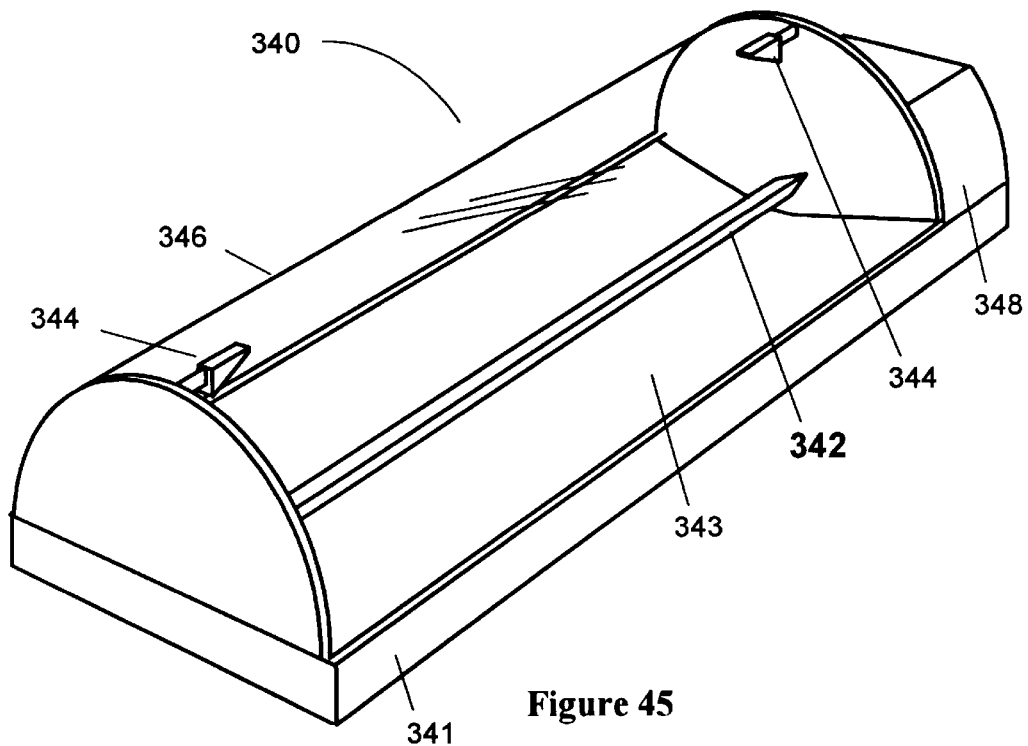
FIG. 45 is a perspective view of a radiation scanner.

FIG. 45 illustrates the general appearance of the radiation scanner 340. On a metal or polymer scanner chassis 341, a transparent protective cover 346 on the side facing the sun, and a gear box 348 are shown. A substantially long, segmented rod 342, under the transparent cover 346, having a cross sectional shape of an equilateral triangle, with each side of the triangular segmented rod 342 being highly reflective, is rotated around its axis.

Figure 49:
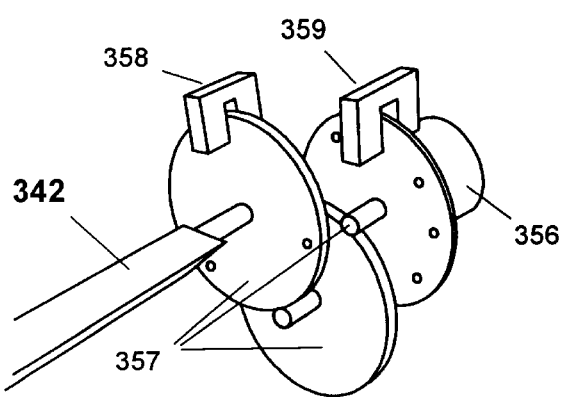
FIG. 49 is a perspective view of a motor with a gear set used to rotate the segmented reflector rod together with angular sensors used to determine the precise relative elevation angle.

FIG. 49 depicts how rotation is accomplished. A scanner motor 356 and a scanner gear set 357, are housed in a gear box 348 at one end of the instrument. A first angular pulse generator 358 is used to generate a pulse at every 120° of rotation of the rod 342. A second angular pulse generator 359 is used to give pulses at regular angular intervals of rotation of the rod 342 at the rate of desired fine resolution of the relative elevation angle divided by two. These pulse generators may be of either optical or magnetic type sensors, with means for detecting the rotational movement and generating pulses at regular angular intervals.

Figure 50:
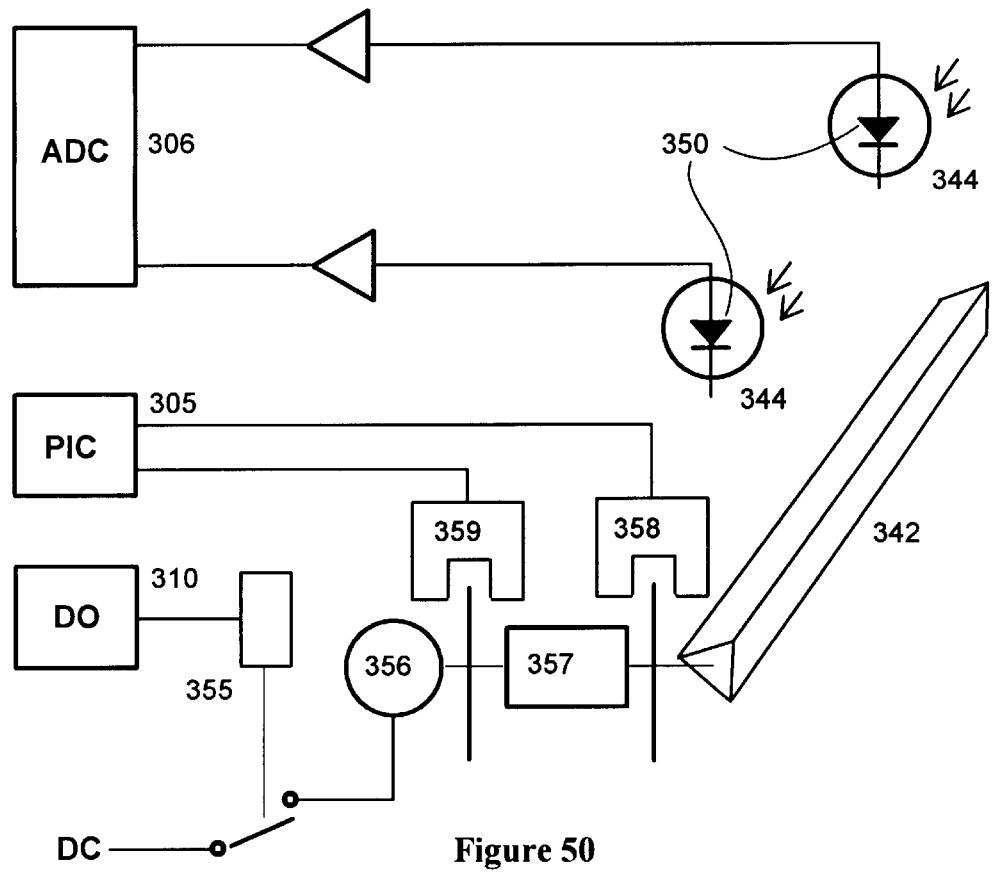
FIG. 50 is a block diagram showing the electronic components of a radiation scanner and their connections to a micro processor.

In FIG. 50, the signals from these two pulse generators 358,359 are wired to a micro processor via two interrupt channels 305. Two radiation sensors 344 are placed away from the rod 342, approximately at the ends of the rod 342 and substantially at the same side as the sun. These two radiation sensors 344 are wired to the micro processor via ADC channels 306.

Figure 46A:
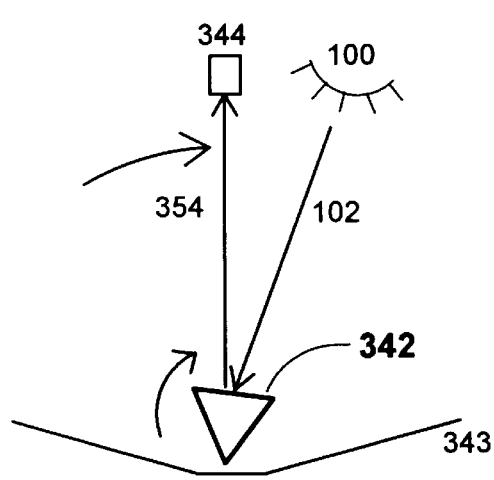
FIGS. 46A & 46B are diagrammatic representations of a radiation scanner and principles of its operation.

As shown with the arrows in FIG. 46A, when the rod 342 is rotated, a beam 354 of direct solar radiation 102 reflected from the rod's 342 side, is also rotated, at angular speed twice to that of the rod 342 itself. During its rotation, at some angle, the beam 354 from the side of the triangular rod 342 is briefly aligned with, and strikes at least one of the radiation sensors 344. As there are three equal sides to the rod 342, the beam 354 will be reflected to at least one of the sensors 344 three times during each full rotation of the rod 342. When the beam 354 of direct radiation is not aligned with the sensor 344, relatively low intensity diffused radiation is reflected to the sensor 344, providing a background radiation reading. When the beam 354 is aligned with the sensor 344, high intensity of direct solar radiation 102 causes significantly higher radiation energy reading.

Figure 51:
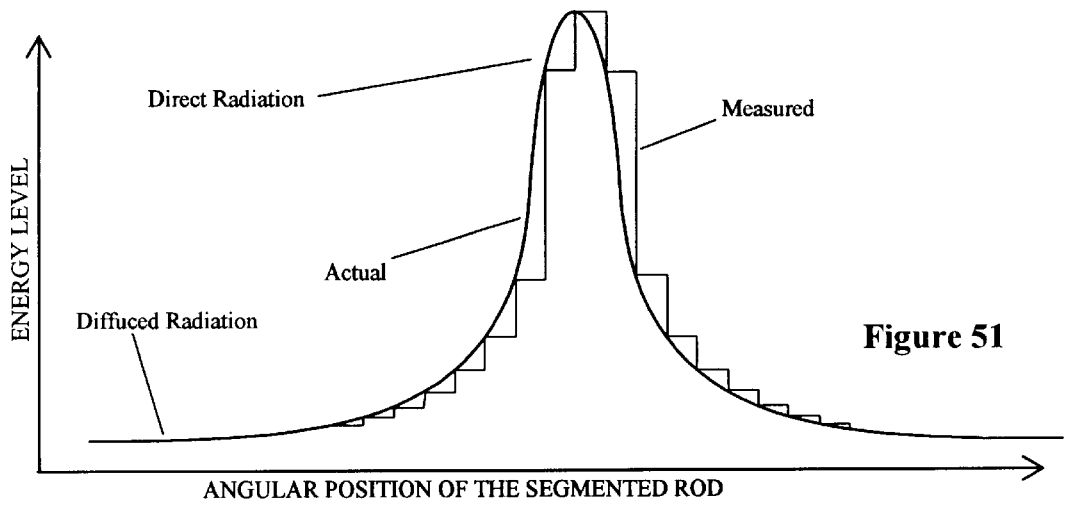
FIG. 51 is diagram showing a typical radiation flux curve produced by a radiation scanner.

FIG. 51 depicts, where the actual radiation energy levels, and those measured by the micro processor 300 are plotted as a function of changing angle of the segmented rod 342.

Figure 46B:
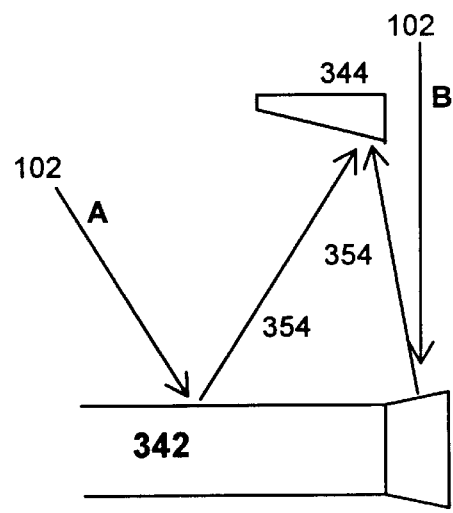

Two radiation sensors 344, as opposed to one, may be used so that the apparatus may be made shorter, and that the shadows caused by the sensors 344 themselves are easier to accommodate. When the sun 100 is directly in front of the scanner 340, the shadows cast by the radiation sensors 344 fall on the segmented rod 342. To reduce the "dip" in the energy level curve, the ends of the rod 342 are made slightly thicker, as shown in FIG. 46B, so that the radiation 102 in a form of beam 354 reflected from the ends of the rod 342 will strike the radiation sensors 344. Another way of dealing with the shadow of the radiation sensors 344 is to place the sensors 344 at an offsetting angle around the segmented rod 342, so that their shadows fall on the rod 342 at different relative elevations. Yet another way to deal with this problem, is to install the scanner 340 such that the sun can never be directly above it. Because of the curved path of the sun's 100 movement, this is easily accomplished in many installations.

Figure 47:
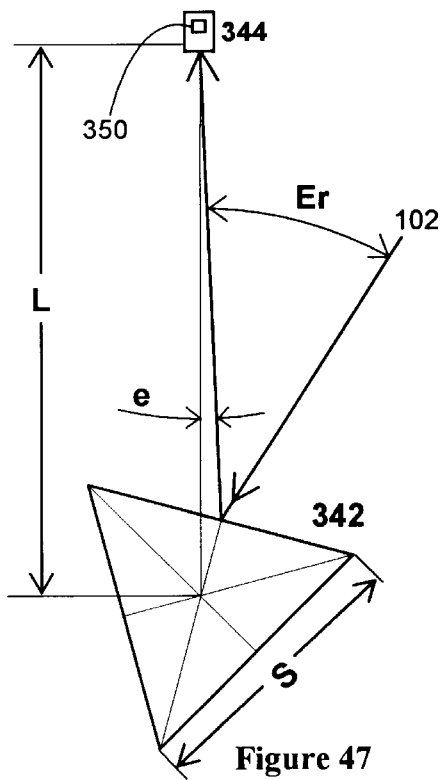
FIG. 47 is a diagrammatic view of a segmented reflector rod and angular calculations used in determining the relative elevation angle.

Since the rod's 342 segmented surfaces move around the center axis of the rod 342 at some distance, the calculation of the relative elevation angle is a little more involved than just doubling the angular change of rod's 342 movement. This is depicted in FIG. 47, where the small angular error, indicated with e is shown. A full equation (accounting for the above error) to compute the radiation incident angle, using a triangular rod 342, is as follows:

$$Er = 2\left(\alpha + \arctan\frac{0.28867514 s\sin\alpha}{L - 0.28867514 s\cos\alpha}\right)$$

where ER is a zero centered incident (or relative elevation) angle, $\alpha$ is the rod's 342 segment's deviation from the zero angle (in degrees), s is the width of the rod's segment (or side), and L is a distance from the center of the rod 342 to the active sensor element 350 of the radiation sensor 344. The zero reference point is such that the angle a is zero when the segment of the rod 342 is perpendicular to the line between the rod's 342 center and the center of the radiation sensor 344. Using positive values for the deviation in first direction, and negative values in the second direction, gives an incident angle with an equal sign, positive in the first direction and negative in the second direction.

Figure 48A:
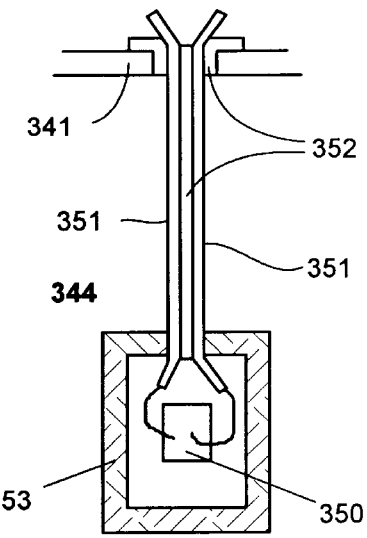
FIG. 48A is cross sectional top view of a radiation sensor assembly used in measuring the relative elevation angle.
Figure 48B:
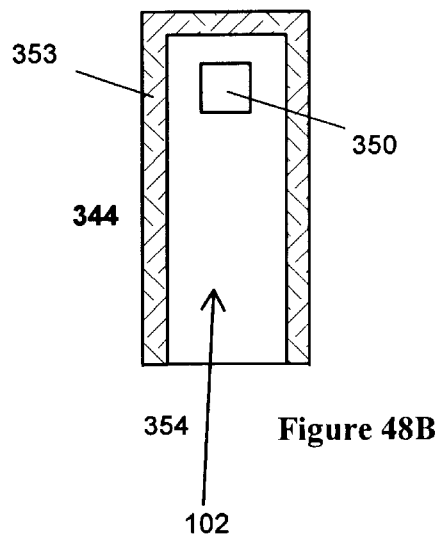
FIG. 48B is a cross sectional side view of a radiation sensor assembly used in measuring the relative elevation angle.

To prevent reflections from nearby objects from distorting the measurements, two means are used. One, a non reflective base plate 343 is provided behind the segmented rod 342 (FIGS. 45 & 46A). It is made of sheet metal painted with dark flat paint, thus absorbing most of the radiation 102 striking it. Two, shown in FIGS. 48A and 48B, a radiation sensor assembly 344 encloses the active sensor element 350 in a tall radiation sensor housing 353 having non reflective inner walls (FIGS. 48A & 48B). Thus, the angle of incoming radiation 102 is greatly reduced, preventing radiation from the sides of the apparatus from entering the radiation sensor's 344 active sensor element 350.

The radiation sensor 344 is attached to the scanner chassis 341 with a thin arm which is made of two metal plates 351, sandwiching an insulation layer 352 in between the plates 351. The metal plates double as electrical conductors for the active sensor element 350. Electrical insulation 352 is also provided between the plates 351 and the chassis 341. In this way the radiation sensor's 344 supporting arm produces only a faint shadow on the segmented rod 342 when the sun is at a center relative elevation.

Electronic components, and their connections, are further depicted in a block diagram in FIG. 50. The radiation sensors' 344 active sensor elements 350 are connected via amplifiers to two ADC channels 306 of the micro processor 300. As described before, both pulse generators 358,359 are connected to their PIC 305 channels. In addition to these and other features, which have already been discussed, a motor activation relay 355 is shown. This relay 355 connects a DC power supply to the scanner motor 356 rotating the rod 342, and is controlled by the micro processor 300 with a DO channel 310. This allows a program in the micro processor 300 to start and stop the scanner motor 356.

A program in a micro processor 300 is provided to receive and count the pulse generator 358,359 interrupts, reads and memorizes the radiation levels from both radiation sensors 344 for each angular position indicated by the interrupt from the second pulse generator 359. At each one third (⅓) revolution of the rod, at a 120° interrupt from the first pulse generator 358, an incident angle is computed, based on the center of high intensity readings (FIG. 44) and the angle of the rod 342 known at the time of those readings. This incident (or relative elevation) angle is calculated for multiple sizes of radiation acceptance window in order to obtain most optimum positioning for different solar collectors.

From the foregoing, it should be readily understood that by selecting components with proper dimensions and response characteristics, setting the width and number of segments on the rod 342 and by selecting its speed, different results in measurement accuracy, resolution, and sample intervals can be obtained.

SOFTWARE

The most pertinent, components and features of the software (or firmware) needed to operate the directing and concentrating solar energy collectors are now described. Reference will be made to components previously described.

The purpose of this software description is to show how to achieve the goal of controlling and operating the described solar collectors without describing a real time kernel or related software components.

Figure 52:
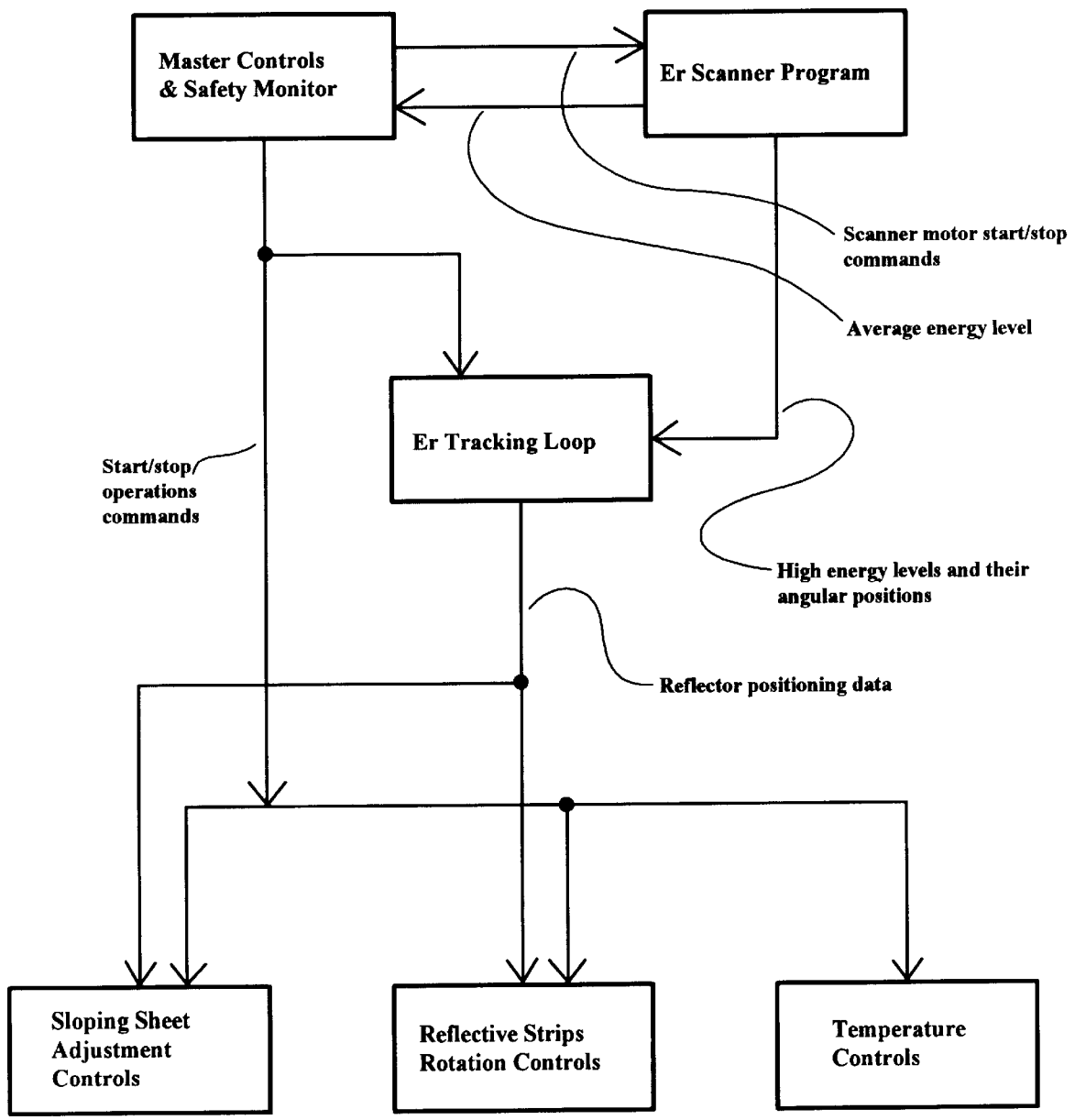
FIG. 52 is a software block diagram showing the major components of the software used to control the reflector tracking and energy conversion processes.

A majority of the software has to deal with tracking the movement of the sun and positioning and adjusting the concentrating reflectors previously described. FIG. 52 shows a block diagram of the major software components to be described. A "Master Controls & Safety Monitor" includes the main system level controls. It also includes a main safety monitor, which is part of the mechanism controlling the safety circuit and the safety clutches 252. An "Er Scanner Program" is a set of software routines operating the radiation scanner 340. It is started and stopped by the "Master Controls & Safety Monitor." In turn, the "Er Scanner Program" provides radiation energy level readings back to the "Master Controls," and also provides an "Er Tracking Loop" with high radiation energy level readings, and angular positions of where those readings occurred. There may be multiple "Er Tracking Loops," which process the radiation level and angle information for a specific collector or group of collectors of the same type and orientation, and provides reflector positioning data for positioning of the concentrating reflectors. The "Sloping Sheet Adjustment Controls" is a state driven set of procedures providing adjusting means for the sloping sheet 190 concentrating reflector 110. A "Reflective Strips Rotation Controls" is an equivalent set, providing adjusting means for the reflective strip 240 concentrating reflector 112. A "Temperature Controls" includes all temperature controls, including those used to optimize the operation of the individual heat chambers 164, and those used to optimize the operation of the entire heat transport loop.

The state diagrams and individual procedures found within these major blocks will now be described in more detail. This description is mostly organized to flow in "bottom up" fashion, so that the operation and responses of the primitive components are already familiar when looking at the details of the commanding components.

Figures 53, 54:
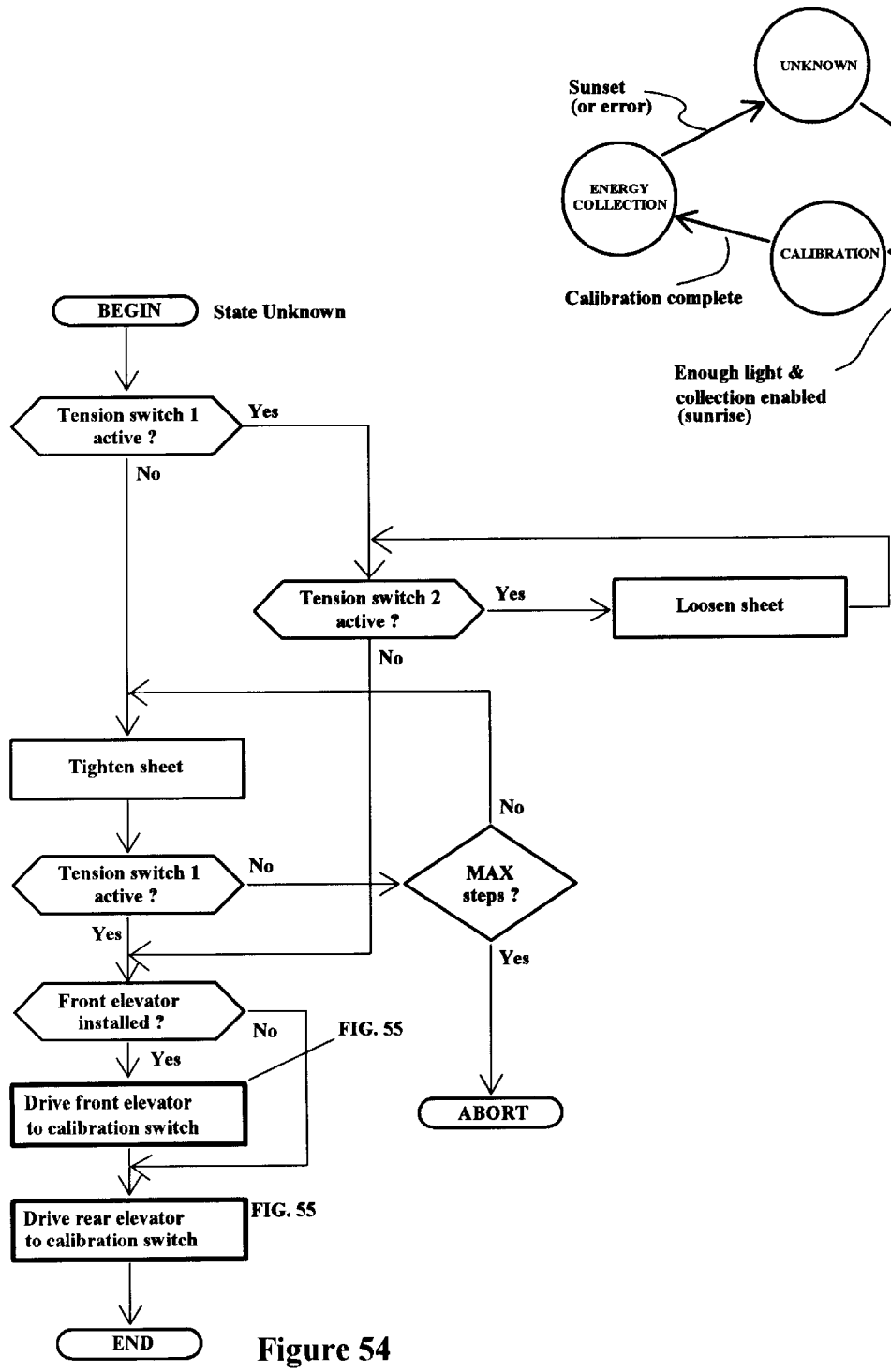
FIG. 53 is state diagram showing the states of the sloping sheet positioning process.
FIG. 54 is a flow diagram representing the "unknown state" in the sloping sheet positioning software.

In FIG. 53 a state diagram for "Sloping Sheet Adjustment Controls" is shown. The "UNKNOWN" state is a transitionary state used for executing a major initialization in positioning of the sloping sheet 190. This state is automatically entered after power up initialization. It is also forced to execute when the radiation energy level drops below the "evening threshold" at sunset, and on various error conditions. Once entered, the "UNKNOWN" state includes attempts to drive the sloping sheet 190 to a known position. The "PARKED" state is entered automatically, once the sloping sheet 190 is in a known position. In the "PARKED" state, the sheet 190 is kept at that known position, until a signal is received from higher level to exit the state, such as on sunrise. A "CALIBRATION" state, again, is a transitionary state, in which the calibration of elevator 214,220 positioning, along with the calibration of sheet 190 length, takes place. On completion an exit is made to an "ENERGY COLLECTION" state. In the "ENERGY COLLECTION" state, the sloping sheet 190 is continuously positioned to track the movement of the sun 100, in order for the sheet 190 to function as a concentrating reflector 110. A major error or loss of radiation will send the state machine back to "UNKNOWN" state.

As described in the theoretical section of the sloping sheet 190 concentrating reflector 110 description, the initial measurements for the design of elevators 214 and 220 positions and sheet 190 lengths are obtained by repeatedly calculating and plotting the catenary curve 192 of the sheet 190 for various relative elevation angles 109. The obtained values are confirmed on a working prototype of the sloping sheet collector 120. The confirmation can be done by using a laser device to mimic solar radiation. The sheet length values are normalized to a reference temperature of 25° C., which is used as a reference point for the calculation of sheet temperature expansion. It should be noted that any temperature value that makes sense, can be used. For example, if the manufacturer of the sheet material uses 20° C., then 20° C. reference value makes sense, and should be used. The obtained sheet length and elevator position values are compiled into a table and stored in the micro processor's 300 read only memory. An example of the form of this table is given below in a Sloping Sheet Calibration Table.

Sloping Sheet Calibration Table

| Er Angle | Sloping Sheet Length @ 25° C. | Total Sheet Length @ 25° C. | Elevator Position | Comment |
|---|---|---|---|---|
| 0 | 10000.0 | 21800.0 | 1800.0 | |
| 1 | 10010.1 | 21800.0 | 1780.0 | |
| 2 | 10020.2 | | 1760.0 | |
| . | . | . | . | |
| . | . | . | . | |
| 89 | 12040.3 | 21895.0 | 20.0 | |
| 90 | 12040.5 | 21895.0 | 0.0 | ??_ELEV_POS_90 |
| 91 | 12040.3 | 21895.0 | 20.0 | |
| . | . | . | . | |
| . | . | . | . | |
| 178 | 21205.5 | 21990.0 | 1760.0 | |
| 179 | 21205.8 | 21990.0 | 1780.0 | |
| 180 | 21206.1 | 21990.0 | 1800.0 | REF_ANGLE |

It should be noted that the values in the presented table example are not from a real system. Rather, they are more or less random numbers. The values are organized to be indexed by small intervals of relative elevation angle 109. For each relative elevation 109 in the table, the nominal sloping sheet length (Sloping Sheet Length), nominal total sheet length (Total Sheet Length), and the elevator position are given. The sheet length values can be given either, in units of length, or in number of stepper motor steps needed, as long as the same units for both length values are used. All values should be stored in floating point or in scaled integer format for good resolution. Since the tables is indexed using relative elevation angle 109, the Er reading need not be stored in the table. The nominal sloping sheet length represents the length of the portion of the sheet 190 hanging in the air, and the nominal total sheet length represents the length of the entire sheet 190, both being measured at the reference temperature. The reason the total sheet length is stored in the table is that by doing so the temperature compensation for sheet 190 adjustments can be made somewhat dependent on how much sheet 190 resides on a tensioning roll 202. The temperature compensation is computed based on this total length in the table. The elevator position values are implied by the relative elevation 109, such that Er less than 90° means the front elevator 214, and Er greater than 90° means the rear elevator 220.

To obtain a given value, the table is indexed with the relative elevation angle 109, by using it to interpolate the values between two relative elevation 109 entries in the table. In the ongoing description, and in the flow diagrams, a function for this purpose is referenced to, and looks as follows: value=interpol(relative_elev, VALUE_NAME) wherein: value is the interpolated value from the table, such as elevator position, relative_elev is a relative elevation angle 109 for which the value is requested, and VALUE_NAME defines which value is being requested.

Figure 55:
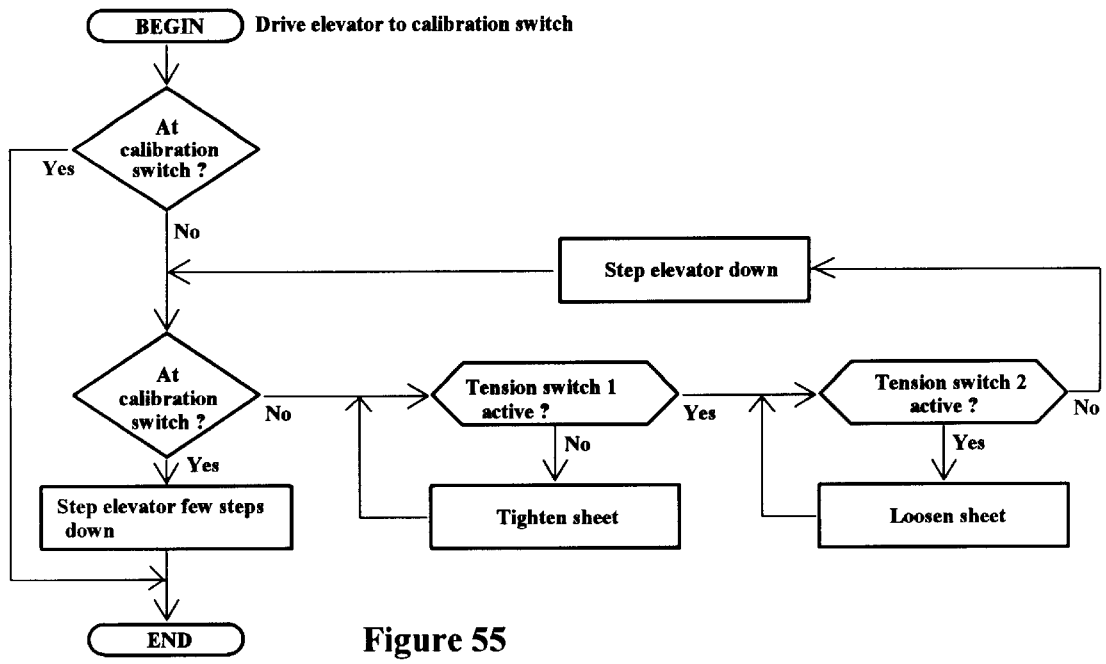
FIG. 55 is a flow diagram showing the software used to drive a sheet supporting elevator to a parking position.

The details of the "UNKNOWN" state are shown in a flow diagram in FIG. 54. Upon entry to this state, the sheet 190 is tightened by rotating the tensioning roll 202 until the tension switch one 205 activates. If, on initial entry, the tension switch one 205 is already activated, the tension switch two 206 is inspected. If it too is active, the sheet is loosened until the tension switch two 206 is no longer active. If the tightening of the sheet cannot be accomplished with a predetermined number of steps given to the stepper motor 204, the operation must be considered as having failed, and no further attempts are likely to correct the situation. Once the sheet 190 has been tightened, both elevators 214,220 are then driven to their respective calibration switches 320,321. This operation is detailed in the flow diagram in FIG. 55. While the elevator 214,220 is moving, the tensioning of the sheet 190 will change. To compensate for this tension change, the tension switches 205,206 are monitored between steps to move the elevator 214,220. If the tension switch one 205 becomes deactivated, the sheet is tightened. Equally, if the tension switch two 206 becomes activated, the sheet is loosened. Once the elevator 214,220 reaches the calibration switch 320,321, it is stepped downwards a few more steps. This is to make sure the calibration switch 320,321 remains activated, even if there are significant changes in ambient temperature. Completion of elevator 214,220 and sheet 190 movement in the "UNKNOWN" state leaves the sheet 190 practically straight at the bottom of the collector 120, terminating concentration by moving it to a very high altitude above the collector 120.

Figure 56:
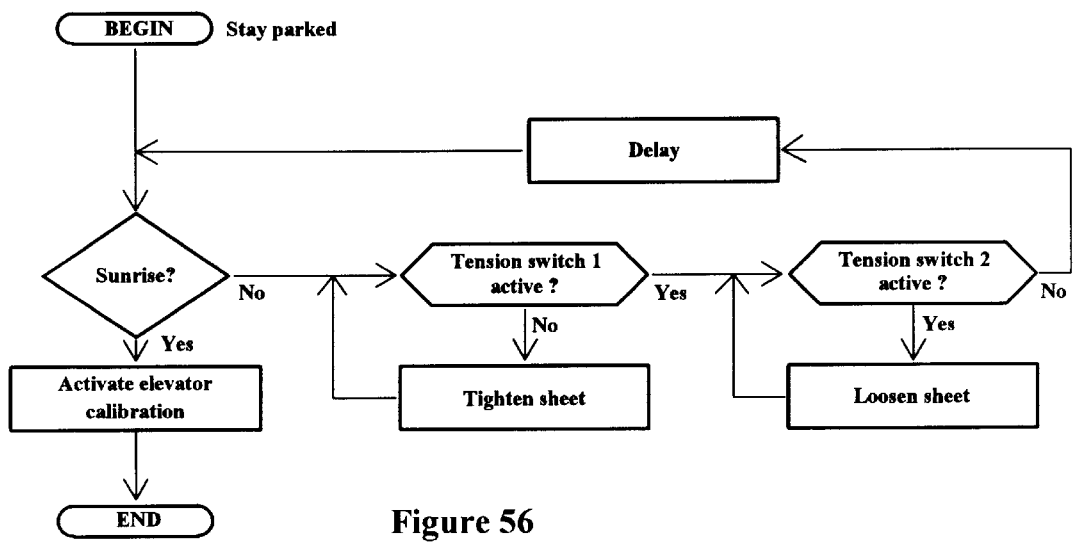
FIG. 56 is a flow diagram representing the "parked" state in the sloping sheet positioning software.

A flow diagram detailing the processing of the "PARKED" state is shown in FIG. 56. In this state, a signal to activate the collectors 120,122 from the "Er Tracking Loop" is simply waited for. While waiting, the tensioning of the sheet 190 is regularly checked. If the tension switch one 205 becomes inactive, the sheet 190 is tightened. If the tension switch two 206 becomes active, the sheet 190 is loosened. Once a signal to activate the collectors 120 is received from "Er Tracking Loop," the "CALIBRATION" state is entered.

Figure 57:
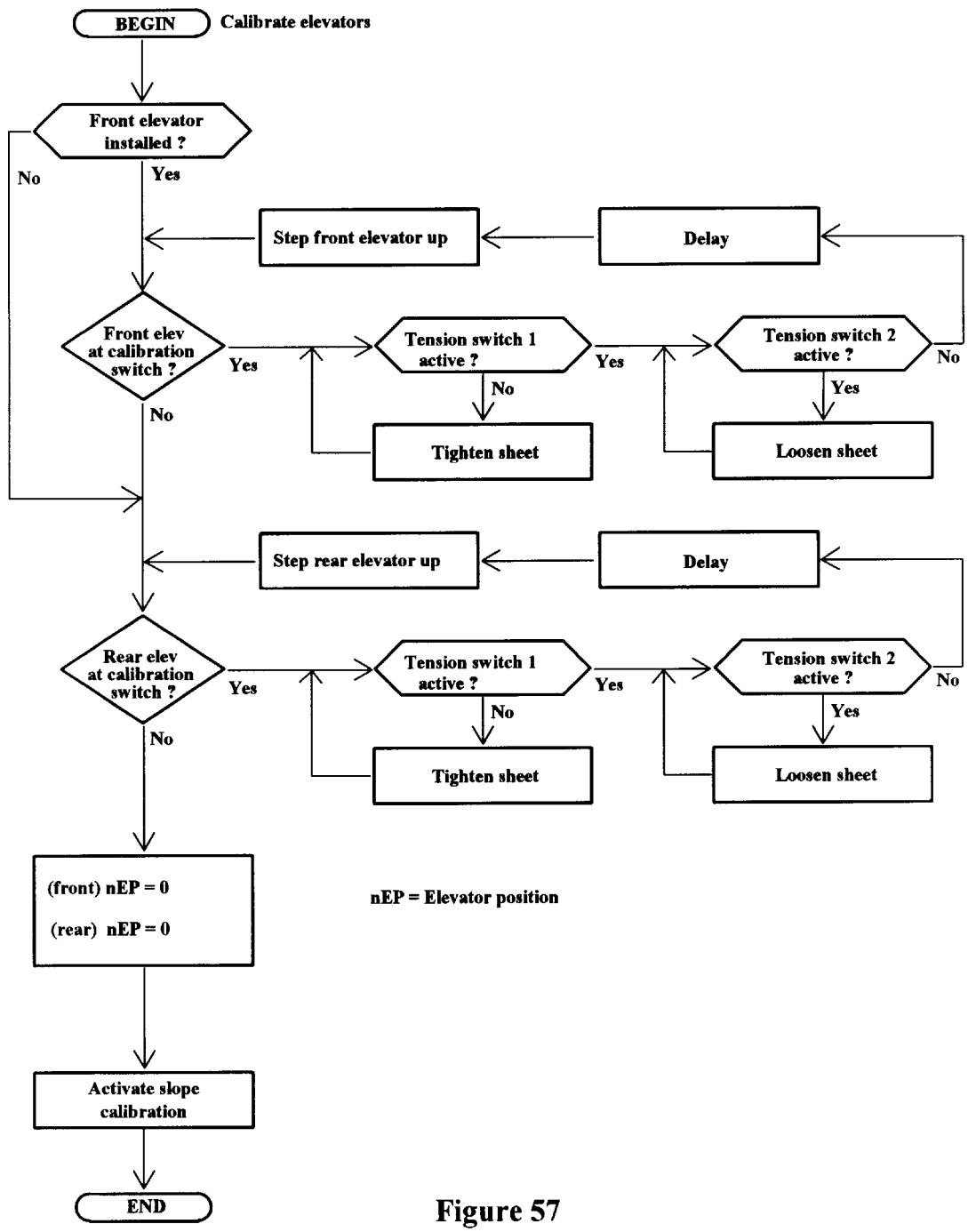
FIG. 57 is a flow diagram showing a process of calibrating the elevators in the "calibration" state of the sloping sheet positioning software.

In the "CALIBRATION" state (shown in FIG. 57), both elevators, front 214 and rear 220, are slowly lifted up until their calibration switches are deactivated. If the front elevator 214 has not been installed, any processing for it will be skipped. After each step command given to the elevator stepper motor 231,233 to move the elevators 214,220 up, both tension switches 205,206 are inspected. If the tension switch one 205 becomes deactivated, the sheet 190 is tightened. If the tension switch two 206 becomes activated, the sheet 190 is loosened. After inspecting the tension switches 205,206 the process then delays for a while to make sure that no resonant movement of the elevators 214,220 or the sheet 190 will result. When both elevators 214,220 have been driven just out of their calibration switches 320,321, the current elevator position variable nEP cleared to zero. From this point on, the variable nEP is used to track the position of the elevator 214,220. When upwards step is given, nEP is incremented, and when downwards is given, nEP is decremented. A slope calibration procedure is activated next.

Figure 58A:
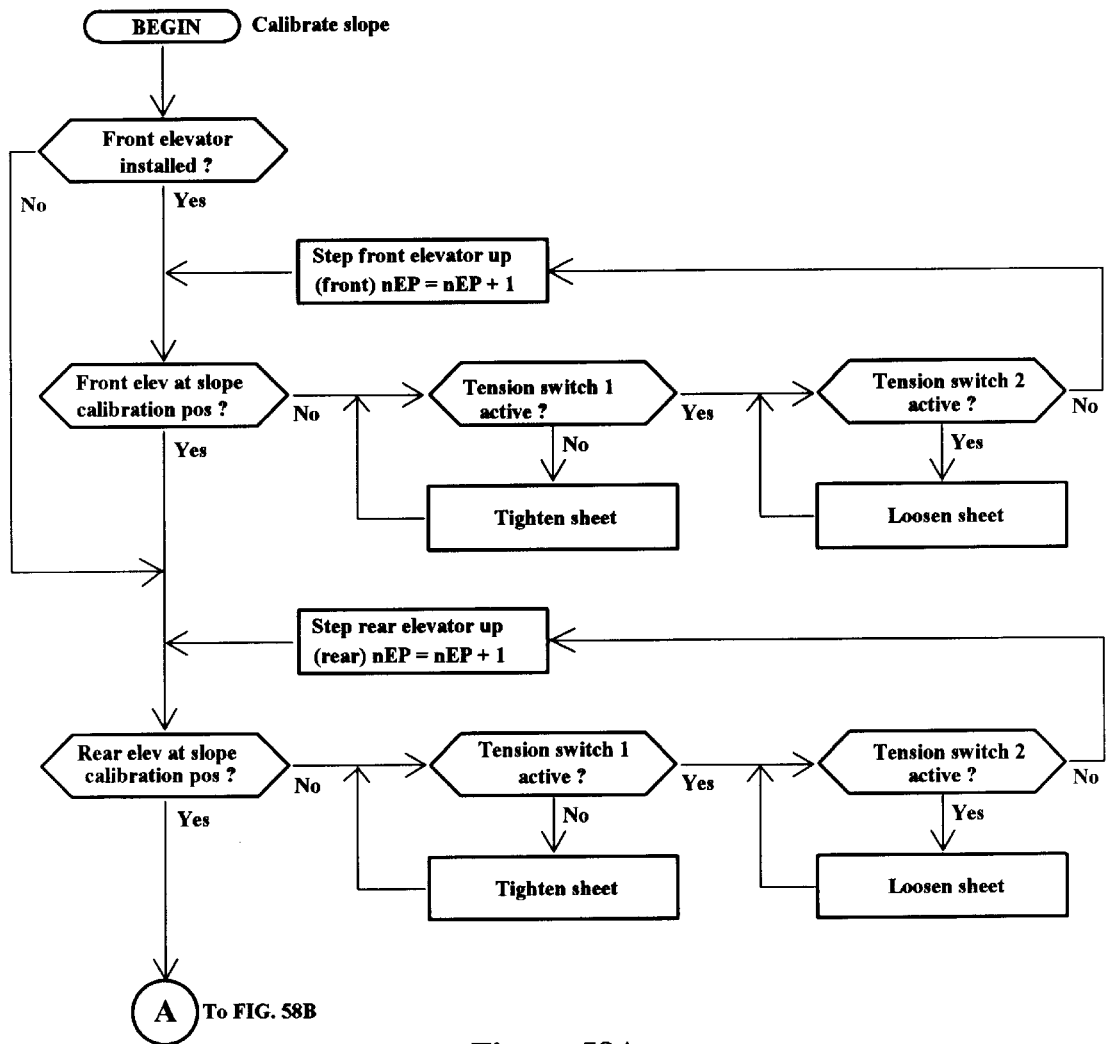
FIGS. 58A & 58B are flow diagrams showing a process of calibrating the slope in the "calibration" state of the sloping sheet positioning software.
Figure 58B:
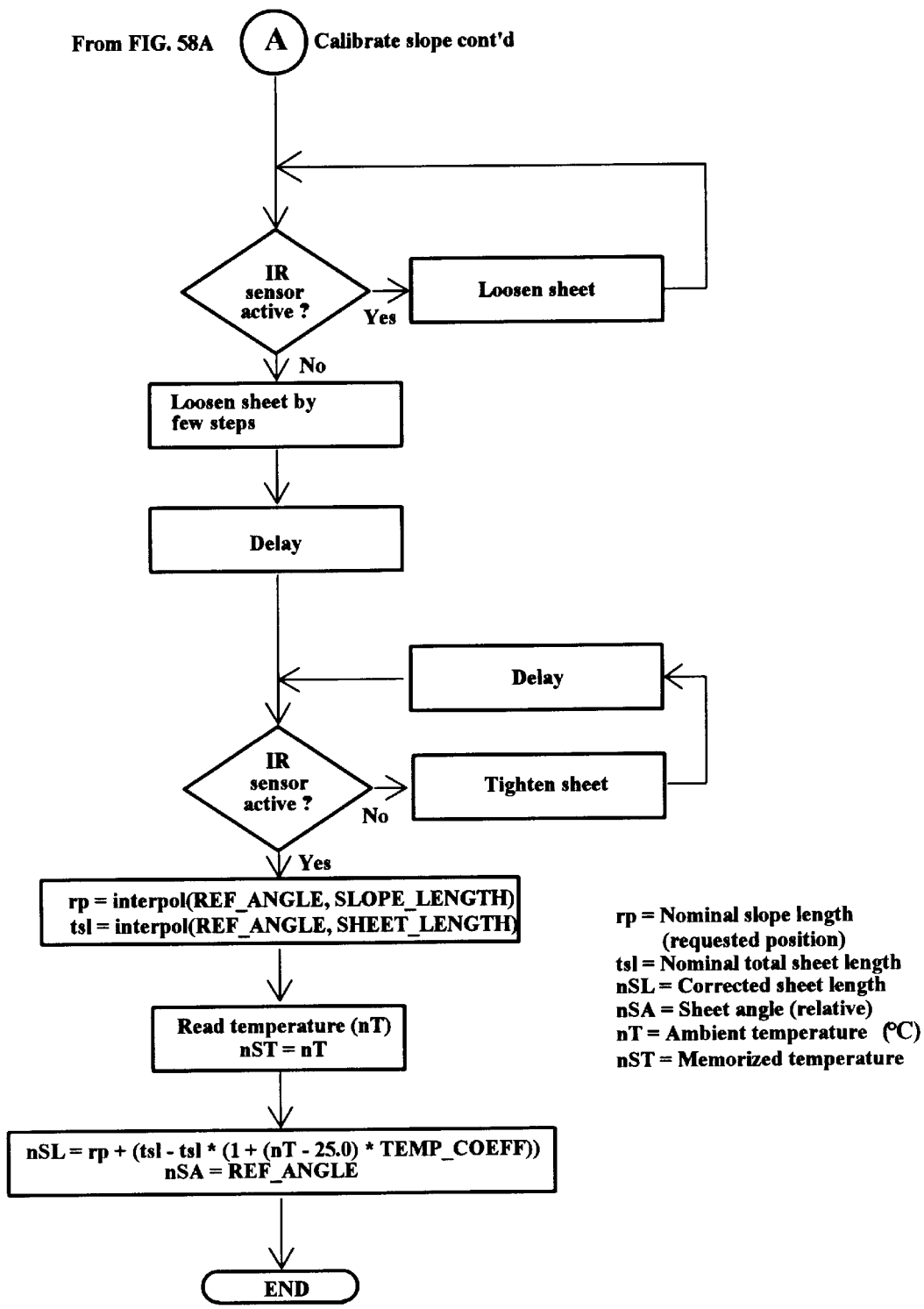

In FIGS. 58A & 58B, a flow diagram for the "Calibrate slope" procedure is shown. The purpose of this calibration procedure is to ensure that the position of the sloping sheet 190 is really what it's supposed to be. By going trough this procedure, at least once a day, sheet length changes caused by aging are compensated for. As described before, the slope is calibrated with the elevators 214,220 positioned so that the sheet 190 is extended out from the tensioning roll 202 as much as possible. The first part of the procedure (in FIG. 58A) positions the elevators for slope calibration. If the front elevator 214 has not been installed, its positioning is skipped. As seen before, the elevators are moved while keeping the sheet 190 tight, by inspecting the sheet tension switches 205,206 and either tightening or loosening the sheet 190 as necessary. The only difference is that the elevator position in nEP is now updated for each step. If the slope calibration position with the elevators 214,220 at the zero (down) position is selected, no movement occurs.

Once the elevators 214,220 are at the slope calibration position, calibration of the sloping sheet 190 begins (in FIG. 58B). First, the sheet 190 is loosened until it breaks the infrared beam between the IR transmitter 327 and receiver 326. After the beam is first broken, the sheet 190 is loosened by a few more steps to make sure no false reading will be taken. The procedure then waits for a while to allow the sheet 190 to stabilize. Following this wait, the sheet 190 is slowly tightened, with the IR sensor 326 being inspected between each tightening step. When the infrared beam becomes visible to the sensor 326 again, the slope is at its calibration position, and calibration information is computed and saved. This includes the relative elevation angle 109 used as a reference point (REF_ANGLE) saved in nSA, sloping sheet length in nSL, and the current temperature in nST. The current temperature is obtained by reading the ADC 306 channel for the ambient temperature sensor 330. The slope length is computed as follows:

$$nSL = rp + (tsl - tsl*(1+(nT-25.0)*TEMP\_COEFF))$$

where,
nT is the same current temperature, as in nST, TEMP_COEFF is the temperature expansion coefficient for the sheet material used for the sloping sheet 190, the intermediate variable rp is the nominal sloping sheet length, and ts1 is the nominal total sheet length, both of these intermediate values being obtained from the table by interpolating with REF_ANGLE, as in the following:
rp=interpol(REF_ANGLE, SLOPE_LENGTH)
ts1=interpol(REF_ANGLE, SHEET_LENGTH)
This completes the processing for the "CALIBRATION" state, and the "ENERGY COLLECTION" state is automatically entered.

Figure 59:
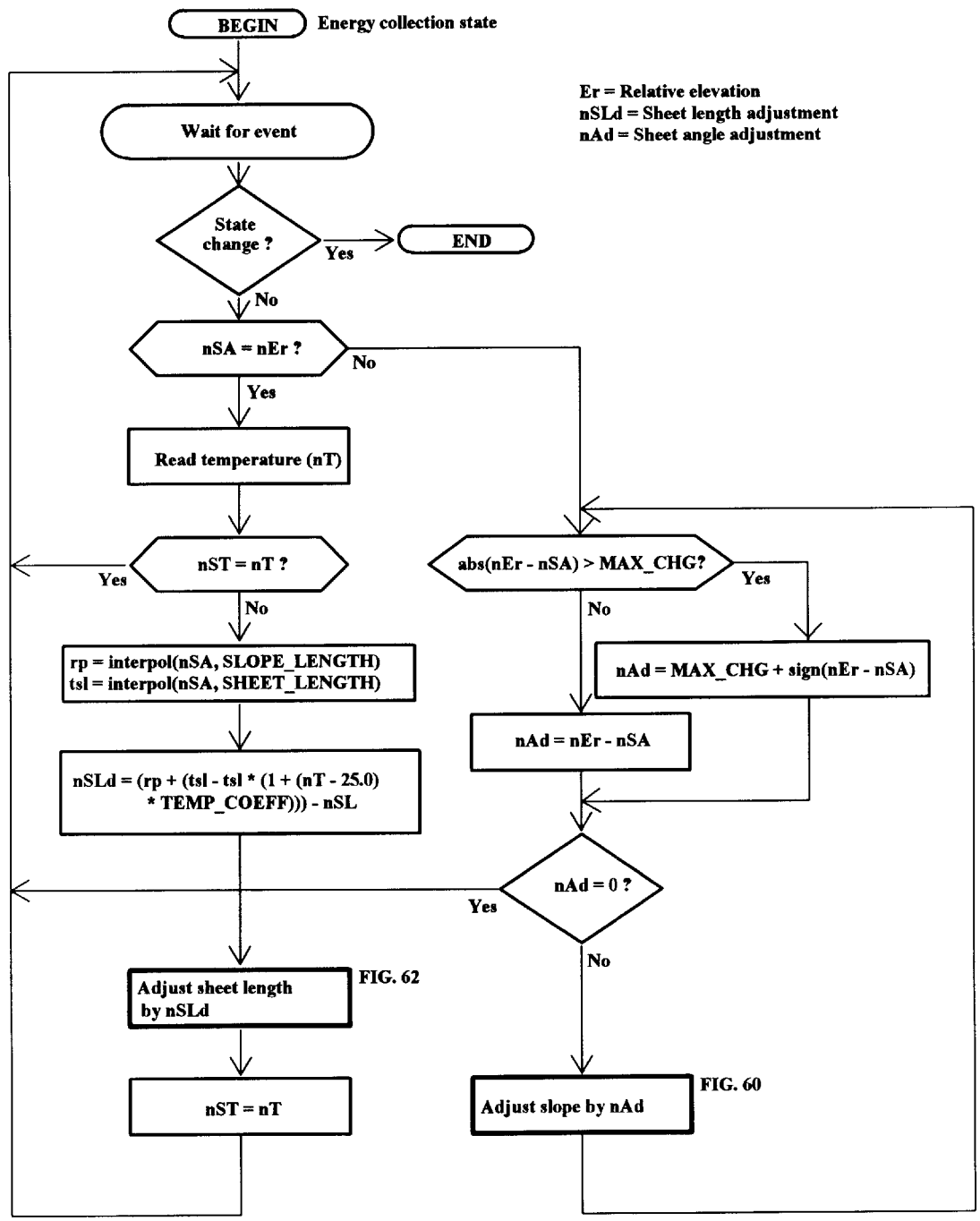
FIG. 59 is a flow diagram representing the "energy collection" state in the sloping sheet positioning software.
Figure 60:
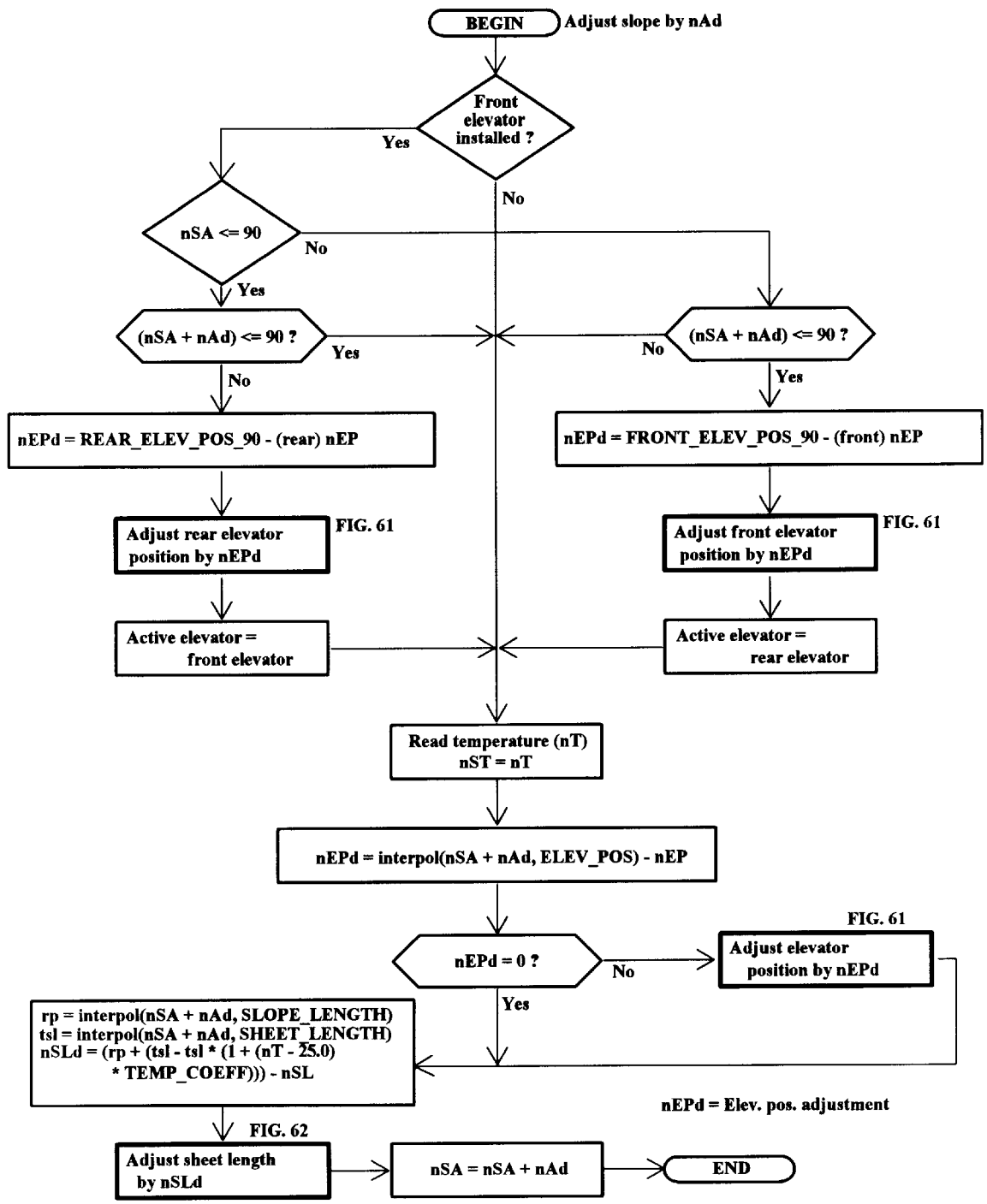
FIG. 60 is a flow diagram representing a procedure to adjust the sheet slope during energy collection.

The main procedure of the "ENERGY COLLECTION" state is shown in the flow diagram in FIG. 59. It is broken down into various sub-procedures, which are shown in FIGS. 60 trough 62. This procedure is basically an event loop, waiting either for the Er update from the Er tracking process, or for a state change signal caused by any major event, such as not enough radiation, or an error. If a state change occurs, processing of this procedure is terminated. On the Er update, a change in relative elevation 109 is first checked. If no change has occurred, then the current temperature is checked. If Er has changed, the slope of the sheet 190 is adjusted accordingly. This involves breaking the difference of current Er and the sheet angle (nSA) to small increments (determined by MAX_CHG), and then invoking a procedure (Adjust slope by nAd) to make changes in elevator 214,220 positioning and tighten or loosen the sheet 190. This is done repeatedly if the total difference is larger than MAX_CHG. Doing the adjustment in small steps keeps the elevators 214,220 and the slope in synchronous relationship, so that the sheet 190 is not tightened or loosened excessively.

If no change in Er occurred, but the current temperature (nT) is different from the previous temperature (nST), then a slope length adjustment (nSLd) is computed and the slope is adjusted with a sub-procedure "Adjust sheet length by nSLd."

The slope adjusting sub-procedure is shown in FIG. 60. If both elevators 214,220 are present, then the new Er value is first checked to see if the sun 100 has crossed the relative elevation 109 of 90° (directly above). If the sun 100 has moved from the front side to the back side of the collector 120 (from below 90° to above 90°), then the rear elevator 220 is "parked" to a fixed position, and the front elevator 214 is made "an active elevator." If the sun 100 has moved from the back side to the front side, the front elevator 214 is parked and the rear elevator 220 is made active. It should be noted that when this crossing takes place, both elevators 214,220 should be very close to the parking position already. However, these extra steps will assure the accuracy of the parking position. If the front elevator 214 has not been installed, these extra steps are skipped.

The processing then continues by reading the current temperature and by computing the change in the position of the active elevator 214 or 220. The position change is obtained using the table as follows:

$$nEPd = \text{interpol } (nSA + nAd, \text{ELEV\_POS}) - nEP$$

where nEPd is the difference in elevator 214 or 220 position, nSA is current slope angle, nAd is the desired change in angle, ELEV_POS is a constant name for requesting elevator 214,220 position data, and nEP is a current elevator 214,220 position. If no change in elevator 214,220 position is needed, then a procedure to adjust it will be skipped. Following the elevator 214,220 adjustment, a change in slope length is computed (as before), and the slope of the sheet 190 is adjusted. On exit, the new sheet angle is saved in nSA.

Figure 61:
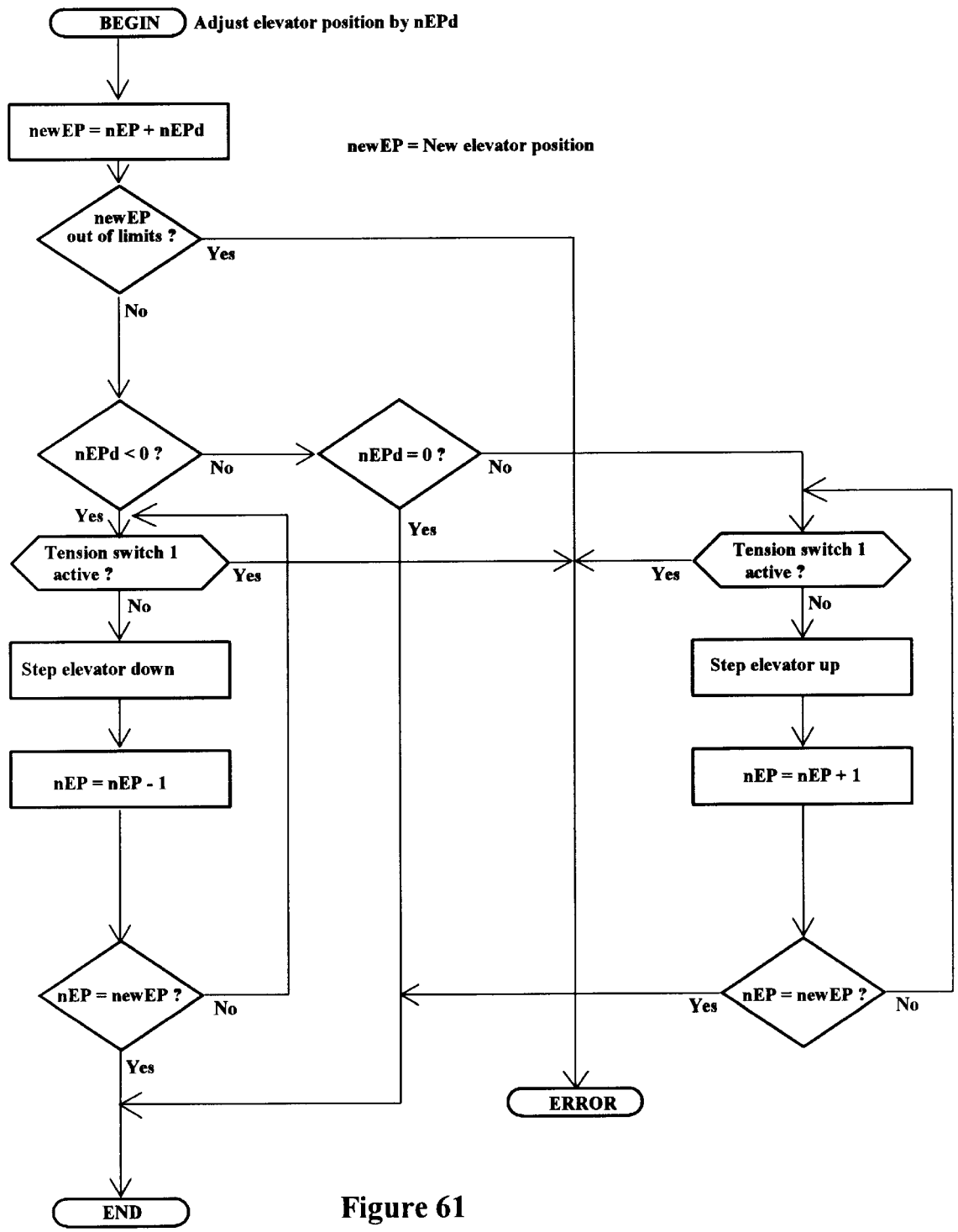
FIG. 61 is a flow diagram representing a procedure to adjust the elevator position during energy collection.

FIG. 61 has a flow diagram of the elevator 214,220 adjustment procedure. Before stepping the elevator stepper motor 231,233, the new elevator position is checked to make sure it is within allowable range on the rails 226. Then the elevator 214,220 is stepped up or down, the direction being defined by the sign of differential in position (nEPd). As a check, the tension switch one 205 is inspected between steps. If it ever becomes active, it must be regarded as a serious error, and normal operations must be stopped. While the elevator 214,220 is moved, its position (nEP) is adjusted.

Figure 62:
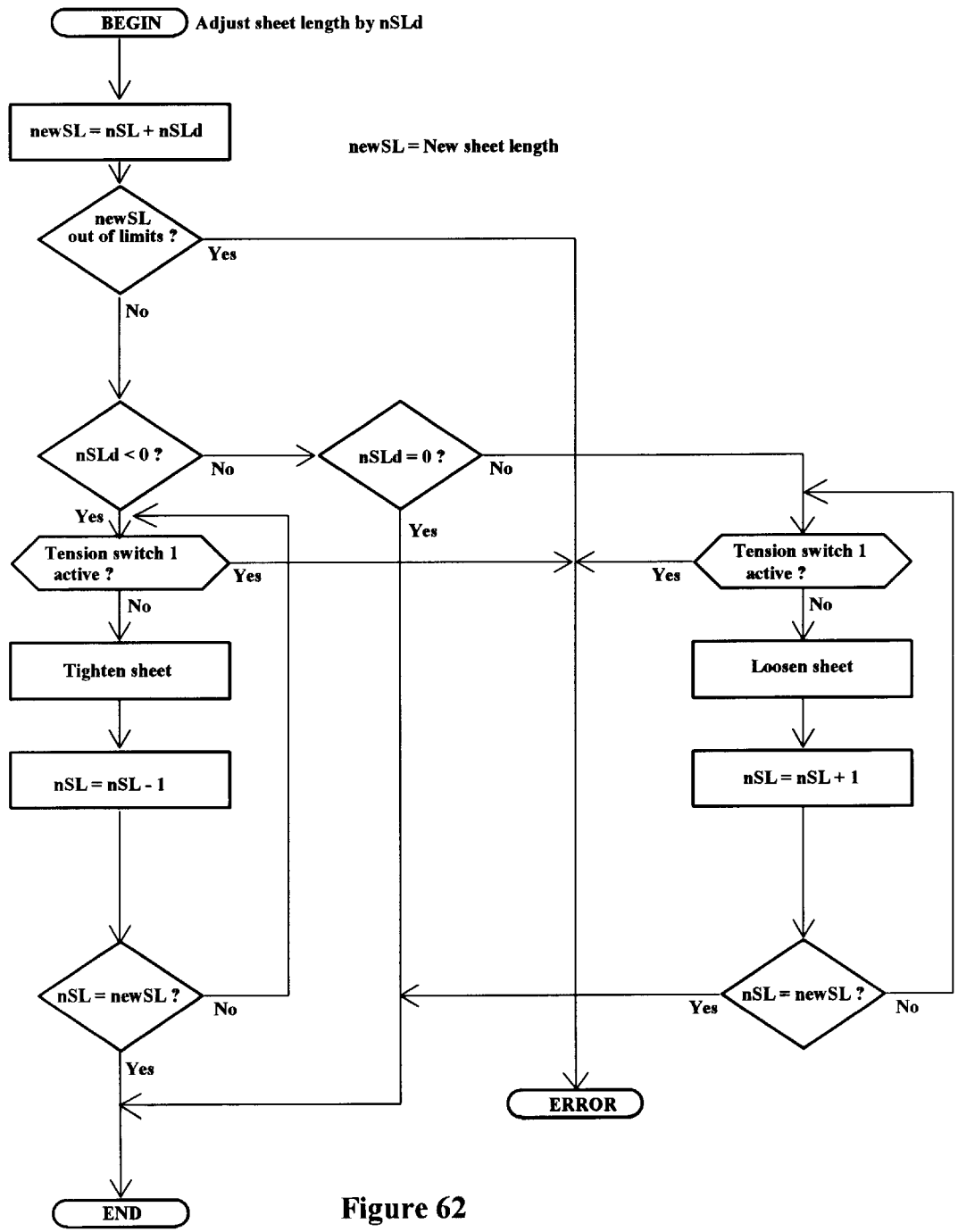
FIG. 62 is a flow diagram representing a procedure to adjust the sloping sheet length during energy collection.

The procedure for adjusting the sloping sheet 190 length, in FIG. 62 is very similar to the described elevator 214,220 position adjustment procedure. Before stepping the tensioning stepper motor 204, the new slope length is checked to make sure it is within allowable range. Then the tensioning motor 204 is stepped, either tightening or loosening the sheet 190, the direction being defined by the sign of differential in position (nSLd). As a check, the tension switch one 205 is inspected between steps. If it ever becomes active, it must be regarded as a serious error, and normal operations must be stopped. While the sheet 190 is tightened or loosened, its length (nSL) is adjusted.

Figure 63:
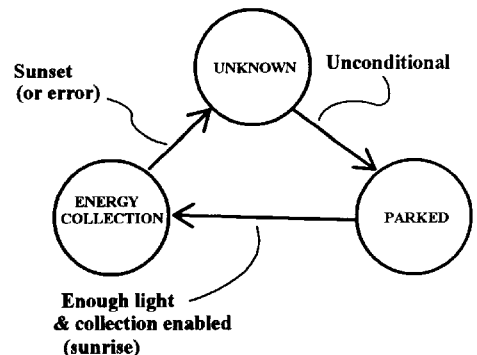
FIG. 63 is a state diagram showing the states of the reflective strip positioning software.

A state diagram representing "Reflective Strips Rotation Controls" is shown in FIG. 63. Again, the "UNKNOWN" state is a transitionary state used for executing initialization in positioning of the strips 240. This state is automatically entered after power up initialization. It is also forced to execute when the radiation energy level drops below the "evening threshold" at sunset, and on various error conditions. Once entered, the "UNKNOWN" state is used to rotate the strips 240 to a known (home) position. The "PARKED" state is entered automatically, once the strips 240 are in the home position. In the "PARKED" state, the strips 240 are kept at that home position, until a signal is received from higher level to exit the state, such as on sunrise. On arrival of the signal, the position of the strips 240 is briefly calibrated by stepping the actuator 250 out of the home switch. An "ENERGY COLLECTION" state is then entered directly. In the "ENERGY COLLECTION" state, the strips 240 are continuously adjusted to track the movement of the sun 100, in order for the strips 240 to function as a concentrating reflector 112. A major error, or loss of radiation, will send the state machine back to the "UNKNOWN" state.

Figure 64:
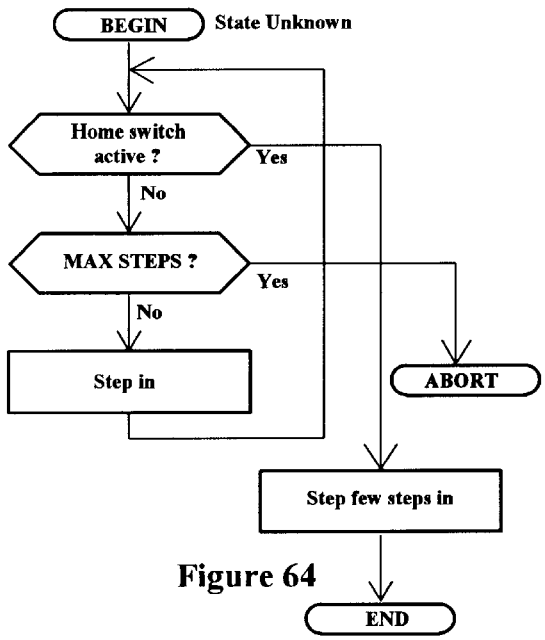
FIG. 64 is a flow diagram representing the "unknown" state of the reflective strip positioning software.

The process of the "UNKNOWN" state is detailed in FIG. 64. The actuator 250 is simply stepped towards home position until its home switch is activated. Once the switch activates, a few more steps in the same direction are given to make sure the switch stays activated. To detect if the actuator 250 has become stuck, the steps are counted and compared to a predetermined maximum step count. Once the actuator 250 has been driven to its home position, the "PARKED" state is entered.

Figure 65:
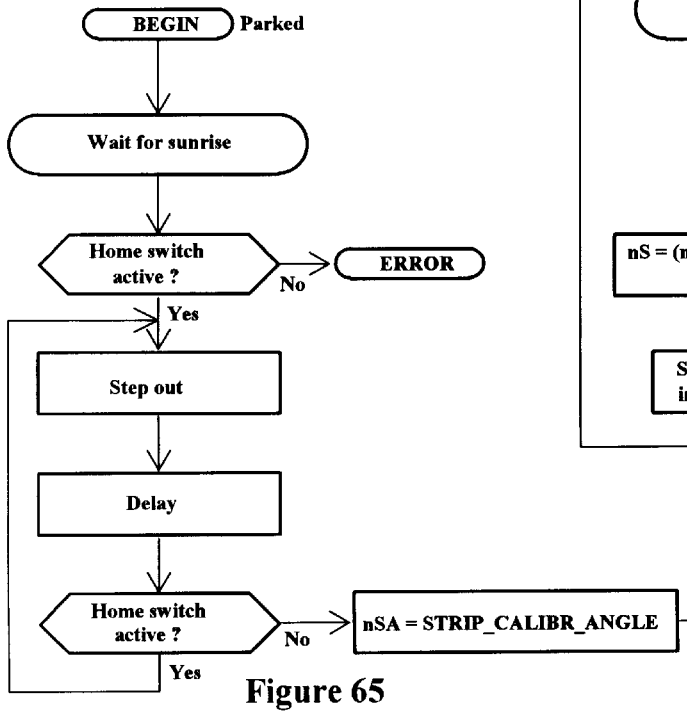
FIG. 65 is a flow diagram representing the "parked" state of the reflective strip positioning software.

In the "PARKED" state (FIG. 65) a signal to begin operations will simply be waited for. Since the strips 240 are already in their home position, there is nothing else to do. Once the signal to begin work has arrived, the actuator's 250 home switch is checked to make sure it's still active. If not, something is severely wrong. The strips 240 are then slowly stepped out from the home position, until the home switch is no longer active. Once the switch becomes inactive, the current angle of the strips 240 is noted in a variable nSA, and the "ENERGY COLLECTION" state is entered.

Figure 66:
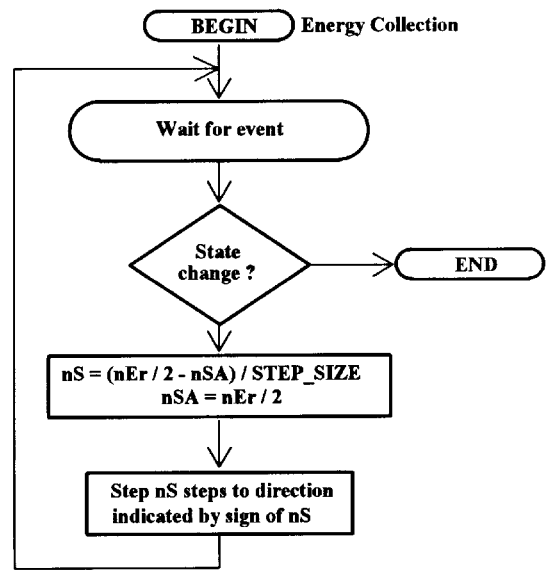
FIG. 66 is a flow diagram representing the "energy collection" state of the reflective strip positioning software.

The process of the "ENERGY COLLECTION" state is shown in FIG. 66. The process is an event loop, waiting either for the Er update from the Er Tracking Loop, or for a state change signal caused by any major event, such as not enough radiation or an error. If a state change occurs, processing of this procedure is terminated. On the Er update, the number of steps needed to rotate the reflective strips 240 is computed as follows:

$$nS = (nEr/2 - nSA)/\text{STEP\_SIZE}$$

where, nS is number of steps, nEr is the new relative elevation 109, nSA is the current angle of the strips 240, and STEP_SIZE is the actuator 250 step size in degrees of strip 240 rotation. The actuator 250 is then stepped with nS determining the number of steps the sign of nS determining the direction.

The procedures described in the foregoing are independent of the method of tracking the sun's 100 movement. The relative elevation angle 109 for them could be computed from the current date and time, or it could be measured by a sensor. In the following description of the higher level software components, the use of a radiation scanner 340 is assumed.

Figure 67:
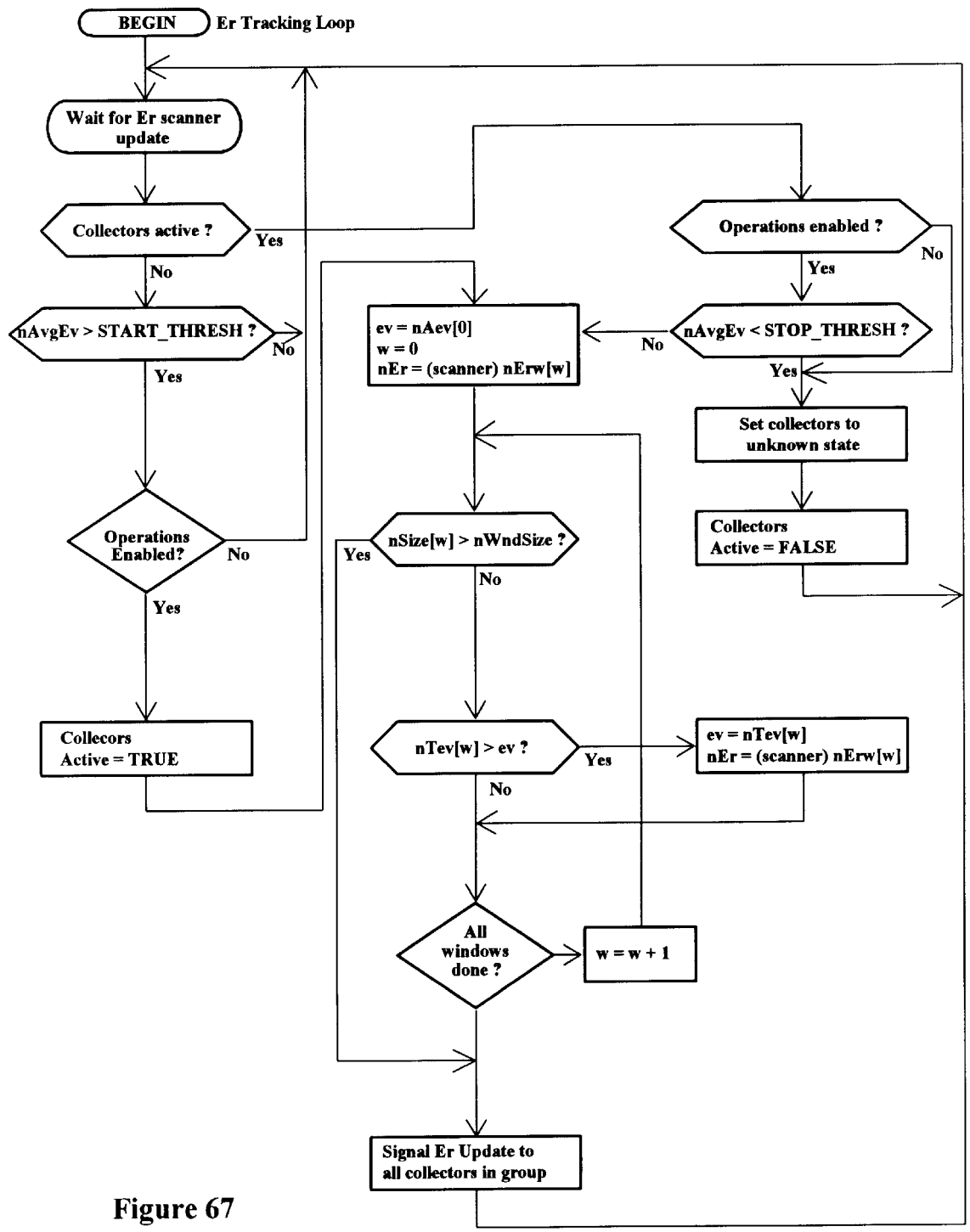
FIG. 67 is a flow diagram representing a software process used to track relative elevation of the sun for a group of collectors.

A procedure to track relative elevation for a given collector 120,122, or group of collectors, is shown in FIG. 67. In order to understand this procedure, a little background information in the workings of the radiation scanner 340 is needed. One variable provided by this scanner 340 is the overall average radiation level measured over a large segment of the sky. This value is saved in a variable nAvgEv, and is used to decide when the collector(s) 120,122 should actually be activated for collection of energy, and when they should be deactivated. Also, a set of radiation energy level measurements given by the scanner 340 are organized as an array of highest total energy level readings (nTev[]) representing different sizes of the radiation acceptance window 103, which has been described earlier with the description of reflector theory. The acceptance window 103 sizes for these multiple readings are selected such that they represent a variety of different collectors 120,122, and are organized in decreasing window 103 size in the array. Two additional corresponding arrays are also provided. The second array (nSize[]) is used to store the window 103 size in degrees, and a third one (nErw[]) is used to store the measured radiation angle, which represents the relative elevation 109. More detailed description of the radiation scanner 340 software will follow later in this description.

This tracking procedure, once started, runs continuously at regular intervals, waiting for periodic relative elevation 109 update by the software for the radiation scanner 340. When an update is received, the processing depends on whether the collector(s) have been previously activated or not. When the collectors 120,122 have not yet been activated, the average available radiation level (nAvgEv) is compared to a threshold value START_THRESH. If enough radiation is present, yet another test is made to see if operations are enabled by the "Master Controls." If enabled, the procedure will continue with announcing the collector(s) is/are 120,122 active and finding the best available relative elevation 109 for the given collector(s) 120,122. On Er update, if the collectors have already been previously activated, tests are made to see if operations are still enabled and that there is still enough radiation (nAvgEv≧STOP_THRESH). If either check is negative, the collectors 120, 122 will be commanded to "UNKNOWN" state and deactivated. If both checks are positive, the processing is continued with finding the best relative elevation 109. This is done in a loop which scans through the arrays provided by the software for the radiation scanner 340. The arrays are scanned from the beginning, ignoring the entries for larger acceptance windows 103 than that of the collector's 120, 122. From the remaining entries, the largest available total energy reading (nTev[]) is selected, and its corresponding relative elevation 109 (nErw[]) is used to adjust the concentrating reflectors 110,112.

Figure 68A:
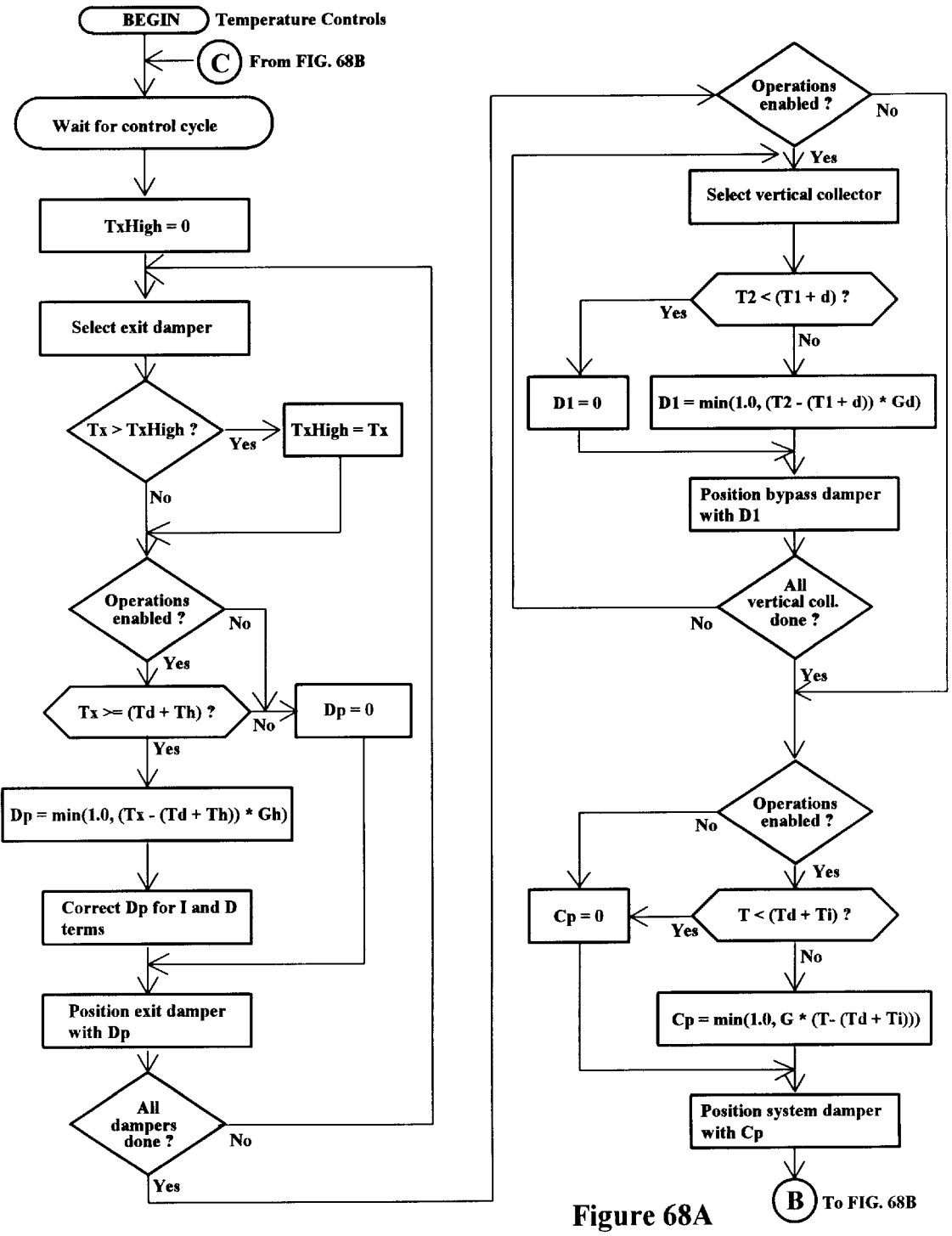
FIG. 68A & 68B are flow diagrams showing the software used to control energy conversion temperatures.
Figure 68B:
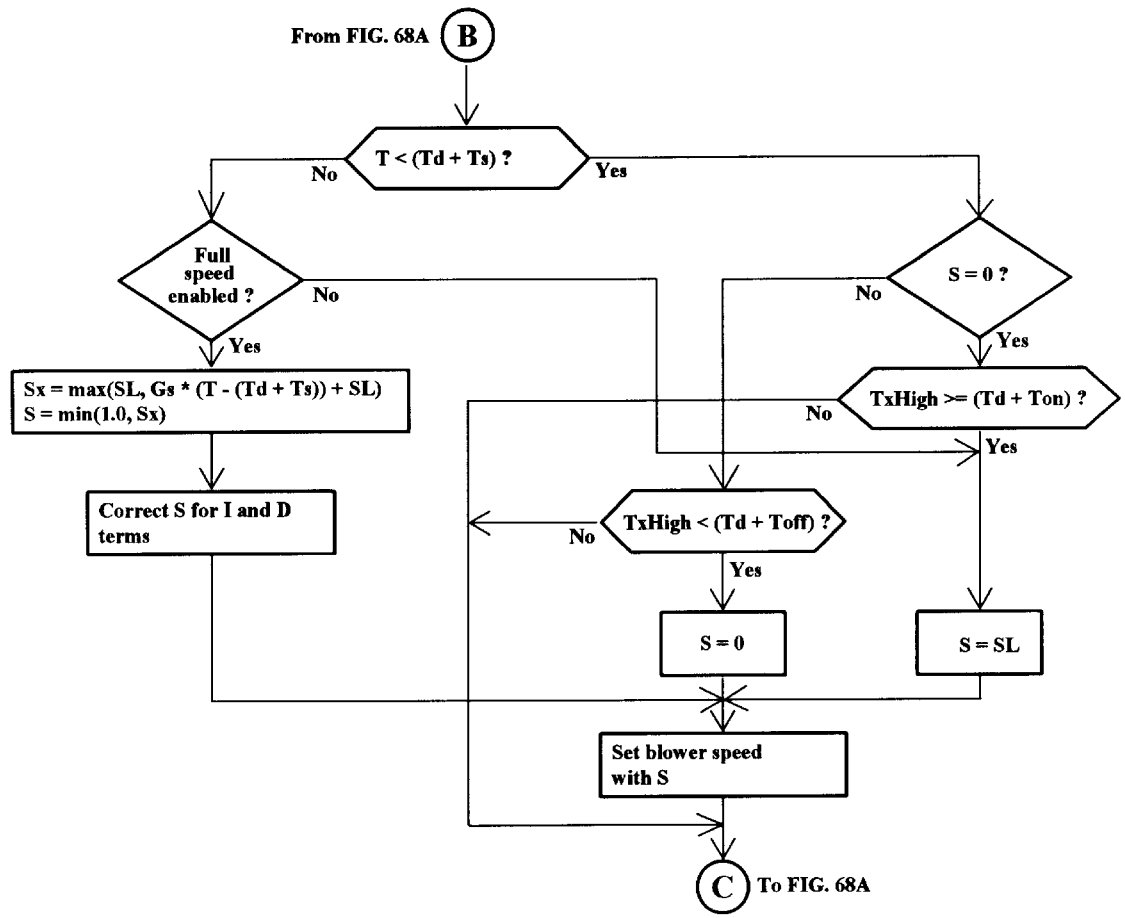

For the description of controlling the temperatures, both at the collector 120,122 and at the system level, FIGS. 68A & 68B are now referred to. For the non tracking versions of the collectors 120 these temperature controls are the only controls required. These controls are executed at regular intervals, for example once every five seconds. This is indicated by the step "Wait for control cycle." The control cycle is started with an inner loop which scans all exit 172 and entry 184 dampers or valves and their corresponding exit temperature sensors 180. A highest exit temperature found during this scan is saved in TxHigh. If the operations are enabled, the exit dampers 172 or valves are positioned according to the control algorithm described in the theoretical description. If the operations are not enabled, the dampers 172 or valves are closed. Next, a loop scanning all vertical collectors 122 is executed. In this loop the bypass dampers 174 or valves are positioned according to their control algorithm. If the operations are disabled, this loop will be skipped.

If the operations are enabled, a system level control damper 265 or a valve is positioned next. If the operations are disabled, the system level damper 265 or valve will be closed, to a fully bypassing position. This control process uses the system level temperature T from the system level sensor 266.

Last in the temperature control loop is a process to control the speed of the blower 267, or some other flow control device. The process is shown in FIG. 68B. Again, the algorithm used in speed control is as described in the theoretical description, and will not be repeated here. However, a small additional feature is a test to see if the full speed of the blower 267 is allowed. If the full speed is not allowed, the low speed will be enforced, even if the current temperature would demand a higher speed. After controlling the blower 267 speed, the outer control loop is closed by entering the wait for next control cycle.

Figure 69:
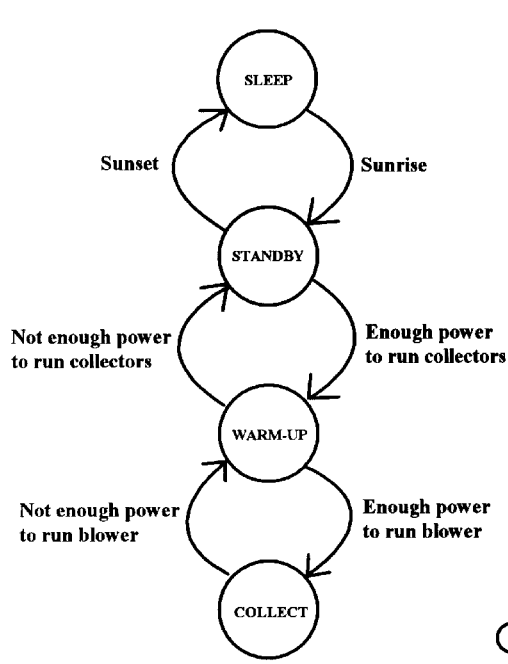
FIG. 69 is a state diagram showing the states of main tracking and conversion control program.

The "Master Controls" is implemented as a simple state machine, depicted in FIG. 69. A "SLEEP" state is entered at power up cycle, and at evenings. It can also be entered on errors, or alarms. In this, nearly no activity is going on. Only the radiation energy level is periodically checked. When some radiation becomes available, a "STANDBY" state is entered. In the "STANDBY" state the radiation scanner 340 is operated. When the amount of radiation increases to a meaningful level, and enough power to operate the collectors 120,122 is available, a "WARM-UP" state is entered. If the radiation level drops down to sunset level, the "SLEEP" state is activated again. In the "WARM-UP" state, the collectors 120,122 are operated, but the full speed of the blower 267 is not enabled yet. If everything is OK and there is enough power to run the blower at full speed, a "COLLECT" state is entered. If the available power level drops below the safe operating level of the collectors 120,122, the control is given back to the "STANDBY" state. In the "COLLECT" state, all operations are enabled, including the full speed of the blower 267. On errors or on lowered power level, the control falls back to the "WARM-UP" state.

Figure 70A:
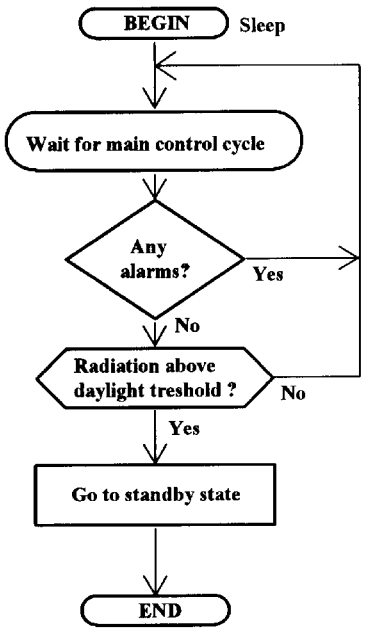
FIG. 70A is a flow diagram representing the "sleep" state in a main tracking and conversion control program.

More detailed description of the "SLEEP" state is represented by the flow diagram in FIG. 70A. To establish regular timing intervals, a main control cycle is executed first. These control cycles could be given at, for example, five second intervals. They could in turn signal the control cycles used for temperature controls, thus resulting in chained processing of everything at every five seconds. In the "SLEEP" state, any alarms or errors are first inspected. If there are any major problems, the next state will not be allowed to switch in. Next, the radiation level measured by the stopped radiation scanner 340 is checked. When the radiation level is indicating that the sun 100 is just about to rise, the "STANDBY" state is entered.

Figure 70B:
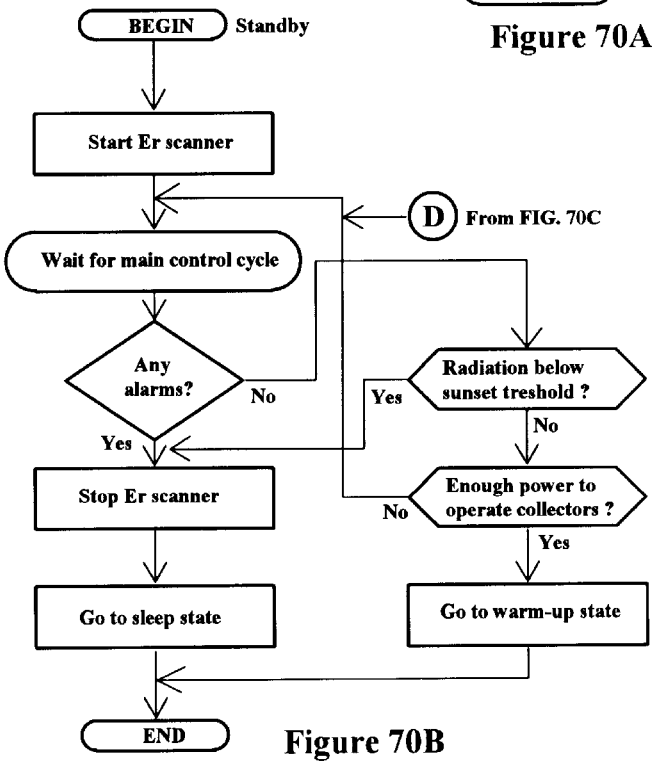
FIG. 70B is a flow diagram representing the "standby" state in a main tracking and conversion control program.

A procedure for the "STANDBY" state is shown in FIG. 70B. When this state is entered, the radiation scanner 340 is started, meaning its motor 356 is started by closing the relay 355. The main control cycle is then waited for. At the arrival of the control cycle signal, any major errors or alarms are checked. If any are detected, the radiation scanner 340 is stopped and control is returned to the "SLEEP" state. If no errors are detected, the overall radiation level is inspected. If the radiation level indicates that the sunset has occurred, the radiation scanner 340 will be stopped and a "SLEEP" state entered. If radiation level indicates normal day light, available operating power will be checked, and if enough power to operate the collectors 120,122 is available, a "WARM-UP" state will be entered. The available operating power can be tested with DI 308 signal from the utility powered regulator 283, and with the current probe 294 (FIG. 40). A very elaborate power monitoring program can be provided by monitoring the current probe 294 at regular intervals, and computing the battery charging state from the net charging current.

Figures 70C, 70D:
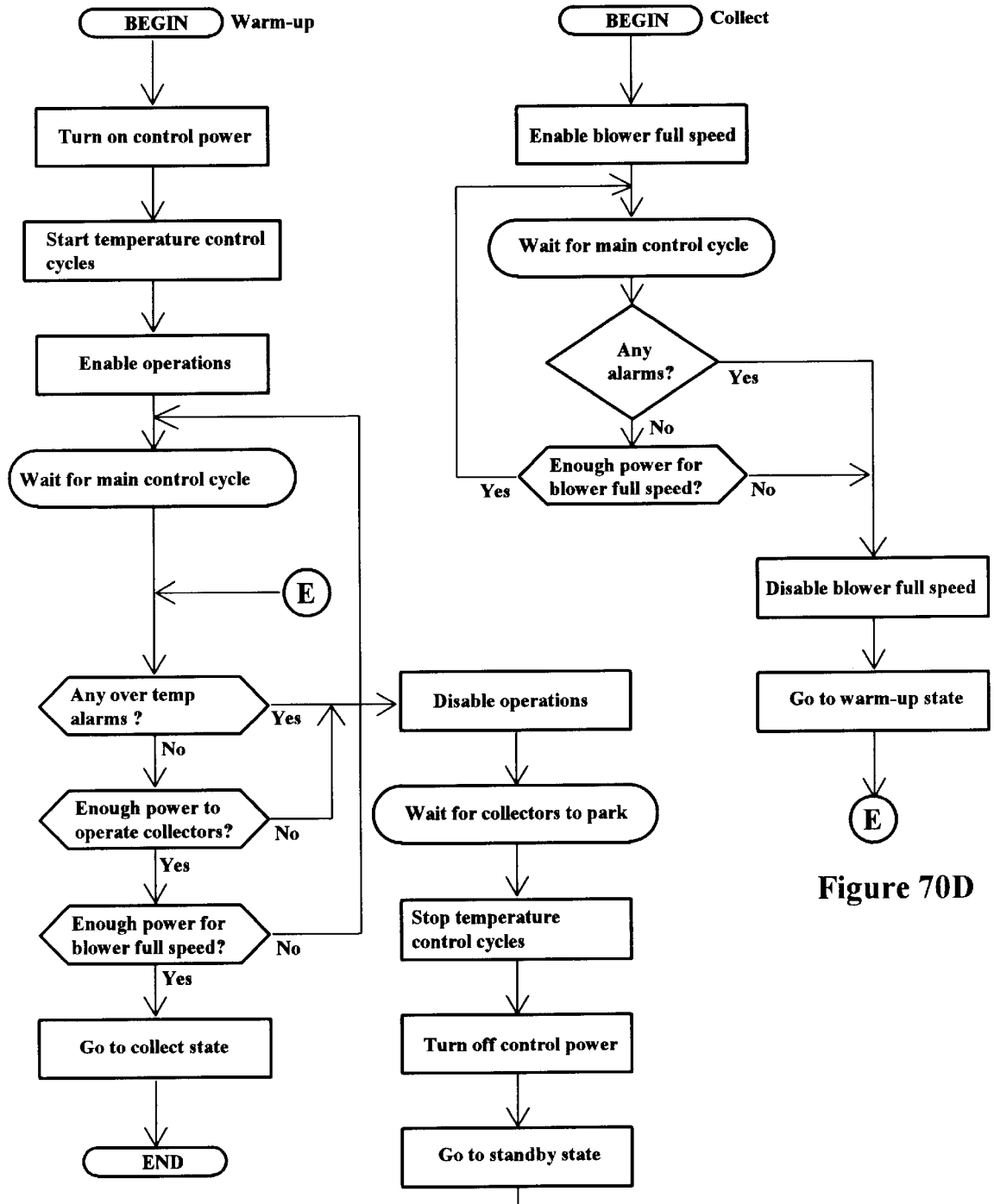
FIG. 70C is a flow diagram representing the "warm-up" state in a main tracking and conversion control program.
FIG. 70D is a flow diagram representing the "collect" state in a main tracking and conversion control program.

A procedure for the "WARM-UP" state is shown in FIG. 70C. Processing in this state begins by turning on control power to the collectors 120,122. This is done by closing the control power relay 289. Next, the temperature control cycles are started and collector operations in software are enabled. The main control cycle is then waited for. Upon arrival, the safety circuit is tested to determine if it has tripped. This can be done either by directly reading a DI 308 channel wired to the switches 373 in the safety clutches 252, or by inspecting an internal software indication produced by a safety monitor. If the circuit has tripped, a procedure to fall back to "STANDBY" state will be initiated. If the safety circuit has not been tripped, any over temperature conditions and the power status are checked. If there are any over temperature conditions, or if there is not enough power to operate the collectors, the operations are disabled and parking of the collectors is waited for. Then a procedure to fall back to "STANDBY" state is initiated. This includes, stopping the temperature control cycles, turning off control power, and going to "STANDBY" state. If no over temperature conditions exist and enough power to operate the collectors 120,122 is available, then power availability to run the blower 267 at full speed is checked. This simply involves checking the DI 308 channel wired to the power regulator 283. If either utility power is available or the energy converters 150,152 are feeding power through the power conditioner 290, enough power to run the blower 267 should be available. If full power is available, a "COLLECT" state is entered.

Processing for the "COLLECT" state is shown in FIG. 70D. First, the full speed of the blower 267 is enabled. Then, the main control cycle is waited for. At each control cycle, a test is made for any errors or alarms. Then the test for full power availability is made again. On any major errors or alarms, the full speed of the blower 267 is disabled and the control is transferred back to the "WARM-UP" state. These steps are also activated on significant loss of power.

Figure 71:
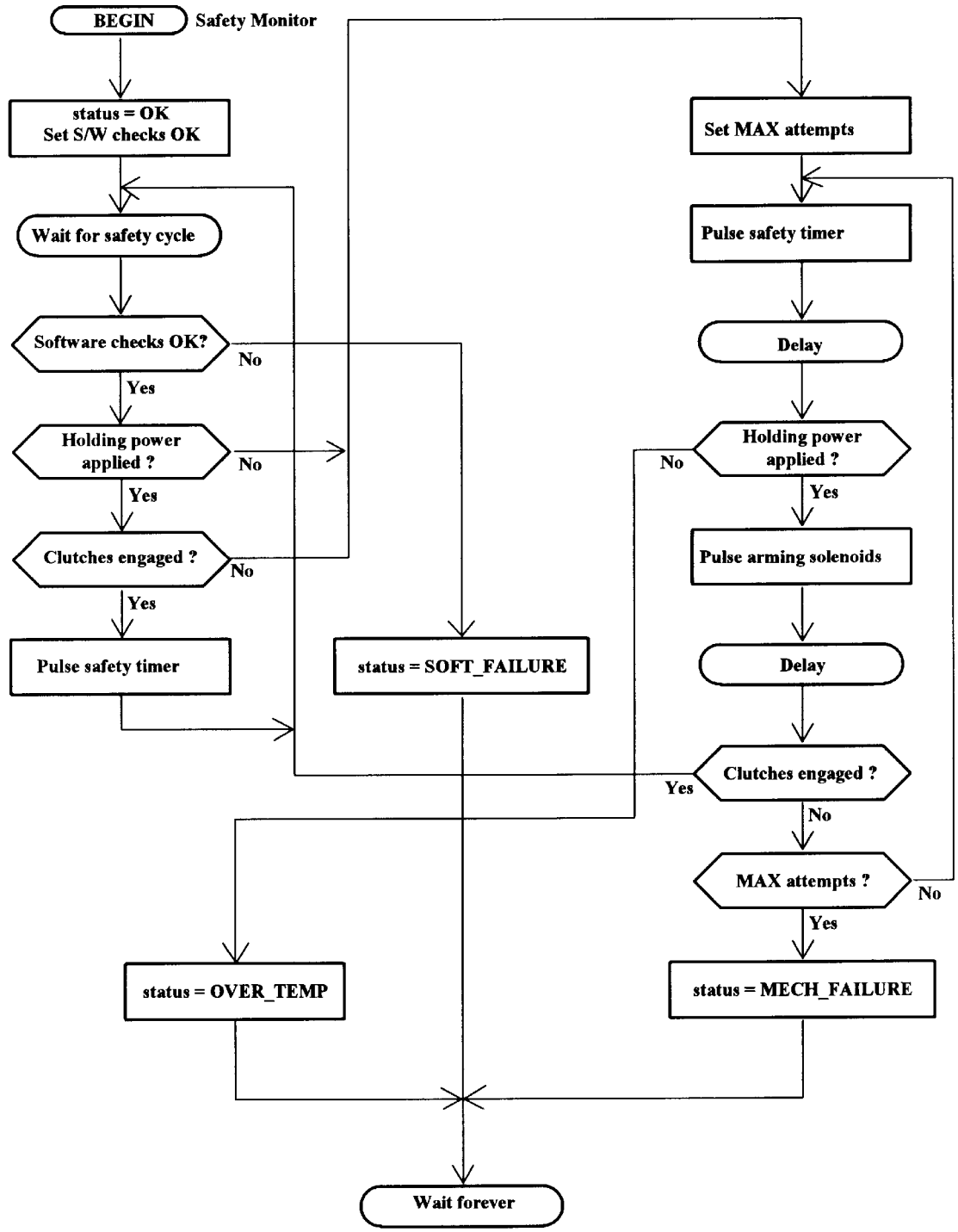
FIG. 71 is a flow diagram showing a software safety monitor used to control the safety circuits in the concentrating collectors.

A software safety monitor is shown in FIG. 71. This safety monitor completes the means for automatically deactivating the safety signal 374 in order to deactivate the concentrating reflectors 120,122. Initially, after a micro processor 300 power up, the procedure activates the safety signal 374 by pulsing the watch dog timer 360 and engages the safety clutches 252, so that the collectors 120,122 become operational. From then on, it monitors various conditions to determine if it is safe to allow the collectors 120,122 to operate. At the start of the procedure, a status word is marked as OK in the assumption that everything will come up clean. All essential software is also marked to be functional. A safety cycle is then waited for. The interval of periodic safety cycles should be longer than the longest control cycle in the system, perhaps twice that. This is to make sure that the control cycles are allowed enough time to complete at least once between each safety cycle. On each safety cycle, the check to see if all essential software is functioning correctly is made first. This can be done by, for example, requiring all essential software components to have an individual counter and to increment that counter after completing successful control cycle. The check in the safety monitor then checks all the counters to see that they have been counted up, and after checking them, the monitor then clears them back to zero. Thus, any counter that has not been counted up between safety cycles indicates a failed operation. On such failure, the monitor changes the content of the status word to indicate that the software detected a failure, or failed itself, and then shuts the safety monitor permanently down, requiring a system restart to resume operations. Once the safety monitor has been shut down, the safety timer 360 will eventually time out, dropping the safety signal 374 to inactive. This action will disengage the safety clutches 252, inactivating the concentrating reflectors 110,112. If the software check comes out OK, the safety clutches 252 are then checked for holding power applied (safety signal 374 active), and the clutches 252 engaged. Those checks being OK, the safety timer 360 is pulsed via DO 310, preventing it from timing out. If the software check comes out OK, but either the holding power or clutches 252 engaged test fails, a clutch 252 power up sequence is attempted.

During power up, since the software is first marked as being OK, and the safety clutches 252 have not been engaged yet, the clutch 252 power up sequence is automatically entered. This sequence is attempted a few times, in case the clutches 252 fail to engage at first attempt. The safety timer 360 is first pulsed in order to activate the safety signal 374, which supplies the holding power to the clutches 252. After a brief delay, the presence of the safety signal 374 is checked. If it is not present, it is assumed that one of the over temperature switches 189 is open, and the status word is changed to indicate over temperature condition. The safety monitor is then shut down. If the safety signal (holding power) 374 did become active, the arming solenoids 363 of the safety clutches 252 are then briefly energized to engage the clutches 252. Then, after a brief delay, a clutch confirmation signal 375 is checked to see that the clutches 252 in fact became engaged. If not, and more attempts are allowed, the whole power up sequence is repeated. If the clutches 252, or just one of them, fail to engage during repeated attempts, the status word is changed to indicate a mechanical failure and the safety monitor is shut down.

Figure 72:
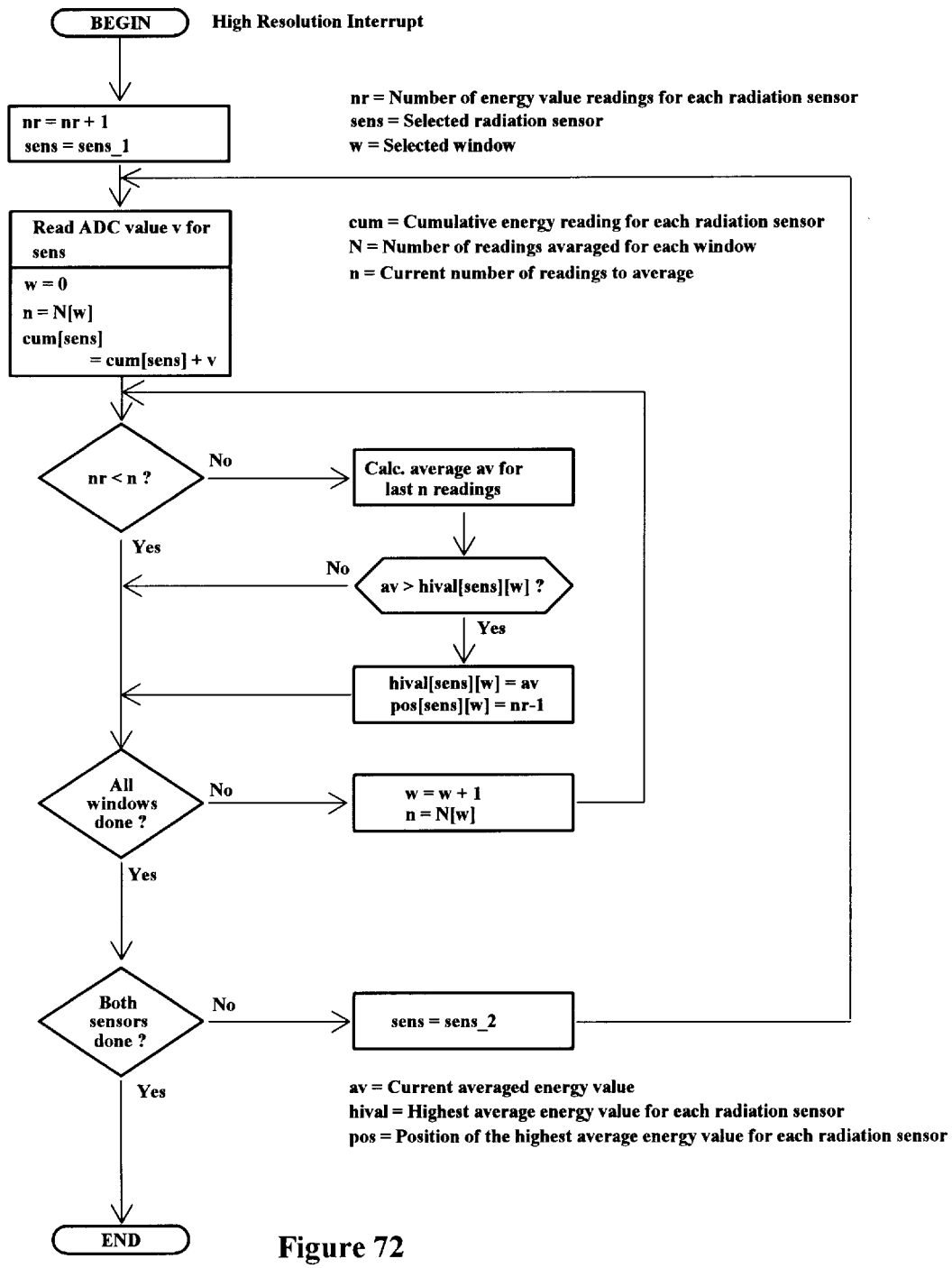
FIG. 72 is a flow diagram showing the processing of high resolution angular interrupt for the radiation scanner.

The essential software of the radiation scanner 340 involves two interrupt routines and one update routine which is executed as a result of the interrupt routines. A high resolution interrupt routine is shown in FIG. 72. It need not be executed actually at interrupt level, as long as it is guaranteed to execute very fast after arrival of the interrupt signal. This routine is responsive to the interrupt caused by the high resolution angular pulse generator 359 of the scanner 340. On each interrupt, energy level from both radiation sensors 344 is recorded. For each angular radiation acceptance window 103 an average energy level is computed. This average is compared to the highest previous average for that window. If the current average is higher than a previously highest average, the new highest average for that window is saved, along with the angular position (or count) of the current interrupt. A cumulative energy value is also accumulated for each radiation sensor 344.

Figure 73:
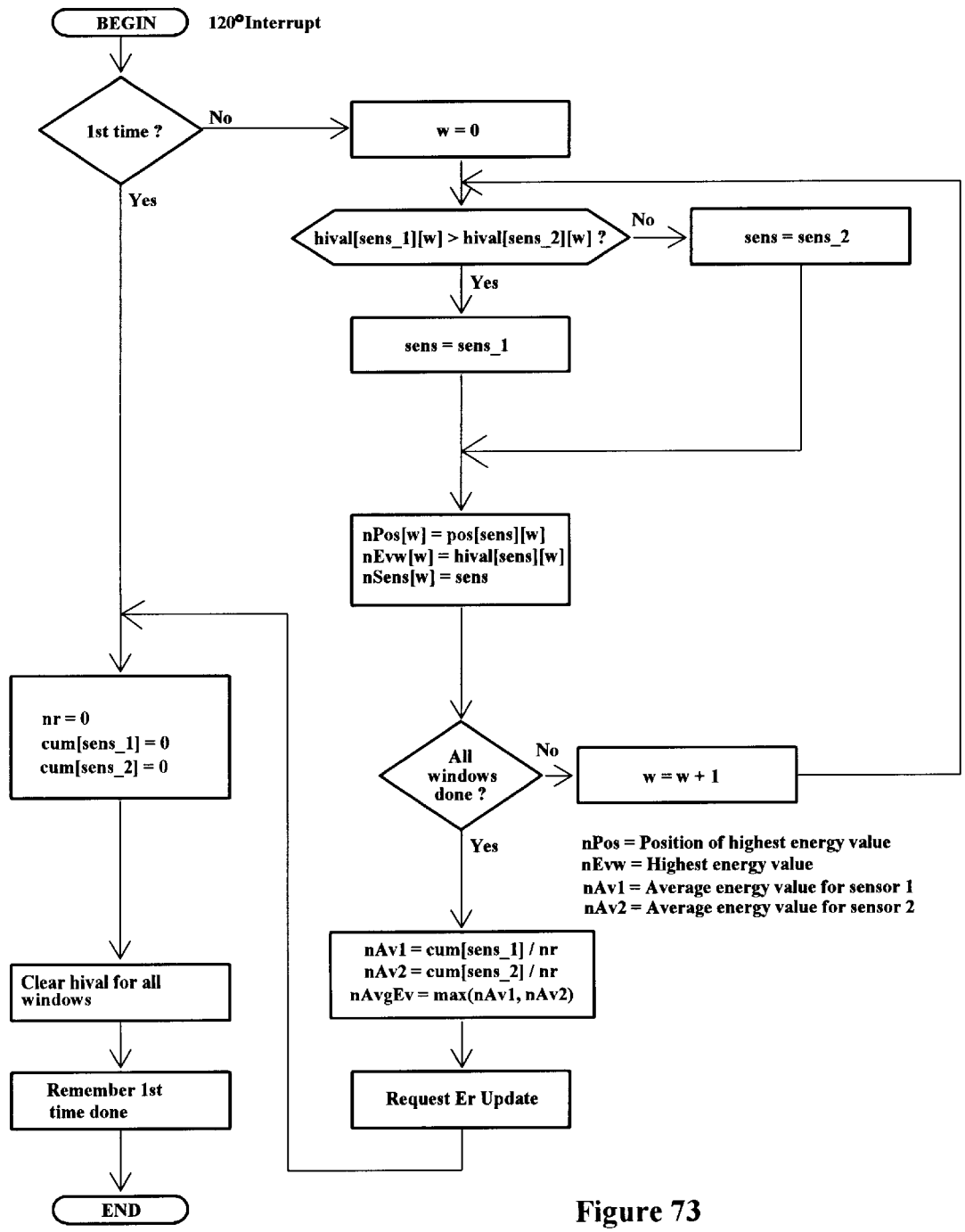
FIG. 73 is a flow diagram showing the processing of 120° angular interrupt for the radiation scanner.

A 120° interrupt routine is shown in FIG. 73. It is responsive to the interrupt caused by the 120° angular pulse generator 358. On the first occurrence of this interrupt, the angular position count, highest average values for all windows, and cumulative radiation level values are cleared. On subsequent occurrences, a normal processing for this interrupt is executed. For each acceptance window 103 the radiation sensor 344 with highest average energy reading will be used. This highest average reading, along with its position is saved for that window as a final average energy value and the angular position (count) of it. Once all acceptance windows 103 have been processed, the average energy value over an entire sweep is then computed for each radiation sensor 344. The higher of those is saved as overall average radiation level (nAvgEv). The process to update the radiation angles is the signaled to execute (Request Er Update).

Figure 74:
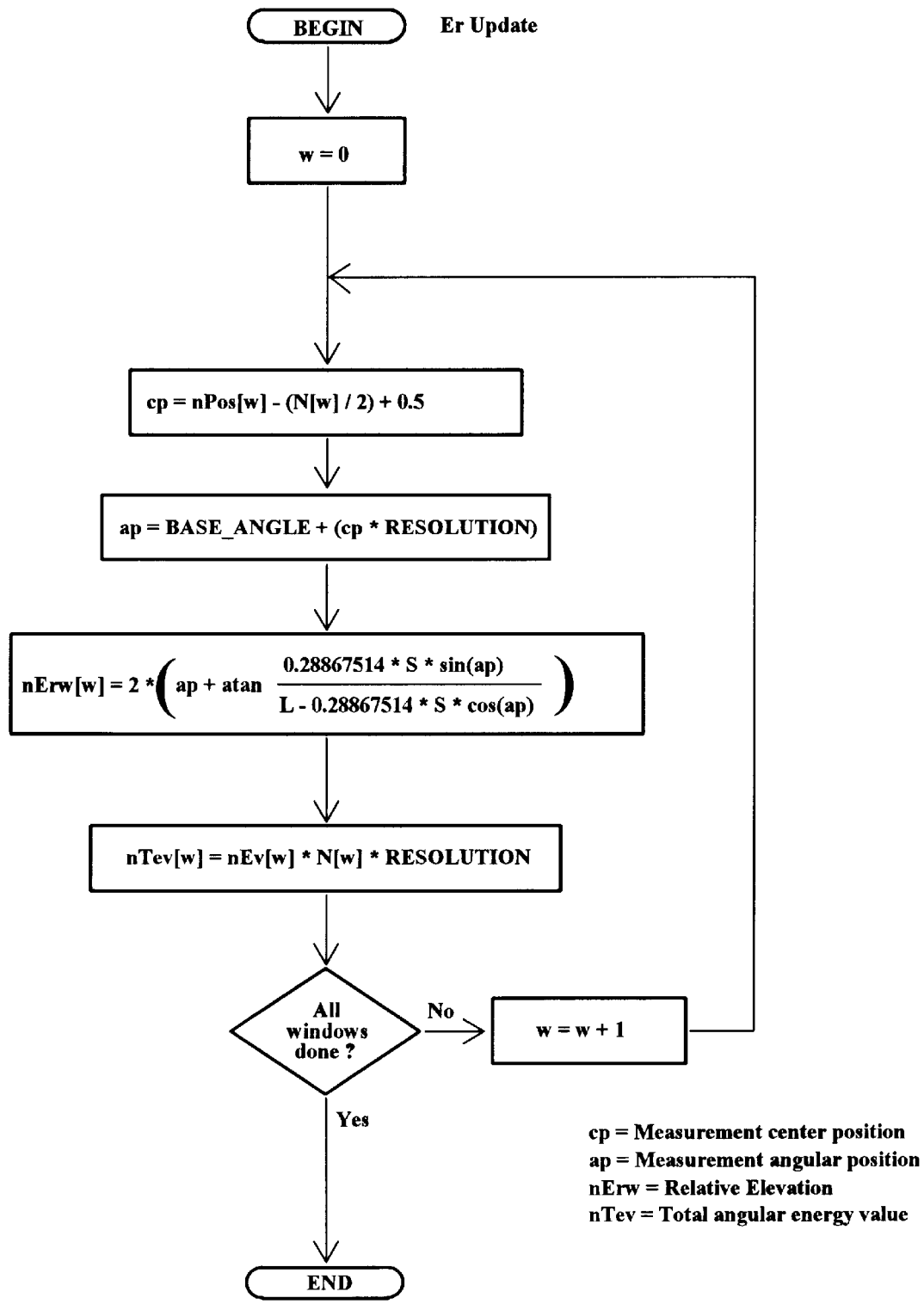
FIG. 74 is a flow diagram showing the relative elevation update process for the radiation scanner.

Referring now to FIG. 74, an update routine for the computation of radiation incident angle is shown. This routine processes the information provided by the interrupt routines for each angular acceptance window 103. First, the center position of the group of highest energy readings is computed. Then this position is converted to an angular position of the segmented rod 342 by known base angle of the 120° interrupt and by known angular resolution of the high resolution interrupts. From this, the incident angle (nErw) (or relative elevation angle 109) is then computed, using the algorithm described before. Further, a total energy value (nTev) for that window 103 is approximated by multiplying the highest average energy with the number of readings and by angular resolution of those readings.

It is thought that the directing and concentrating solar energy collectors and methods of the present invention and many of its attendant advantages will be understood from the foregoing description and it will be apparent that various changes may be made in the form, construction, arrangement of the parts and arrangement of software methods thereof without departing from the spirit and scope of the invention and sacrificing all of its material advantages, the forms herein before described being merely the preferred or exemplary embodiments thereof.

What is claimed is:

1. A directing and concentrating solar energy collector comprising:

a concentrating reflector constructed to concentrate a radiation from the sun along a substantially straight line of concentration, the major axis of said concentrating reflector defined to be parallel to the line of concentration;

one or more directing reflectors, at least one of said reflectors located at the end of said concentrating reflector, perpendicular to the major axis of said concentrating reflector, the major axis of said directing reflectors defined to be perpendicular to the major or a of said concentrating reflector, said directing reflectors extending from said concentrating reflector beyond the line of concentration, cooperating with said concentrating reflector by directing radiation to and from said concentrating reflector, such that when the position of the sun changes in the direction parallel to the major axis of said concentrating reflector, radiation concentrated by said reflectors remains directed and optimized between said directing reflectors, at the line of concentration, moving and changing zones of concentration appear at the line of concentration, such that when the sun is located at a direction perpendicular to the line of concentration, at the front of said solar energy collector, the concentration is evenly distributed along the line of the concentration, and when the sun is located at an angle to either side the concentration is varied along the line of concentration;

said concentrating reflector including a plurality of independently controllable thermally insulated heat chambers placed along said line of concentration for controlling the rate of heat transfer from each of said plurality of heat chambers.

2. The solar energy collector as in claim 1, including stationary means for converting the concentrated radiation to other forms of energy, at a permanent location substantially covering all movement of changing zones of concentration and receiving the concentrated radiation.

3. The solar energy collector as in claim 2, including means for optimizing said converting means for moving and changing zones of concentration and substantially separating these zones, such that energy losses at zones with no radiation are minimized and that energy collection efficiency at zones with normal and nearly double concentration is optimized for predetermined strategy.

4. The solar energy collector as in claim 3, including means for protecting said solar collector from the environment, while allowing radiation from the sun to reach said solar collector.

5. The directing and concentrating solar energy collector as set forth in claim 1, further comprising:

means for adjusting said concentrating reflector for the movement of the sun in the direction perpendicular to the axis of said concentrating reflector for maintaining concentrated radiation at the line of concentration which is stationary, and means for tracking the movement of the sun in the direction perpendicular to the axis of said concentrating reflector and using said adjusting means to maintain concentrated radiation at the stationary line of concentration.

6. The directing and concentrating solar energy collector as set forth in claim 2 wherein:

said concentrating reflector is fixed at a stationary position, concentrating radiation to a line of concentration which is moving, dictated by the movement of the sun, producing moving and changing zones of concentration which are moving with and within the line of concentration, and said concentrating reflector is formed from highly reflective flexible sheet material, hanging substantially horizontally, sloping in the air, forming a catenary curve for concentration of radiation, its reflective surface facing generally upwards, and said directing reflectors are made from highly reflective flexible sheet material, cut to sheets and hung vertically along both ends of said concentrating reflector, perpendicular to its axis.

7. The directing and concentrating solar energy collector as set forth in claim 6, wherein said stationary means for converting concentrated radiation to other forms of energy includes:

a plurality of thermal elements for absorbing a portion of the concentrated radiation and converting it to thermal energy, a plurality of conversion devices for absorbing a portion of the concentrated radiation, being in thermal connection with said thermal elements, converting a portion of the absorbed radiation to electricity with another portion converted to thermal energy, releasing the thermal portion of converted energy to said thermal elements, said thermal conversion elements and said conversion devices being placed generally above said concentrating reflector, between said directing reflectors, this arrangement allowing radiation from the sun to enter said concentrating reflector and said directing reflectors, to be thereby concentrated onto said thermal elements and said conversion devices; insulating means for minimizing thermal energy losses caused by convection, conduction, and long wave radiation; and means for transporting the collected thermal energy away from said thermal elements.

8. A directing and concentrating solar energy collector comprising:

a concentrating reflector constructed to concentrate a radiation from the sun along a substantially straight line of concentration, the major axis of said concentrating reflector defined to be parallel to the line of concentration;

one or more directing reflectors, at least one of said reflectors located at the end of said concentrating reflector, perpendicular to the major axis of said concentrating reflector, the major axis of said directing reflectors defined to be perpendicular to the major axis of said concentrating reflector, said directions reflectors extending from said concentrating reflector beyond the line of concentration, cooperating with said concentrating reflector by directing radiation to and from said concentrating reflector, such that when the position of the sun changes in the direction parallel to the major axis of said concentrating reflector, radiation concentrated by said reflectors remains directed and optimized between said directing reflectors, at the line of concentration, moving and changing zones of concentration appear at the line of concentration, such that when the sun is located at a direction perpendicular to the line of concentration, at the front of said solar energy collector, the concentration is evenly distributed along the line of the concentration, and when the sun is located at an angle to either side the concentration is varied along the line of concentration;

means for adjusting said concentrating reflector for the movement of the sun in the direction perpendicular to the major axis of said concentrating reflector for maintaining concentrated radiation at the line of concentration which is stationary;

means for tracking the movement of the sun in the direction perpendicular to the major axis of said concentrating reflector and using said adjusting means to maintain concentrated radiation at the stationary line of concentration;

said means for tracking the movement of the sun including:

a substantially long rod with narrow reflective segments around it, extending from one end to the other, said rod placed in parallel with the major axis of said concentrating reflector and rotated around the axis of said rod, each segment in its turn reflecting radiation from the sun to a wide and thin planar beam, the reflected beam of radiation rotating and sweeping in an angular motion, a plurality of photo sensors placed at a stationary location generally between said rod and the sun, facing said rod, and as the sun moves, at least one of said photo sensors is being repeatedly and momentarily exposed to the beam of radiation reflected from each segment of said rod, as the beam sweeps by, means for generating a first repeating momentary signal indicating the end of current sweep and the beginning of new sweep, about to be produced as a new segment of said rod approaches the general direction of the sun, means for generating a second repeating momentary signal at regular and very fine angular intervals of the rotation of said rod, these angular intervals being smaller than the angular thickness of the planar beam of radiation, as measured at said photo sensors, means for detecting and counting the number of second momentary signals and reading the radiation energy level striking each said photo sensor at the time of said second momentary signal, means for recording the energy levels and count values produced by said detecting, counting and reading means, means for detecting said first momentary signal and calculating an angular direction of highest obtainable energy level by said solar energy collector, detected during completed sweep, and means for calculating an adjustment for said concentrating reflector with the angular direction from said detecting and angular direction calculating means, and adjusting said concentrating reflector by using said adjusting means.

9. The directing and concentrating solar energy collector as set forth in claim 8 wherein said concentrating reflector further comprises:

highly reflective flexible sheet material, and said concentrating reflector is formed from said sheet material, hanging, substantially horizontally, sloping in the air, forming a catenary curve for concentration of radiation, its reflective side facing generally upwards.

10. The directing and concentrating solar energy collector as set forth in claim 9 wherein said concentrating reflector further comprises:

a plurality of hanging sloping sheets made from said sheet material, said concentrating reflector is formed from said reflective hanging sloping sheets placed generally horizontally, supported from both ends, there between hanging freely in the air, and each said sheet forming a catenary curve, said sheets' reflective sides facing generally upwards, said sheets sloping in an array in the direction perpendicular to the axis of said concentrating reflector, said adjusting means includes means for substantially vertically moving the ends of said sloping sheets to tilt them in the direction perpendicular to the axis of said concentrating reflector, and means for tightening and loosening said sheets to select a position on the catenary curve thus adjusting the focal length.

11. The directing and concentrating solar energy collector as set forth in claim 9 wherein said concentrating reflector further comprises:

a hanging sloping sheet made from said sheet material, said concentrating reflector is formed from said hanging sloping sheet placed generally horizontally, supported from both ends, there between hanging freely in the air and forming a catenary curve, said sheet's reflective side facing generally upwards, said sheet sloping in the direction perpendicular to the axis of said concentrating reflector, said adjusting means includes means for substantially vertically moving the ends of said sheet to tilt it in the direction perpendicular to the axis of said concentrating reflector, and means for tightening and loosening said sheet to select a position on the catenary curved, thus adjusting the focal length.

12. The directing and concentrating solar energy collector as set forth in claim 9, wherein said concentrating reflector further comprises:

a hanging sloping sheet made from said sheet material, a movable sheet support, two sheet sections forming said sheet;

said concentrating reflector is formed from said sloping sheet placed generally horizontally, supported from both ends, and further, slideably and movably supported between the two ends by said movable sheet support, forming said two sheet sections, said sheet sections hanging freely in the air and each forming a catenary curve, said sheet's reflective side facing generally upwards, with said sheet sections one after another in the direction perpendicular to the axis of said concentrating reflector, said adjusting means includes, means for substantially vertically moving the ends of said sloping sheet and slopingly moving said movable sheet support between said sections to tilt said sections in the direction perpendicular to the axis of said concentrating reflector, and said adjusting means further includes means for tightening and loosening said sheet to select a position on the catenary curve, thus adjusting the focal length.

13. The directing and concentrating solar energy collector as set forth in claim 8 wherein said concentrating reflector further comprises:

a plurality of substantially narrow highly reflective strips arranged to concentrate radiation to a stationary line of concentration, said strips being slightly curved around their long axis to form a small section of a substantially cylindrical parabolic reflector.

14. The directing and concentrating solar energy collector as set forth in claim 13 wherein:

said concentrating reflector is formed of said substantially narrow highly reflective strips placed in a formation of a section of a circle around the stationary line of concentration, with the axis of their long sides parallel to the axis of said concentrating reflector, said strips being substantially on the opposite side of the sun in relation to the stationary line of concentration, the reflective side of said strips facing the stationary line of concentration such that the radiation reflected from each said strip is concentrated at the common stationary line of concentration; and said adjusting means includes means for rotating said strips around their axis.

15. The directing and concentrating solar energy collector as set forth in claim 13 wherein:

said concentrating reflector is formed of said substantially narrow highly reflective strips placed in generally curved formation around the stationary line of concentration, with the axis of their long sides parallel to the axis of said concentrating reflector, said strips being substantially on the opposite side of the sun in relation to the stationary line of concentration, the reflective side of said strips facing the stationary line of concentration such that the radiation reflected from each said strip is concentrated at the common stationary line of concentration, and said adjusting means includes means for rotating said strips around their axis.

16. The directing and concentrating solar energy collector as set forth in claim 13 wherein:

said concentrating reflector is formed of said substantially narrow highly reflective strips placed in a formation of a straight line, with the axis of their long sides parallel to the axis of said concentrating reflector, said strips being substantially on the opposite side of the sun in relation to the stationary line of concentration, the reflective side of said strips facing the stationary line of concentration such that the radiation reflected from each said strip is concentrated at the common stationary line of concentration, and said adjusting means includes means for rotating said strips around their axis.

17. The directing and concentrating solar energy collector as set forth in claim 8 wherein:

said concentrating reflector is a cylindrical parabolic reflector, and said adjusting means includes means for rotating said concentrating reflector substantially around the stationary line of concentration.

18. The directing and concentrating solar energy collector as set forth in claim 8 wherein:

said concentrating reflector is a cylindrical hyperbolic reflector, and said adjusting means includes means for rotating said concentrating reflector substantially around the stationary line of concentration.

19. The directing and concentrating solar energy collector as set forth in claim 8 wherein:

said concentrating reflector is a cylindrical curving reflector; and said adjusting means includes means for rotating said concentrating reflector substantially around the stationary line of concentration.

20. The directing and concentrating solar energy collector as set forth in claim 8 wherein:

said concentrating reflector is a fresnel reflector; and said adjusting means includes means for rotating said concentrating reflector substantially around the stationary line of concentration.

21. A method of collecting solar energy, comprising the steps of:

concentrating radiation from the sun along a substantially straight line of concentration using a concentrating reflector whose major axis is defined to be parallel with the line of concentration wherein said concentrating reflector includes includes a plurality of independently controllable thermally insulated heat chambers placed along said line of concentration;

directing radiation to and from the concentrating reflector using two directing reflectors placed at the end of the concentrating reflector, perpendicular to the major axis of the concentrating reflector, an axis of the directing reflectors defined to be perpendicular to the major axis of the concentrating reflector, the directing reflectors extending from the concentrating reflector, beyond the line of concentration, cooperating with the concentrating reflector by directing radiation to and from the concentrating reflector, such that while the position of the sun changes in the direction parallel to the major axis of the concentrating reflector, radiation concentrated by the reflectors remains directed and optimized between the two directing reflectors, at the line of concentration moving and changing zones of concentration appear at the line of concentration, such that when the sun is located at a direction perpendicular to the line of concentration, the concentration is at normal and evenly distributed along the line of concentration, and when the sun is located at an angle to either side, zones of concentration with no radiation at all, with normal concentration, and with nearly double the normal concentration will appear at the line of concentration; and independently controlling said thermally insulated heat chambers placed along said line of concentration for controlling the rate of heat transfer from each of said plurality of heat chambers.

22. A method of collecting soar energy, comprising the steps of:

concentrating radiation from the sun along a substantially straight line of concentration using a concentrating reflector whose major axis is defined to be parallel with the line of concentration wherein said concentrating reflector includes a plurality of independently controllable thermally insulated heat chambers placed along said line of concentration;

directing radiation to and from the concentrating reflector using two directing reflectors placed at the end of the concentrating reflector, perpendicular to the major axis of the concentrating reflector, an axis of the directing reflectors defined to be perpendicular to the major axis of the concentrating reflector, the directing reflectors extending from the concentrating reflector, beyond the line of concentration, cooperating with the concentrating reflector by directing radiation to and from the concentrating reflector, such that while the position of the sun changes in the direction parallel to the major axis of the concentrating reflector, radiation concentrated by the reflectors remains directed and optimized between the two directing reflector, at the line of concentration, moving and changing zones of concentration appear at the line of concentration, such that when the sun is located at a direction perpendicular to the line of concentration, at the front of said solar collector, the concentration is at normal and evenly distributed along the line of concentration, and when the sun is located at an angel to either side, zones of concentration with no radiation at all, with normal concentration, and with nearly double the normal concentration will appear a the line of concentration; and independently controlling said thermally insulated heat chambers placed along said line of concentration for controlling the rate of heat transfer from each of said plurality of heat chambers.

23. Solar energy collection method as set forth in claim 22, wherein said concentrating radiation from the sun includes:

reflecting the sun's radiation from highly reflective flexible sheet material, hanging, substantially horizontally, sloping in the air, forming a catenary curve for concentration of radiation, its reflective side facing generally upwards.

24. Solar energy collection method as set forth in claim 23, further comprising the steps of:

adjusting the concentrating reflector for the movement of the sun in the direction perpendicular to the axis of the concentrating reflector for maintaining concentrated radiation at the line of concentration which is stationary, and tracking the movement of the sun in the direction perpendicular to the axis of said concentrating reflector and using said adjusting the concentrating reflector to maintain concentrated radiation at the stationary line of concentration.

25. Solar energy collection method as set forth in claim 22, wherein said concentrating radiation from the sun includes:

reflecting the sun's radiation from a plurality of substantially narrow highly reflective strips arranged to concentrate radiation to a stationary line of concentration.

26. Solar energy collection method as set forth in claim 25, further comprising the steps of:

adjusting the concentrating reflector for the movement of the sun in the direction perpendicular to the axis of the concentrating reflector for maintaining concentrated radiation at the line of concentration which is stationary, and tracking the movement of the sun in the direction perpendicular to the axis of said concentrating reflector and using said adjusting the concentrating reflector to maintain concentrated radiation at the stationary line of concentration.

* * * * *